United States Patent
Samuels et al.

(10) Patent No.: US 7,619,545 B2
(45) Date of Patent: *Nov. 17, 2009

(54) SYSTEMS AND METHODS OF USING APPLICATION AND PROTOCOL SPECIFIC PARSING FOR COMPRESSION

(75) Inventors: Allen Samuels, San Jose, CA (US); Richard Jensen, San Jose, CA (US); Zubin Dittia, San Mateo, CA (US); Dan Decasper, San Mateo, CA (US); Michael Ovsiannikov, San Mateo, CA (US); Robert Plamondon, Blodgett, OR (US)

(73) Assignee: Citrix Systems, Inc., Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/685,157

(22) Filed: Mar. 12, 2007

(65) Prior Publication Data

US 2008/0224902 A1    Sep. 18, 2008

(51) Int. Cl.
*H03M 7/34* (2006.01)
(52) U.S. Cl. .................... 341/51; 370/247; 709/201
(58) Field of Classification Search ............. 341/50–70; 709/201; 726/26; 370/394, 247
See application file for complete search history.

(56) References Cited

U.S. PATENT DOCUMENTS

| | | | |
|---|---|---|---|
| 4,779,189 A | 10/1988 | Legvold et al. | |
| 4,796,003 A | 1/1989 | Bentley et al. | |
| 5,057,996 A | 10/1991 | Cutler et al. | |
| 5,175,852 A | 12/1992 | Johnson et al. | |
| 5,249,290 A | 9/1993 | Heizer | |
| 5,297,283 A | 3/1994 | Kelly, Jr. et al. | |
| 5,521,597 A | 5/1996 | Dimitri | |
| 5,864,678 A | 1/1999 | Riddle | |
| 5,898,674 A * | 4/1999 | Mawhinney et al. | ........ 370/247 |
| 6,289,382 B1 | 9/2001 | Bowman-Amuah | |
| 6,321,336 B1 | 11/2001 | Applegate et al. | |
| 6,332,163 B1 | 12/2001 | Bowman-Amuah | |
| 6,339,832 B1 | 1/2002 | Bowman-Amuah | |
| 6,415,329 B1 | 7/2002 | Gelman et al. | |
| 6,434,568 B1 | 8/2002 | Bowman-Amuah | |

(Continued)

OTHER PUBLICATIONS

Faber, et. al., "Dynamic Time Windows Packet Admission Control with Feedback", Aug. 1992.

(Continued)

*Primary Examiner*—Lam T Mai
(74) *Attorney, Agent, or Firm*—Choate, Hall & Stewart, LLP; John D. Lanza; Christopher J. McKenna

(57) ABSTRACT

Systems and methods of storing previously transmitted data and using it to reduce bandwidth usage and accelerate future communications are described. By using algorithms to identify long compression history matches, a network device may improve compression efficiently and speed. A network device may also use application specific parsing to improve the length and number of compression history matches. Further, by sharing compression histories, compression history indexes and caches across multiple devices, devices can utilize data previously transmitted to other devices to compress network traffic. Any combination of the systems and methods may be used to efficiently find long matches to stored data, synchronize the storage of previously sent data, and share previously sent data among one or more other devices.

51 Claims, 29 Drawing Sheets

U.S. PATENT DOCUMENTS

| | | |
|---|---|---|
| 6,434,628 B1 | 8/2002 | Bowman-Amuah |
| 6,438,594 B1 | 8/2002 | Bowman-Amuah |
| 6,442,748 B1 | 8/2002 | Bowman-Amuah |
| 6,473,794 B1 | 10/2002 | Guheen et al. |
| 6,477,580 B1 | 11/2002 | Bowman-Amuah |
| 6,477,665 B1 | 11/2002 | Bowman-Amuah |
| 6,496,776 B1 | 12/2002 | Blumberg et al. |
| 6,496,850 B1 | 12/2002 | Bowman-Amuah |
| 6,502,213 B1 | 12/2002 | Bowman-Amuah |
| 6,519,571 B1 | 2/2003 | Guheen et al. |
| 6,529,909 B1 | 3/2003 | Bowman-Amuah |
| 6,529,948 B1 | 3/2003 | Bowman-Amuah |
| 6,536,037 B1 | 3/2003 | Guheen et al. |
| 6,539,112 B1 | 3/2003 | Smith |
| 6,539,396 B1 | 3/2003 | Bowman-Amuah |
| 6,549,949 B1 | 4/2003 | Bowman-Amuah |
| 6,550,057 B1 | 4/2003 | Bowman-Amuah |
| 6,571,282 B1 | 5/2003 | Bowman-Amuah |
| 6,578,068 B1 | 6/2003 | Bowman-Amuah |
| 6,584,507 B1 | 6/2003 | Bradley et al. |
| 6,601,192 B1 | 7/2003 | Bowman-Amuah |
| 6,601,234 B1 | 7/2003 | Bowman-Amuah |
| 6,606,660 B1 | 8/2003 | Bowman-Amuah |
| 6,606,744 B1 | 8/2003 | Mikurak |
| 6,615,166 B1 | 9/2003 | Guheen et al. |
| 6,615,199 B1 | 9/2003 | Bowman-Amuah |
| 6,615,253 B1 | 9/2003 | Bowman-Amuah |
| 6,624,766 B1 * | 9/2003 | Possley et al. ............ 341/69 |
| 6,636,242 B2 | 10/2003 | Bowman-Amuah |
| 6,640,238 B1 | 10/2003 | Bowman-Amuah |
| 6,640,244 B1 | 10/2003 | Bowman-Amuah |
| 6,640,249 B1 | 10/2003 | Bowman-Amuah |
| 6,671,818 B1 | 12/2003 | Mikurak |
| 6,704,738 B1 | 3/2004 | de Vries et al. |
| 6,715,145 B1 | 3/2004 | Bowman-Amuah |
| 6,721,713 B1 | 4/2004 | Guheen et al. |
| 6,742,015 B1 | 5/2004 | Bowman-Amuah |
| 6,819,658 B1 | 11/2004 | Agarwal et al. |
| 6,834,276 B1 | 12/2004 | Jensen et al. |
| 6,842,906 B1 | 1/2005 | Bowman-Amuah |
| 6,850,252 B1 | 2/2005 | Hoffberg |
| 6,856,651 B2 | 2/2005 | Singh |
| 6,904,449 B1 | 6/2005 | Quinones |
| 6,957,186 B1 | 10/2005 | Guheen et al. |
| 6,957,256 B1 | 10/2005 | Bradley et al. |
| 6,974,928 B2 | 12/2005 | Bloom |
| 6,990,453 B2 | 1/2006 | Wang et al. |
| 7,026,954 B2 | 4/2006 | Slemmer et al. |
| 7,039,168 B1 | 5/2006 | Potts |
| 7,051,126 B1 | 5/2006 | Franklin |
| 7,070,110 B2 | 7/2006 | Lapstun et al. |
| 7,072,665 B1 | 7/2006 | Blumberg et al. |
| 7,082,572 B2 | 7/2006 | Pea et al. |
| 7,092,370 B2 | 8/2006 | Jiang et al. |
| 7,097,106 B2 | 8/2006 | Silverbrook et al. |
| 7,103,068 B1 | 9/2006 | Gardner et al. |
| 7,123,617 B1 * | 10/2006 | Abrol ...................... 370/394 |
| 7,124,101 B1 | 10/2006 | Mikurak |
| 7,124,442 B2 * | 10/2006 | Nash-Putnam ............ 726/26 |
| 7,128,265 B2 | 10/2006 | Silverbrook et al. |
| 7,130,807 B1 | 10/2006 | Mikurak |
| 7,131,596 B2 | 11/2006 | Lapstun et al. |
| 7,135,991 B2 | 11/2006 | Slemmer et al. |
| 7,137,566 B2 | 11/2006 | Silverbrook et al. |
| 7,146,053 B1 | 12/2006 | Rijavec et al. |
| 7,149,698 B2 | 12/2006 | Guheen et al. |
| 7,150,398 B2 | 12/2006 | Silverbrook et al. |
| 7,159,777 B2 | 1/2007 | Silverbrook et al. |
| 7,165,041 B1 | 1/2007 | Guheen et al. |
| 7,171,440 B2 * | 1/2007 | Hanner ...................... 709/201 |
| 7,175,089 B2 | 2/2007 | Silverbrook et al. |
| 7,178,719 B2 | 2/2007 | Silverbrook et al. |
| 7,188,769 B2 | 3/2007 | Silverbrook et al. |
| 7,197,374 B2 | 3/2007 | Silverbrook et al. |
| 7,207,483 B2 | 4/2007 | Silverbrook et al. |
| 7,207,485 B2 | 4/2007 | Silverbrook et al. |
| 7,231,405 B2 | 6/2007 | Xia |
| 7,251,372 B2 | 7/2007 | Wood |
| 7,313,402 B1 | 12/2007 | Rahman |
| 2003/0014623 A1 | 1/2003 | Freed et al. |
| 2003/0014628 A1 | 1/2003 | Freed et al. |
| 2003/0065743 A1 | 4/2003 | Jenny et al. |
| 2003/0079040 A1 | 4/2003 | Jain et al. |
| 2005/0063519 A1 | 3/2005 | James |

OTHER PUBLICATIONS

Fendick et. al., "Analysis of a Rate-Based Control Strategy with Delayed Feedback", Aug. 1992.

Kalampoukas et. al., "Improving TCP Throughput over Two-Way Asymmetric Links: Analysis and Solutions", Jun. 1998.

Santos et. al., "Increasing Effective Link Bandwidth by Suppressing Replicated Data", Jun. 1999.

Samaraweera, "Return Link Optimization for Internet Service Provision Using DVB-S Networks", Jul. 3, 1999.

Spring et. al., "A Protocol-Independent Technique for Eliminating Redundant Network Traffic", Aug. 2000.

Cooper, et. al., "Internet Web Replication and Caching Taxonomy", Jan. 2001.

Border, et. al., "Performance Enhancing Proxies Intended to Mitigate Link-Related Degradations", Jun. 2001.

Ishac et. al., "On the Performance of TCP Spoofing in Satellite Networks", Oct. 28, 2001.

Dutta, et. al., "An Active Proxy Based Architecture for TCP in Heterogeneous Variable Bandwidth Networks", 2001.

Feighery, "Frequently Asked Questions for Performance Enhancing Proxies", Jun. 27, 2005.

USPTO Office Action for U.S. Appl. No. 11/685,161, mailed on Feb. 4, 2008.

USPTO Office Action for U.S. Appl. No. 11/685,170, mailed on Feb. 4, 2008.

Notice of allowance for U.S. Appl. No. 11/685,161 dated Dec. 30, 2008.

Notice of allowance for U.S. Appl. No. 11/685,165 dated Apr. 23, 2008.

Notice of allowance for U.S. Appl. No. 11/685,165 dated Jul. 22, 2008.

Notice of allowance for U.S. Appl. No. 11/685,170 dated Jul. 7, 2008.

* cited by examiner

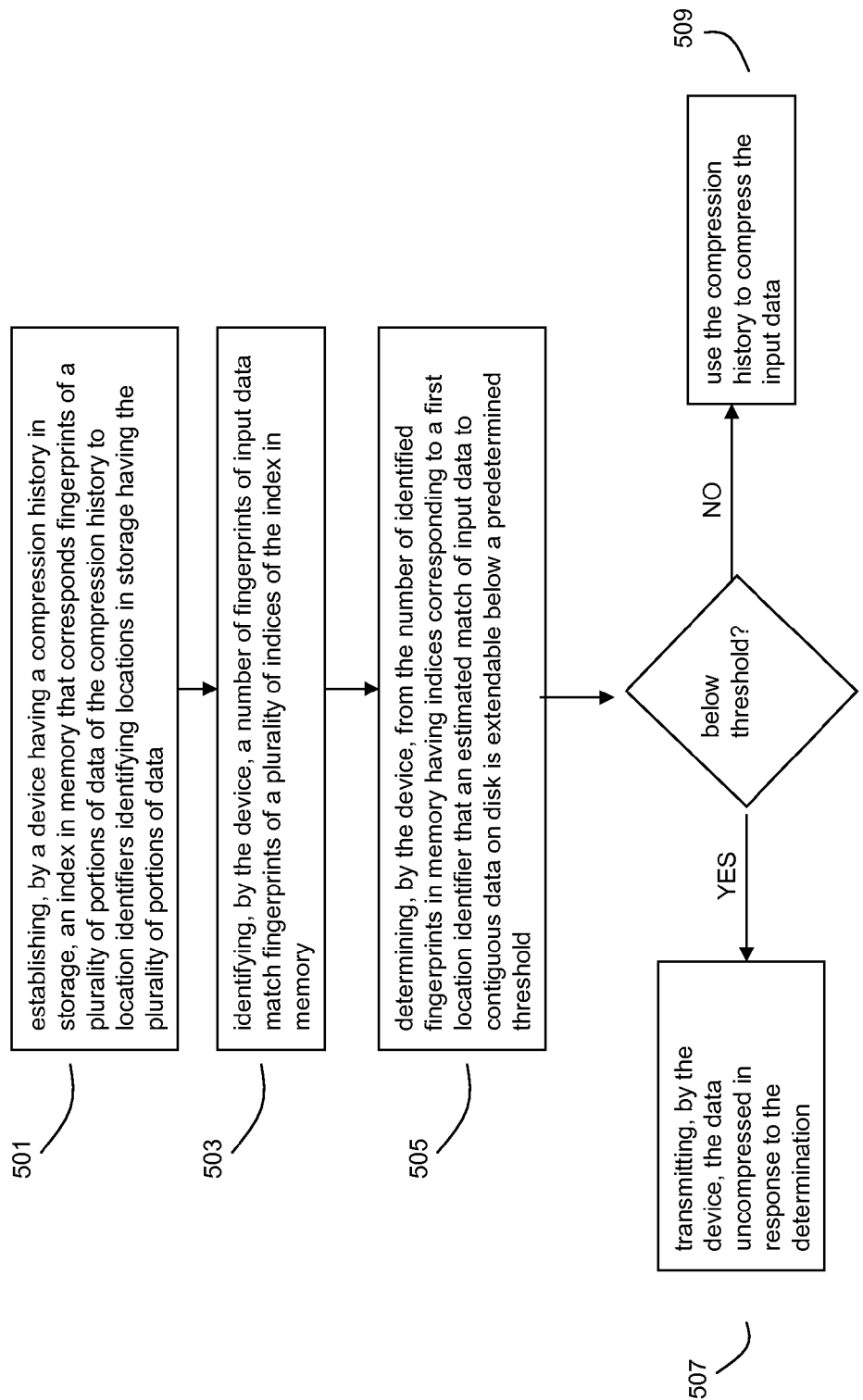

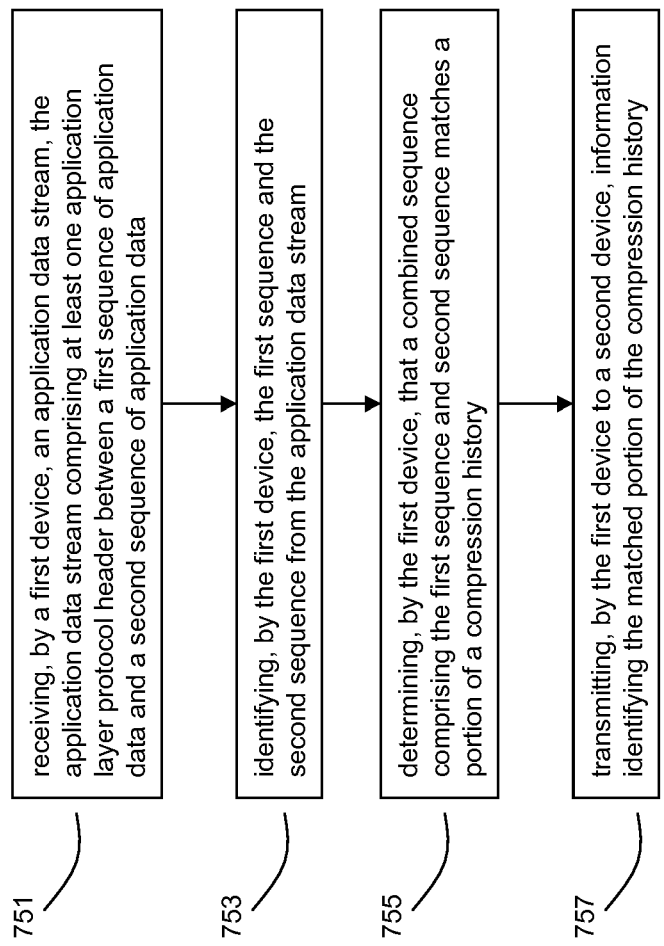

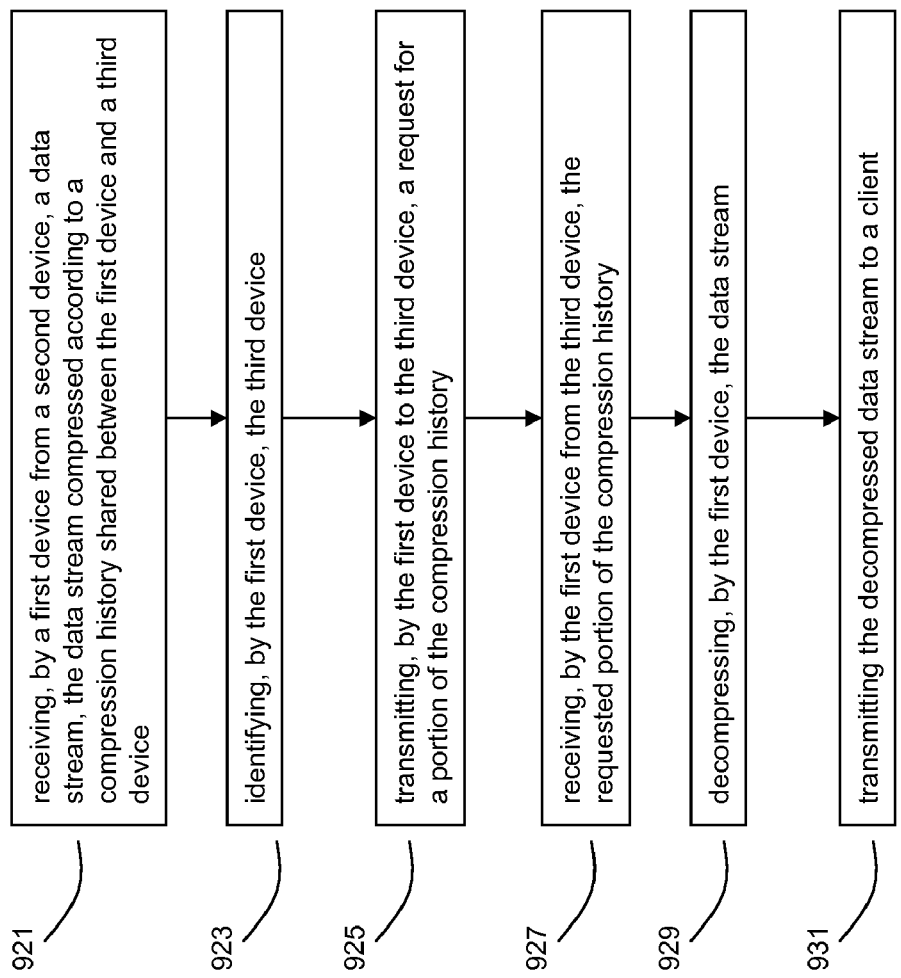

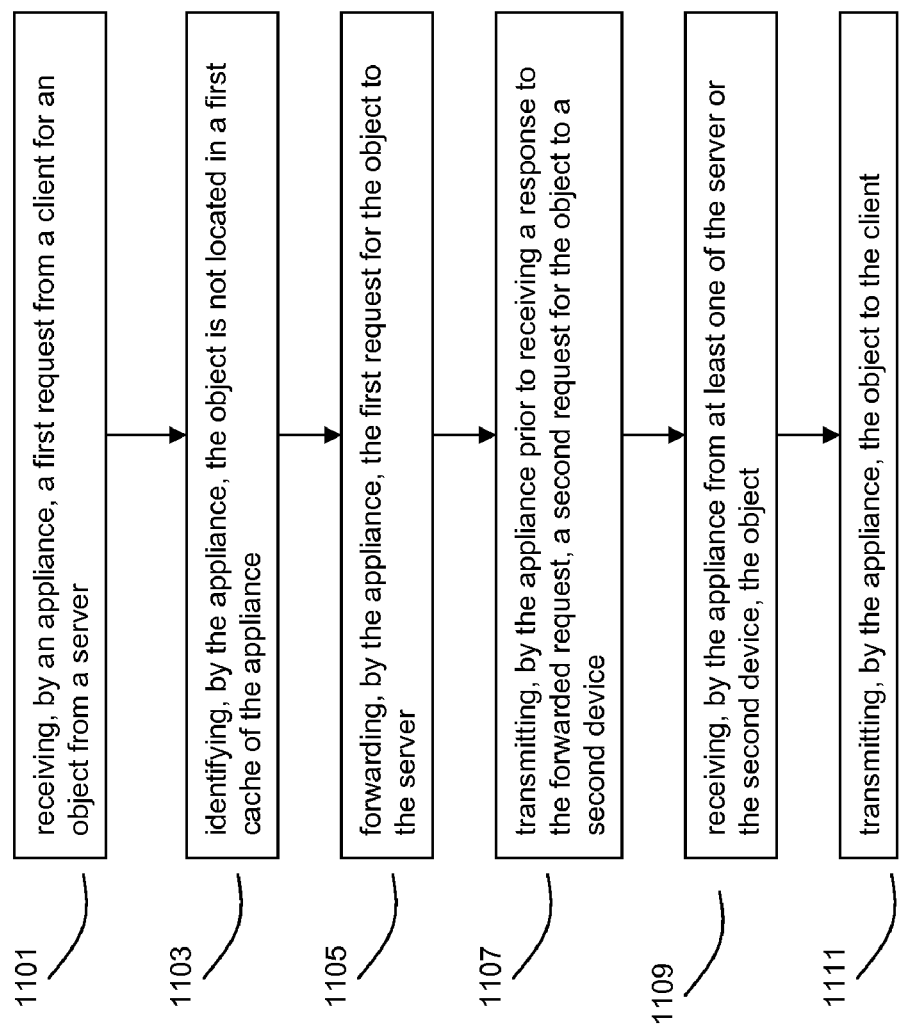

SYSTEMS AND METHODS OF USING APPLICATION AND PROTOCOL SPECIFIC PARSING FOR COMPRESSION

FIELD OF THE INVENTION

The present invention generally relates to data communication networks. In particular, the present invention relates to systems and methods for compressing data streams and improving network performance by leveraging previously stored data.

BACKGROUND OF THE INVENTION

Compressing data streams by utilizing previously stored data is a known technique for reducing the size of data streams transmitted between two devices. In broad terms, a typical compression method entails two devices each storing copies of data that is sent between the devices. These stored copies of the data can be referred to as compression histories, as they represent a history of previously transmitted data that is then used to compress future data streams. When one of the devices is transmitting data to the other device, it searches its compression history for matches to the input data, and replaces the matched portions with references to the stored data in the transmission stream, reducing the size of the transmitted stream. The receiving device then uses the references in combination with its own compression history to reconstruct the uncompressed data stream. However, this general technique presents a number of challenges.

First, insufficiently long matches between input streams and compression histories can result in poor compression ratios, as well as increasing the processing overhead and number of times that a compression history must be accessed. These problems can be exacerbated in cases where a device is transmitting multiple data streams simultaneously, and thus may have several processes attempting to access a compression history simultaneously. These problems also may be accentuated in devices using a compression history stored on a medium, such as a disk, with long potential access latencies. To give a concrete example, a device sending a 2K file may find forty matching references scattered across its compression history, each reference matching a different 50 bytes of the file. This may require 40 separate iterations of a potentially complex matching algorithm, and 40 separate disk accesses to a compression history. By contrast, if a device finds a single matching reference for the entire 2K file, only a single disk access may be needed. Thus there is a need for systems and methods for efficiently creating locating long matches between an input stream and a compression history.

Second, when one device has sequences in its compression history that are not in a corresponding compression history on another device, inefficiencies may result. The device may replace portions of data streams with references to the sequences, and then be forced to retransmit the data stream as it discovers the other device does not have the referenced sequences. Further, the unshared sequences may occupy space in a compression history that could be used for other data. A number of methods may be used to synchronize compression histories with respect to data currently being transmitted between two devices. For example, each device may transmit information corresponding to the total number of bytes transmitted, received, and stored, as well as location identifiers identifying where the data has been stored. However, even if the compression histories are synchronized immediately following transmission of data, a number of events may cause the compression histories to subsequently diverge. For example, one device may run out of storage and be forced to overwrite one or more previously stored portions. Or one device may have a disk error or other hardware or software glitch which corrupts or removes one or more previously stored portions. Thus, there exists a need for improved systems and methods for efficiently synchronizing shared compression histories.

Third, in many implementations, compression histories and caching only provide benefits if the same data is repeatedly sent between the same two devices. This can be especially problematic in situations where two sites, each having a cluster of devices, may repeatedly communicate similar information, but there is no guarantee the information will pass through the same pair of devices. For example, two sites may each maintain a cluster of devices to accelerate communications between the sites. Cluster 1 may contain the devices A, B, and C, and cluster 2 may contain the devices X, Y, and Z. For example, devices A and Z may each maintain a compression history of a file sent between A and Z, but the next time the file is requested the request and response may pass through devices A and Y. Similarly, the next time the file is requested the request and response may pass through device B and device X. One potential solution is to organize the device clusters in a hierarchy so that all requests to a given cluster, network, or region pass through a gateway device. However, this solution may involve additional configuration and create network bottlenecks. Thus there exists a need for leveraging data previously transmitted between two devices to compress data streams transmitted between devices other than the original transmitters, without necessarily requiring explicit hierarchies.

BRIEF SUMMARY OF THE INVENTION

The present invention is directed towards systems and methods of storing previously transmitted data and using it to reduce bandwidth usage and accelerate future communications. By using algorithms to identify long compression history matches, a network device may improve compression efficiently and speed. A network device may also use application specific parsing to improve the length and number of compression history matches. Further, by sharing compression histories, compression history indexes, and caches across multiple devices, devices can utilize data previously transmitted to other devices to compress network traffic. Any combination of the systems and methods described in the following paragraphs may be used to efficiently find long matches to stored data, synchronize the storage of previously sent data, and share previously sent data among one or more other devices.

In a first aspect, the present invention relates to systems and methods for determining whether to perform disk based compression by identifying in an index maintained in memory an estimated extent of a match of input data to contiguous data stored on disk is above or below a predetermined threshold. In one embodiment, a device having a compression history establishes an index in memory that corresponds fingerprints of a plurality of portions of data of the compression history to location identifiers identifying locations on disk having the plurality of portions of data. The device identifies a number of fingerprints of input data match fingerprints of a plurality of entries of the index in memory, and determines, from the number of identified fingerprints in memory having entries corresponding to a first location identifier that an estimated match of input data to contiguous data on disk is extendable below a predetermined threshold. If the match is extendable below a given threshold, the device transmits the data uncompressed. If the match is extendable above the given threshold, the device uses the compression history to compress the data.

In a second aspect, the present invention relates to systems and methods for determining a precedence for matching fingerprints of input data to an index of fingerprints identifying a plurality of instances of data in a compression history. In one embodiment, a device having a compression history establishing an index that corresponds fingerprints of a plurality of portions of data of the compression history to location identifiers identifying locations on disk having the plurality of portions of data. The device identifies that a plurality of fingerprints of input data match a plurality of entries in the index having at least one location identifier and selects an entry of the plurality of entries having a fewest number of location identifiers. The device may then match a first portion of the input data to data in a first location in the compression history identified by the selected entry.

In a third aspect, the present invention relates to systems and methods for a method for improving compression history matches by removing application layer protocol headers from compression history data. In one embodiment, these systems and method include transmitting, between a first device and a second device, an application data stream, the application data stream comprising at least one application layer protocol header between a first sequence of application data and a second sequence of application data. The first device identifies the first sequence and the second sequence from the application data stream and stores a combined sequence comprising the first sequence and the third sequence to a compression history.

In a fourth aspect, the present invention relates to systems and methods for synchronizing compression histories shared between two devices. In one embodiment, a first device stores a first compression history, the compression history comprising a plurality of portions of data previously transmitted to a second device, each portion of data having a location identifier. The first device may then create an ordered list of location identifiers ordered by a time the first device last accessed a portion of data in a location corresponding to each identifier. The first device receives, from the second device, information identifying a quantity of location identifiers of a corresponding second compression history on the second device; and determines the received quantity is less than a quantity of location identifiers of the first compression history by a first amount. The first device may then select for obsolescence, from the list of location identifiers, the first amount of location identifiers at an end of the ordered list corresponding to least recently accessed portions of data.

In a fifth aspect, the present invention relates to systems and methods for sharing compression histories among a plurality of devices to improve compression of data transmitted via a plurality of connections. In one embodiment, a first device transmits, to a second device, a first data stream, the first data stream compressed according to a first compression history shared between the first device and the second device. The first device may receive, from the third device, an indication that a third device is located on the same network as the second device. The first device receives a second data stream intended for the third device. The first device identifies that a portion of the data stream matches within a predetermined threshold a portion of the first compression history, and transmits, to the third device, information identifying the portion of the first compression history. This may allow communications between the first and third device to be compressed according to a compression history originally shared between the first and second devices.

Another embodiment of the fifth aspect includes transmitting, between a first device and a second device, a first data stream, the first data stream compressed according to a first compression history shared between the first device and the second device. The first device receives information identifying a third device and a portion of the first compression history and transmits, to the third device, the identified portion of the first compression history.

Still another embodiment includes a first device receiving, by a first device from a second device, a data stream, the data stream compressed according to a compression history shared between the first device and a third device. The first device identifies the third device and transmits, to the third device, a request for a portion of the compression history. The first device receives, from the third device, the requested portion of the compression history. The first device may then decompress the data stream and transmit the decompressed stream to the client.

A sixth aspect of the present invention relates to systems and methods for sharing compression indexes among one or more clusters of devices to improve compression of data transmitted via a plurality of connections. One embodiment includes receiving, by a first device from a second device, an index of entries for a compression history shared between the second device and a third device; each index entry comprising a location identifier of data stored in the second device. The first device receives a data stream intended for a fourth device; and identifies that a portion of the data stream matches an entry of the received index. The first device transmits, to the second device, a location identifier corresponding to the matched entry. The first device receives, from the second device, a portion of the compression history corresponding to the location identifier; and determines the portion of the compression history matches a portion of the data stream. The first device may then transmit, to the fourth device, information identifying the portion of the compression history. This allows communications between the third and fourth device to be compressed according to the compression history originally shared between the first and second devices.

A seventh aspect of the present invention relates to systems and methods for providing an ad-hoc hierarchy of caches to serve objects. In one embodiment, a first appliance receives from a client, a first request for an object from a server. The first device identifies that the object is not located in a first cache of the appliance and forward the first request for the object to the serve. The appliance transmits, prior to receiving a response to the forwarded request, a second request for the object to a second device. The appliance receives, from at least one of the server or the second device, the object; and then transmits the object to the client.

The details of various embodiments of the invention are set forth in the accompanying drawings and the description below.

BRIEF DESCRIPTION OF THE DRAWINGS

The foregoing and other objects, aspects, features, and advantages of the invention will become more apparent and better understood by referring to the following description taken in conjunction with the accompanying drawings, in which:

FIG. 5B is a flow diagram of one embodiment of a method for determining whether to perform disk based compression by identifying in an index maintained in memory an estimated extent of a match of input data to contiguous data stored on disk is above or below a predetermined threshold;

FIG. 7D is a flow diagram of one embodiment of a method for improving compression history matches by removing application layer protocol headers from received data;

FIG. 9D is a flow diagram of a third embodiment of a method for sharing compression histories among a plurality of devices to improve compression of data transmitted via a plurality of connections;

FIG. 11B is a flow diagram illustrating one embodiment of a method for providing an ad-hoc hierarchy of caches to serve objects.

Figure 1A:
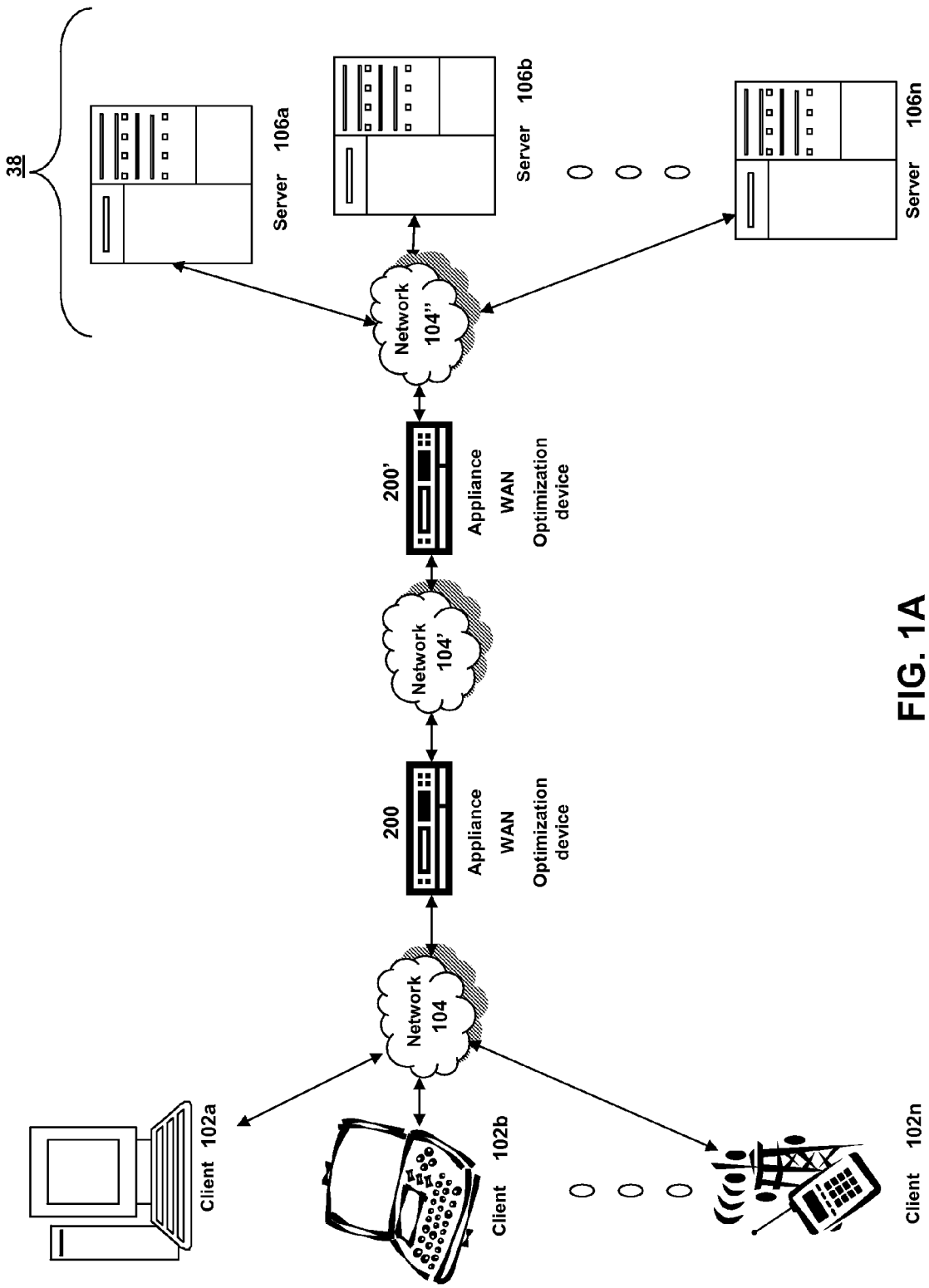
FIG. 1A is a block diagram of an embodiment of a network environment for a client to access a server via one or more network optimization appliances.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

For purposes of reading the description of the various embodiments of the present invention below, the following descriptions of the sections of the specification and their respective contents may be helpful:

Section A describes a network environment and computing environment useful for practicing an embodiment of the present invention;

Section B describes embodiments of a system and appliance architecture for accelerating delivery of a computing environment to a remote user;

Section C describes embodiments of a client agent for accelerating communications between a client and a server;

Section D describes embodiments of systems and methods for using a compression history;

Section E describes embodiments of systems and methods for efficiently identifying compression history matches;

Section F describes embodiments of systems and methods for removing application layer headers from compression history data;

Section G describes embodiments of systems and methods for synchronizing expiration of shared compression history data; and Section H describes embodiments of systems and methods for leveraging shared compression histories across more than two devices.

Section I describes embodiments of systems and methods for ad-hoc cache hierarchies.

A. Network and Computing Environment

Prior to discussing the specifics of embodiments of the systems and methods of an appliance and/or client, it may be helpful to discuss the network and computing environments in which such embodiments may be deployed. Referring now to FIG. 1A, an embodiment of a network environment is depicted. In brief overview, the network environment has one or more clients 102a-102n (also generally referred to as local machine(s) 102, or client(s) 102) in communication with one or more servers 106a-106n (also generally referred to as server(s) 106, or remote machine(s) 106) via one or more networks 104, 104', 104". In some embodiments, a client 102 communicates with a server 106 via one or more network optimization appliances 200, 200' (generally referred to as appliance 200). In one embodiment, the network optimization appliance 200 is designed, configured or adapted to optimize Wide Area Network (WAN) network traffic. In some embodiments, a first appliance 200 works in conjunction or cooperation with a second appliance 200' to optimize network traffic. For example, a first appliance 200 may be located between a branch office and a WAN connection while the second appliance 200' is located between the WAN and a corporate Local Area Network (LAN). The appliances 200 and 200' may work together to optimize the WAN related network traffic between a client in the branch office and a server on the corporate LAN.

Although FIG. 1A shows a network 104, network 104' and network 104" (generally referred to as network(s) 104) between the clients 102 and the servers 106, the clients 102 and the servers 106 may be on the same network 104. The networks 104, 104', 104" can be the same type of network or different types of networks. The network 104 can be a local-area network (LAN), such as a company Intranet, a metropolitan area network (MAN), or a wide area network (WAN), such as the Internet or the World Wide Web. The networks 104, 104', 104" can be a private or public network. In one embodiment, network 104' or network 104" may be a private network and network 104 may be a public network. In some embodiments, network 104 may be a private network and network 104' and/or network 104" a public network. In another embodiment, networks 104, 104', 104" may be private networks. In some embodiments, clients 102 may be located at a branch office of a corporate enterprise communicating via a WAN connection over the network 104 to the servers 106 located on a corporate LAN in a corporate data center.

The network 104 may be any type and/or form of network and may include any of the following: a point to point network, a broadcast network, a wide area network, a local area network, a telecommunications network, a data communication network, a computer network, an ATM (Asynchronous Transfer Mode) network, a SONET (Synchronous Optical Network) network, a SDH (Synchronous Digital Hierarchy) network, a wireless network and a wireline network. In some embodiments, the network 104 may comprise a wireless link, such as an infrared channel or satellite band. The topology of the network 104 may be a bus, star, or ring network topology. The network 104 and network topology may be of any such network or network topology as known to those ordinarily skilled in the art capable of supporting the operations described herein.

As depicted in FIG. 1A, a first network optimization appliance 200 is shown between networks 104 and 104' and a second network optimization appliance 200' is also between networks 104' and 104". In some embodiments, the appliance 200 may be located on network 104. For example, a corporate enterprise may deploy an appliance 200 at the branch office. In other embodiments, the appliance 200 may be located on network 104'. In some embodiments, the appliance 200' may be located on network 104' or network 104". For example, an appliance 200 may be located at a corporate data center. In one embodiment, the appliance 200 and 200' are on the same network. In another embodiment, the appliance 200 and 200' are on different networks.

In one embodiment, the appliance 200 is a device for accelerating, optimizing or otherwise improving the performance, operation, or quality of service of any type and form of network traffic. In some embodiments, the appliance 200 is a performance enhancing proxy. In other embodiments, the appliance 200 is any type and form of WAN optimization or acceleration device, sometimes also referred to as a WAN optimization controller. In one embodiment, the appliance 200 is any of the product embodiments referred to as WAN-Scaler manufactured by Citrix Systems, Inc. of Ft. Lauderdale, Fla. In other embodiments, the appliance 200 includes any of the product embodiments referred to as BIG-IP link controller and WANjet manufactured by F5 Networks, Inc. of Seattle, Wash. In another embodiment, the appliance 200 includes any of the WX and WXC WAN acceleration device platforms manufactured by Juniper Networks, Inc. of Sunnyvale, Calif. In some embodiments, the appliance 200 includes any of the steelhead line of WAN optimization appliances manufactured by Riverbed Technology of San Francisco, Calif. In other embodiments, the appliance 200 includes any of the WAN related devices manufactured by Expand Networks Inc. of Roseland, N.J. In one embodiment, the appliance 200 includes any of the WAN related appliances manufactured by Packeteer Inc. of Cupertino, Calif., such as the PacketShaper, iShared, and SkyX product embodiments provided by Packeteer. In yet another embodiment, the appliance 200 includes any WAN related appliances and/or software manufactured by Cisco Systems, Inc. of San Jose, Calif., such as the Cisco Wide Area Network Application Services software and network modules, and Wide Area Network engine appliances.

In some embodiments, the appliance 200 provides application and data acceleration services for branch-office or remote offices. In one embodiment, the appliance 200 includes optimization of Wide Area File Services (WAFS). In another embodiment, the appliance 200 accelerates the delivery of files, such as via the Common Internet File System (CIFS) protocol. In other embodiments, the appliance 200 provides caching in memory and/or storage to accelerate delivery of applications and data. In one embodiment, the appliance 205 provides compression of network traffic at any level of the network stack or at any protocol or network layer. In another embodiment, the appliance 200 provides transport layer protocol optimizations, flow control, performance enhancements or modifications and/or management to accelerate delivery of applications and data over a WAN connection. For example, in one embodiment, the appliance 200 provides Transport Control Protocol (TCP) optimizations. In other embodiments, the appliance 200 provides optimizations, flow control, performance enhancements or modifications and/or management for any session or application layer protocol. Further details of the optimization techniques, operations and architecture of the appliance 200 are discussed below in Section B.

Still referring to FIG. 1A, the network environment may include multiple, logically-grouped servers 106. In these embodiments, the logical group of servers may be referred to as a server farm 38. In some of these embodiments, the servers 106 may be geographically dispersed. In some cases, a farm 38 may be administered as a single entity. In other embodiments, the server farm 38 comprises a plurality of server farms 38. In one embodiment, the server farm executes one or more applications on behalf of one or more clients 102.

The servers 106 within each farm 38 can be heterogeneous. One or more of the servers 106 can operate according to one type of operating system platform (e.g., WINDOWS NT, manufactured by Microsoft Corp. of Redmond, Wash.), while one or more of the other servers 106 can operate on according to another type of operating system platform (e.g., Unix or Linux). The servers 106 of each farm 38 do not need to be physically proximate to another server 106 in the same farm 38. Thus, the group of servers 106 logically grouped as a farm 38 may be interconnected using a wide-area network (WAN) connection or metropolitan-area network (MAN) connection. For example, a farm 38 may include servers 106 physically located in different continents or different regions of a continent, country, state, city, campus, or room. Data transmission speeds between servers 106 in the farm 38 can be increased if the servers 106 are connected using a local-area network (LAN) connection or some form of direct connection.

Servers 106 may be file servers, application servers, web servers, proxy servers, and/or gateway servers. In some embodiments, a server 106 may have the capacity to function as either an application server or as a master application server. In one embodiment, a server 106 may include an Active Directory. The clients 102 may also be referred to as client nodes or endpoints. In some embodiments, a client 102 has the capacity to function as both a client node seeking access to applications on a server and as an application server providing access to hosted applications for other clients 102a-102n.

In some embodiments, a client 102 communicates with a server 106. In one embodiment, the client 102 communicates directly with one of the servers 106 in a farm 38. In another embodiment, the client 102 executes a program neighborhood application to communicate with a server 106 in a farm 38. In still another embodiment, the server 106 provides the functionality of a master node. In some embodiments, the client 102 communicates with the server 106 in the farm 38 through a network 104. Over the network 104, the client 102 can, for example, request execution of various applications hosted by the servers 106a-106n in the farm 38 and receive output of the results of the application execution for display. In some embodiments, only the master node provides the functionality required to identify and provide address information associated with a server 106' hosting a requested application.

In one embodiment, a server 106 provides functionality of a web server. In another embodiment, the server 106a receives requests from the client 102, forwards the requests to a second server 106b and responds to the request by the client 102 with a response to the request from the server 106b. In still another embodiment, the server 106 acquires an enumeration of applications available to the client 102 and address information associated with a server 106 hosting an application identified by the enumeration of applications. In yet another embodiment, the server 106 presents the response to the request to the client 102 using a web interface. In one embodiment, the client 102 communicates directly with the server 106 to access the identified application. In another embodiment, the client 102 receives application output data, such as display data, generated by an execution of the identified application on the server 106.

Deployed with other Appliances.

Figure 1B:
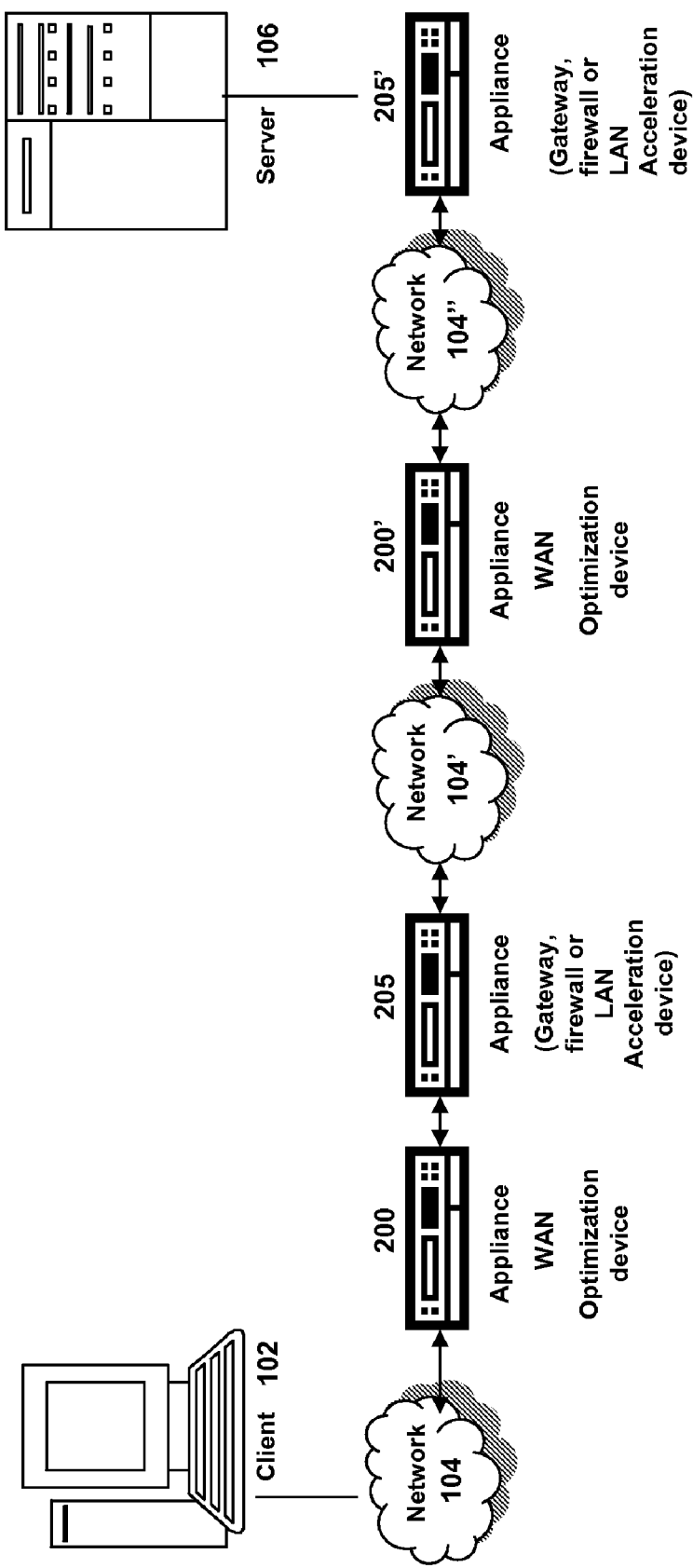
FIG. 1B is a block diagram of another embodiment of a network environment for a client to access a server via one or more network optimization appliances in conjunction with other network appliances.

Referring now to FIG. 1B, another embodiment of a network environment is depicted in which the network optimization appliance 200 is deployed with one or more other appliances 205, 205' (generally referred to as appliance 205 or second appliance 205) such as a gateway, firewall or acceleration appliance. For example, in one embodiment, the appliance 205 is a firewall or security appliance while appliance 205' is a LAN acceleration device. In some embodiments, a client 102 may communicate to a server 106 via one or more of the first appliances 200 and one or more second appliances 205.

One or more appliances 200 and 205 may be located at any point in the network or network communications path between a client 102 and a server 106. In some embodiments, a second appliance 205 may be located on the same network 104 as the first appliance 200. In other embodiments, the second appliance 205 may be located on a different network 104 as the first appliance 200. In yet another embodiment, a first appliance 200 and second appliance 205 is on the same network, for example network 104, while the first appliance 200' and second appliance 205' is on the same network, such as network 104".

In one embodiment, the second appliance 205 includes any type and form of transport control protocol or transport later terminating device, such as a gateway or firewall device. In one embodiment, the appliance 205 terminates the transport control protocol by establishing a first transport control protocol connection with the client and a second transport control connection with the second appliance or server. In another embodiment, the appliance 205 terminates the transport control protocol by changing, managing or controlling the behavior of the transport control protocol connection between the client and the server or second appliance. For example, the appliance 205 may change, queue, forward or transmit network packets in manner to effectively terminate the transport control protocol connection or to act or simulate as terminating the connection.

In some embodiments, the second appliance 205 is a performance enhancing proxy. In one embodiment, the appliance 205 provides a virtual private network (VPN) connection. In some embodiments, the appliance 205 provides a Secure Socket Layer VPN (SSL VPN) connection. In other embodiments, the appliance 205 provides an IPsec (Internet Protocol Security) based VPN connection. In some embodiments, the appliance 205 provides any one or more of the following functionality: compression, acceleration, load-balancing, switching/routing, caching, and Transport Control Protocol (TCP) acceleration.

In one embodiment, the appliance 205 is any of the product embodiments referred to as Access Gateway, Application Firewall, Application Gateway, or NetScaler manufactured by Citrix Systems, Inc. of Ft. Lauderdale, Fla. As such, in some embodiments, the appliance 205 includes any logic, functions, rules, or operations to perform services or functionality such as SSL VPN connectivity, SSL offloading, switching/load balancing, Domain Name Service resolution, LAN acceleration and an application firewall.

In some embodiments, the appliance 205 provides a SSL VPN connection between a client 102 and a server 106. For example, a client 102 on a first network 104 requests to establish a connection to a server 106 on a second network 104'. In some embodiments, the second network 104" is not routable from the first network 104. In other embodiments, the client 102 is on a public network 104 and the server 106 is on a private network 104', such as a corporate network. In one embodiment, a client agent intercepts communications of the client 102 on the first network 104, encrypts the communications, and transmits the communications via a first transport layer connection to the appliance 205. The appliance 205 associates the first transport layer connection on the first network 104 to a second transport layer connection to the server 106 on the second network 104. The appliance 205 receives the intercepted communication from the client agent, decrypts the communications, and transmits the communication to the server 106 on the second network 104 via the second transport layer connection. The second transport layer connection may be a pooled transport layer connection. In one embodiment, the appliance 205 provides an end-to-end secure transport layer connection for the client 102 between the two networks 104, 104'

In one embodiment, the appliance 205 hosts an intranet internet protocol or intranetIP address of the client 102 on the virtual private network 104. The client 102 has a local network identifier, such as an internet protocol (IP) address and/or host name on the first network 104. When connected to the second network 104' via the appliance 205, the appliance 205 establishes, assigns or otherwise provides an IntranetIP, which is a network identifier, such as IP address and/or host name, for the client 102 on the second network 104'. The appliance 205 listens for and receives on the second or private network 104' for any communications directed towards the client 102 using the client's established IntranetIP. In one embodiment, the appliance 205 acts as or on behalf of the client 102 on the second private network 104.

In some embodiment, the appliance 205 has an encryption engine providing logic, business rules, functions or operations for handling the processing of any security related protocol, such as SSL or TLS, or any function related thereto. For example, the encryption engine encrypts and decrypts network packets, or any portion thereof, communicated via the appliance 205. The encryption engine may also setup or establish SSL or TLS connections on behalf of the client 102a-102n, server 106a-106n, or appliance 200, 205. As such, the encryption engine provides offloading and acceleration of SSL processing. In one embodiment, the encryption engine uses a tunneling protocol to provide a virtual private network between a client 102a-102n and a server 106a-106n. In some embodiments, the encryption engine uses an encryption processor. In other embodiments, the encryption engine includes executable instructions running on an encryption processor.

In some embodiments, the appliance 205 provides one or more of the following acceleration techniques to communications between the client 102 and server 106: 1) compression, 2) decompression, 3) Transmission Control Protocol pooling, 4) Transmission Control Protocol multiplexing, 5) Transmission Control Protocol buffering, and 6) caching. In one embodiment, the appliance 200 relieves servers 106 of much of the processing load caused by repeatedly opening and closing transport layers connections to clients 102 by opening one or more transport layer connections with each server 106 and maintaining these connections to allow repeated data accesses by clients via the Internet. This technique is referred to herein as "connection pooling".

In some embodiments, in order to seamlessly splice communications from a client 102 to a server 106 via a pooled transport layer connection, the appliance 205 translates or multiplexes communications by modifying sequence number and acknowledgment numbers at the transport layer protocol level. This is referred to as "connection multiplexing". In some embodiments, no application layer protocol interaction is required. For example, in the case of an in-bound packet (that is, a packet received from a client 102), the source network address of the packet is changed to that of an output port of appliance 205, and the destination network address is changed to that of the intended server. In the case of an outbound packet (that is, one received from a server 106), the source network address is changed from that of the server 106 to that of an output port of appliance 205 and the destination address is changed from that of appliance 205 to that of the requesting client 102. The sequence numbers and acknowledgment numbers of the packet are also translated to sequence numbers and acknowledgement expected by the client 102 on the appliance's 205 transport layer connection to the client 102. In some embodiments, the packet checksum of the transport layer protocol is recalculated to account for these translations.

In another embodiment, the appliance 205 provides switching or load-balancing functionality for communications between the client 102 and server 106. In some embodiments, the appliance 205 distributes traffic and directs client requests to a server 106 based on layer 4 payload or application-layer request data. In one embodiment, although the network layer or layer 2 of the network packet identifies a destination server 106, the appliance 205 determines the server 106 to distribute the network packet by application information and data carried as payload of the transport layer packet. In one embodiment, a health monitoring program of the appliance 205 monitors the health of servers to determine the server 106 for which to distribute a client's request. In some embodiments, if the appliance 205 detects a server 106 is not available or has a load over a predetermined threshold, the appliance 205 can direct or distribute client requests to another server 106.

In some embodiments, the appliance 205 acts as a Domain Name Service (DNS) resolver or otherwise provides resolution of a DNS request from clients 102. In some embodiments, the appliance intercepts' a DNS request transmitted by the client 102. In one embodiment, the appliance 205 responds to a client's DNS request with an IP address of or hosted by the appliance 205. In this embodiment, the client 102 transmits network communication for the domain name to the appliance 200. In another embodiment, the appliance 200 responds to a client's DNS request with an IP address of or hosted by a second appliance 200'. In some embodiments, the appliance 205 responds to a client's DNS request with an IP address of a server 106 determined by the appliance 200.

In yet another embodiment, the appliance 205 provides application firewall functionality for communications between the client 102 and server 106. In one embodiment, a policy engine 295' provides rules for detecting and blocking illegitimate requests. In some embodiments, the application firewall protects against denial of service (DoS) attacks. In other embodiments, the appliance inspects the content of intercepted requests to identify and block application-based attacks. In some embodiments, the rules/policy engine includes one or more application firewall or security control policies for providing protections against various classes and types of web or Internet based vulnerabilities, such as one or more of the following: 1) buffer overflow, 2) CGI-BIN parameter manipulation, 3) form/hidden field manipulation, 4) forceful browsing, 5) cookie or session poisoning, 6) broken access control list (ACLs) or weak passwords, 7) cross-site scripting (XSS), 8) command injection, 9) SQL injection, 10) error triggering sensitive information leak, 11) insecure use of cryptography, 12) server misconfiguration, 13) back doors and debug options, 14) website defacement, 15) platform or operating systems vulnerabilities, and 16) zero-day exploits. In an embodiment, the application firewall of the appliance provides HTML form field protection in the form of inspecting or analyzing the network communication for one or more of the following: 1) required fields are returned, 2) no added field allowed, 3) read-only and hidden field enforcement, 4) drop-down list and radio button field conformance, and 5) form-field max-length enforcement. In some embodiments, the application firewall of the appliance 205 ensures cookies are not modified. In other embodiments, the appliance 205 protects against forceful browsing by enforcing legal URLs.

In still yet other embodiments, the application firewall appliance 205 protects any confidential information contained in the network communication. The appliance 205 may inspect or analyze any network communication in accordance with the rules or polices of the policy engine to identify any confidential information in any field of the network packet. In some embodiments, the application firewall identifies in the network communication one or more occurrences of a credit card number, password, social security number, name, patient code, contact information, and age. The encoded portion of the network communication may include these occurrences or the confidential information. Based on these occurrences, in one embodiment, the application firewall may take a policy action on the network communication, such as prevent transmission of the network communication. In another embodiment, the application firewall may rewrite, remove or otherwise mask such identified occurrence or confidential information.

Although generally referred to as a network optimization or first appliance 200 and a second appliance 205, the first appliance 200 and second appliance 205 may be the same type and form of appliance. In one embodiment, the second appliance 205 may perform the same functionality, or portion thereof, as the first appliance 200, and vice-versa. For example, the first appliance 200 and second appliance 205 may both provide acceleration techniques. In one embodiment, the first appliance may perform LAN acceleration while the second appliance performs WAN acceleration, or vice-versa. In another example, the first appliance 200 may also be a transport control protocol terminating device as with the second appliance 205. Furthermore, although appliances 200 and 205 are shown as separate devices on the network, the appliance 200 and/or 205 could be a part of any client 102 or server 106.

Figure 1C:
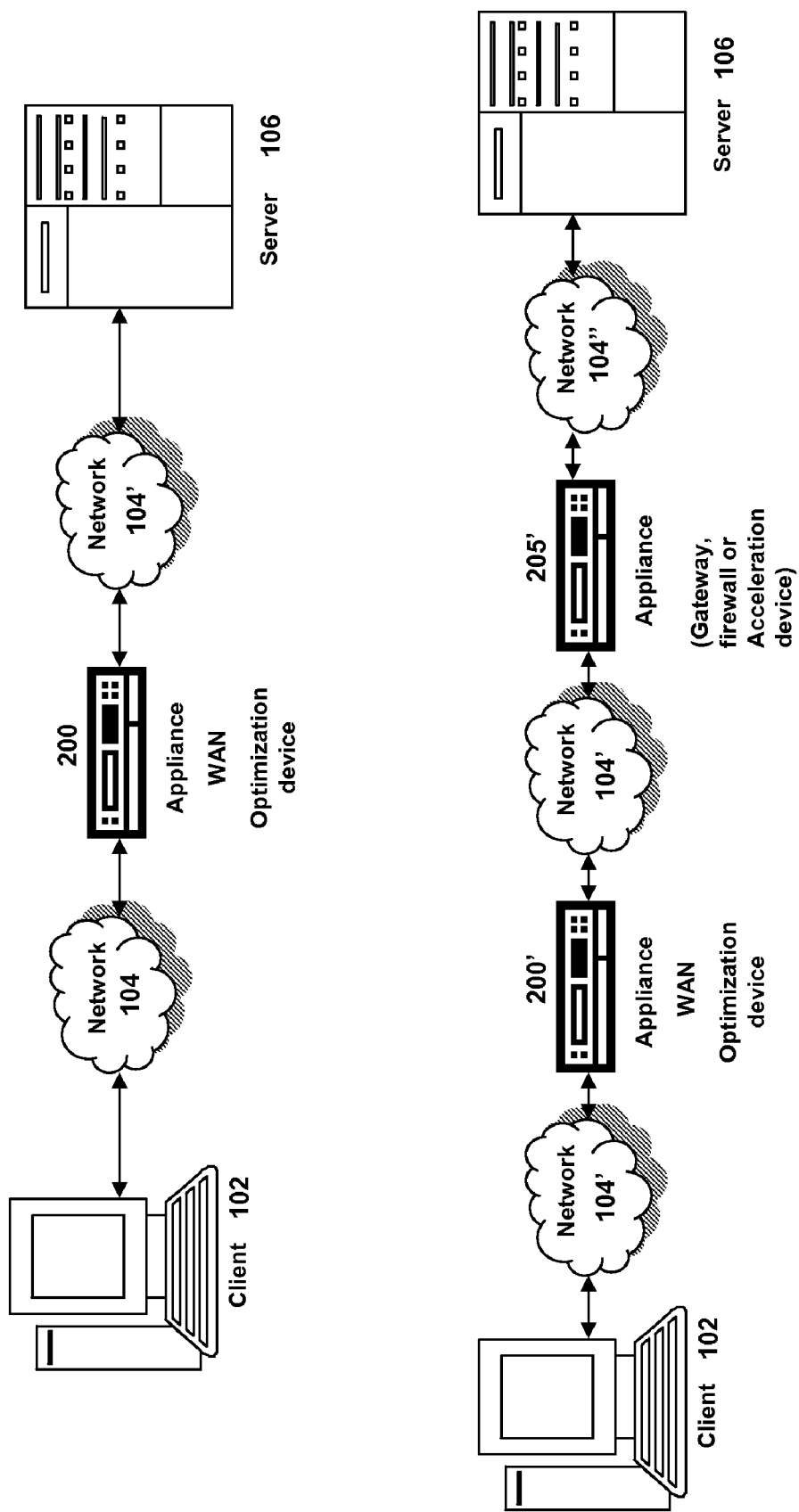
FIG. 1C is a block diagram of another embodiment of a network environment for a client to access a server via a single network optimization appliance deployed stand-alone or in conjunction with other network appliances.

Referring now to FIG. 1C, other embodiments of a network environment for deploying the appliance 200 are depicted. In another embodiment as depicted on the top of FIG. 1C, the appliance 200 may be deployed as a single appliance or single proxy on the network 104. For example, the appliance 200 may be designed, constructed or adapted to perform WAN optimization techniques discussed herein without a second cooperating appliance 200'. In other embodiments as depicted on the bottom of FIG. 1C, a single appliance 200 may be deployed with one or more second appliances 205. For example, a WAN acceleration first appliance 200, such as a Citrix WANScaler appliance, may be deployed with a LAN accelerating or Application Firewall second appliance 205, such as a Citrix NetScaler appliance.

Computing Device

Figure 1D:
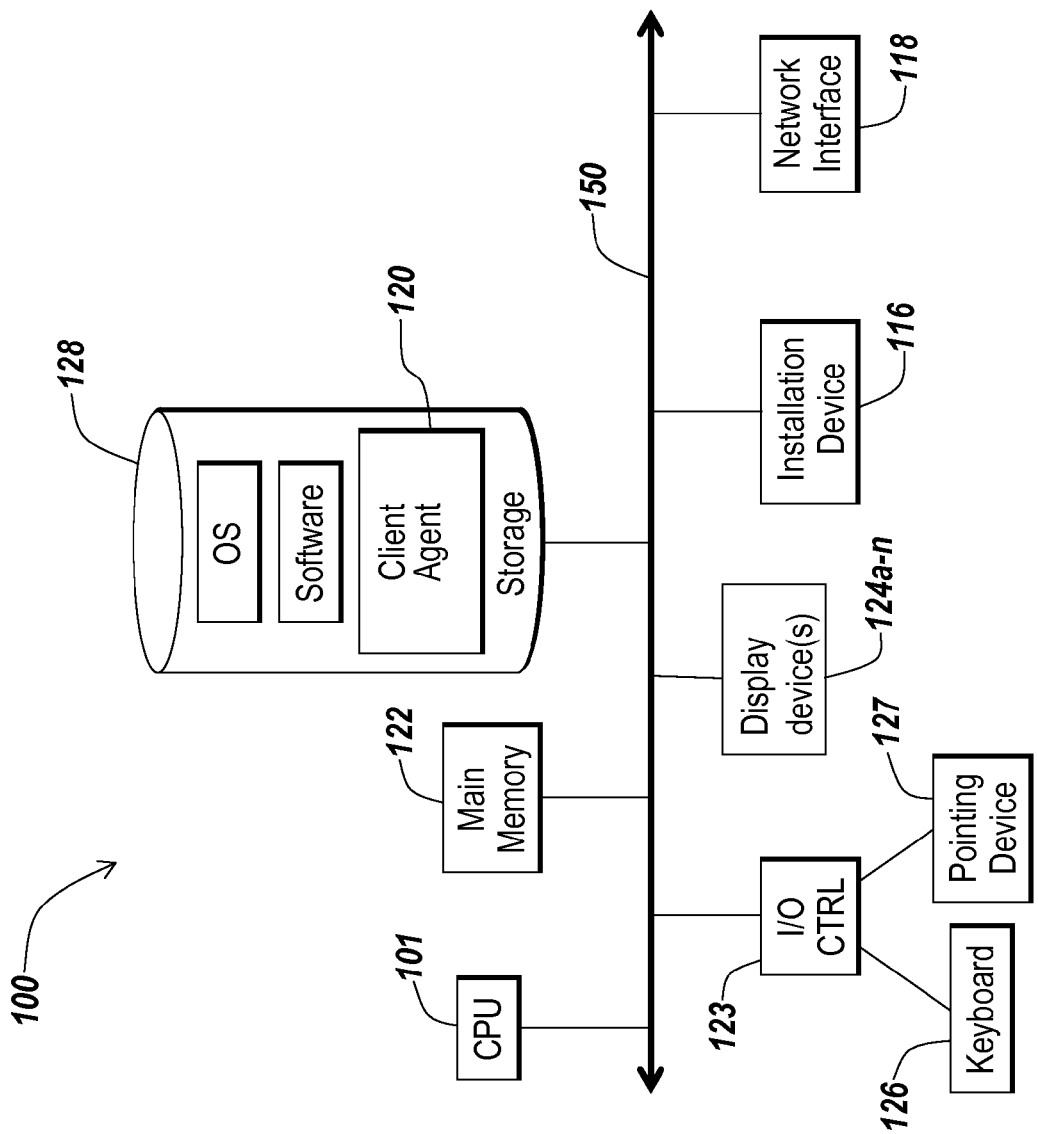
FIGS. 1D and 1E are block diagrams of embodiments of a computing device.

The client 102, server 106, and appliance 200 and 205 may be deployed as and/or executed on any type and form of computing device, such as a computer, network device or appliance capable of communicating on any type and form of network and performing the operations described herein. FIGS. 1C and 1D depict block diagrams of a computing device 100 useful for practicing an embodiment of the client 102, server 106 or appliance 200. As shown in FIGS. 1C and 1D, each computing device 100 includes a central processing unit 101, and a main memory unit 122. As shown in FIG. 1C, a computing device 100 may include a visual display device 124, a keyboard 126 and/or a pointing device 127, such as a mouse. Each computing device 100 may also include additional optional elements, such as one or more input/output devices 130a-130b (generally referred to using reference numeral 130), and a cache memory 140 in communication with the central processing unit 101.

The central processing unit 101 is any logic circuitry that responds to and processes instructions fetched from the main memory unit 122. In many embodiments, the central processing unit is provided by a microprocessor unit, such as: those manufactured by Intel Corporation of Mountain View, Calif.; those manufactured by Motorola Corporation of Schaumburg, Ill.; those manufactured by Transmeta Corporation of Santa Clara, Calif.; the RS/6000 processor, those manufactured by International Business Machines of White Plains, N.Y.; or those manufactured by Advanced Micro Devices of Sunnyvale, Calif. The computing device 100 may be based on any of these processors, or any other processor capable of operating as described herein.

Main memory unit 122 may be one or more memory chips capable of storing data and allowing any storage location to be directly accessed by the microprocessor 101, such as Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDEC SRAM, PC100 SDRAM, Double Data Rate SDRAM (DDR SDRAM), Enhanced SDRAM (ESDRAM), SyncLink DRAM (SLDRAM), Direct Rambus DRAM (DRDRAM), or Ferroelectric RAM (FRAM). The main memory 122 may be based on any of the above described memory chips, or any other available memory chips capable of operating as described herein. In the embodiment shown in FIG. 1C, the processor 101 communicates with main memory 122 via a system bus 150 (described in more detail below). FIG. 1C depicts an embodiment of a computing device 100 in which the processor communicates directly with main memory 122 via a memory port 103. For example, in FIG. 1D the main memory 122 may be DRDRAM.

FIG. 1D depicts an embodiment in which the main processor 101 communicates directly with cache memory 140 via a secondary bus, sometimes referred to as a backside bus. In other embodiments, the main processor 101 communicates with cache memory 140 using the system bus 150. Cache memory 140 typically has a faster response time than main memory 122 and is typically provided by SRAM, BSRAM, or EDRAM. In the embodiment shown in FIG. 1C, the processor 101 communicates with various I/O devices 130 via a local system bus 150. Various busses may be used to connect the central processing unit 101 to any of the I/O devices 130, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 101 may use an Advanced Graphics Port (AGP) to communicate with the display 124. FIG. 1D depicts an embodiment of a computer 100 in which the main processor 101 communicates directly with I/O device 130 via HyperTransport, Rapid I/O, or InfiniBand. FIG. 1D also depicts an embodiment in which local busses and direct communication are mixed: the processor 101 communicates with I/O device 130 using a local interconnect bus while communicating with I/O device 130 directly.

The computing device 100 may support any suitable installation device 116, such as a floppy disk drive for receiving floppy disks such as 3.5-inch, 5.25-inch disks or ZIP disks, a CD-ROM drive, a CD-R/RW drive, a DVD-ROM drive, tape drives of various formats, USB device, hard-drive or any other device suitable for installing software and programs such as any client agent 120, or portion thereof. The computing device 100 may further comprise a storage device 128, such as one or more hard disk drives or redundant arrays of independent disks, for storing an operating system and other related software, and for storing application software programs such as any program related to the client agent 120. Optionally, any of the installation devices 116 could also be used as the storage device 128. Additionally, the operating system and the software can be run from a bootable medium, for example, a bootable CD, such as KNOPPIX®, a bootable CD for GNU/Linux that is available as a GNU/Linux distribution from knoppix.net.

Furthermore, the computing device 100 may include a network interface 118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 118 may comprise a built-in network adapter, network interface card, PCMCIA network card, card bus network adapter, wireless network adapter, USB network adapter, modem or any other device suitable for interfacing the computing device 100 to any type of network capable of communication and performing the operations described herein. A wide variety of I/O devices 130a-130n may be present in the computing device 100. Input devices include keyboards, mice, trackpads, trackballs, microphones, and drawing tablets. Output devices include video displays, speakers, inkjet printers, laser printers, and dye-sublimation printers. The I/O devices 130 may be controlled by an I/O controller 123 as shown in FIG. 1C. The I/O controller may control one or more I/O devices such as a keyboard 126 and a pointing device 127, e.g., a mouse or optical pen. Furthermore, an I/O device may also provide storage 128 and/or an installation medium 116 for the computing device 100. In still other embodiments, the computing device 100 may provide USB connections to receive handheld USB storage devices such as the USB Flash Drive line of devices manufactured by Twintech Industry, Inc. of Los Alamitos, Calif.

In some embodiments, the computing device 100 may comprise or be connected to multiple display devices 124a-124n, which each may be of the same or different type and/or form. As such, any of the I/O devices 130a-130n and/or the I/O controller 123 may comprise any type and/or form of suitable hardware, software, or combination of hardware and software to support, enable or provide for the connection and use of multiple display devices 124a-124n by the computing device 100. For example, the computing device 100 may include any type and/or form of video adapter, video card, driver, and/or library to interface, communicate, connect or otherwise use the display devices 124a-124n. In one embodiment, a video adapter may comprise multiple connectors to interface to multiple display devices 124a-124n. In other embodiments, the computing device 100 may include multiple video adapters, with each video adapter connected to one or more of the display devices 124a-124n. In some embodiments, any portion of the operating system of the computing device 100 may be configured for using multiple displays 124a-124n. In other embodiments, one or more of the display devices 124a-124n may be provided by one or more other computing devices, such as computing devices 100a and 100b connected to the computing device 100, for example, via a network. These embodiments may include any type of software designed and constructed to use another computer's display device as a second display device 124a for the computing device 100. One ordinarily skilled in the art will recognize and appreciate the various ways and embodiments that a computing device 100 may be configured to have multiple display devices 124a-124n.

In further embodiments, an I/O device 130 may be a bridge 170 between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, or a Serial Attached small computer system interface bus.

A computing device 100 of the sort depicted in FIGS. 1C and 1D typically operate under the control of operating systems, which control scheduling of tasks and access to system resources. The computing device 100 can be running any operating system such as any of the versions of the Microsoft® Windows operating systems, the different releases of the Unix and Linux operating systems, any version of the Mac OS® or OS X for Macintosh computers, any embedded operating system, any real-time operating system, any open source operating system, any proprietary operating system, any operating systems for mobile computing devices, or any other operating system capable of running on the computing device and performing the operations described herein. Typical operating systems include: WINDOWS 3.x, WINDOWS 95, WINDOWS 98, WINDOWS 2000, WINDOWS NT 3.51, WINDOWS NT 4.0, WINDOWS CE, WINDOWS 2003, WINDOWS XP, and WINDOWS VISTA all of which are manufactured by Microsoft Corporation of Redmond, Wash.; MacOS and OS X, manufactured by Apple Computer of Cupertino, Calif.; OS/2, manufactured by International Business Machines of Armonk, N.Y.; and Linux, a freely-available operating system distributed by Caldera Corp. of Salt Lake City, Utah, or any type and/or form of a Unix operating system, (such as those versions of Unix referred to as Solaris/Sparc, Solaris/x86, AIX IBM, HP UX, and SGI (Silicon Graphics)), among others.

In other embodiments, the computing device 100 may have different processors, operating systems, and input devices consistent with the device. For example, in one embodiment the computer 100 is a Treo 180, 270, 1060, 600 or 650 smart phone manufactured by Palm, Inc. In this embodiment, the Treo smart phone is operated under the control of the PalmOS operating system and includes a stylus input device as well as a five-way navigator device. In another example, the computing device 100 may be a WinCE or PocketPC device with an ARM (Advanced RISC Machine) type of processor. In one example, the computing device 100 includes a Series 80 (Nokia 9500 or Nokia 9300) type of smart phone manufactured by Nokia of Finland, which may run the Symbian OS or EPOC mobile operating system manufactured by Symbian Software Limited of London, United Kingdom. In another example, the computing device 100 may include a FOMA M100 brand smart phone manufactured by Motorola, Inc. of Schaumburg, Ill., and operating the EPOC or Symbian OS operating system. In yet another example, the computing device 100 includes a Sony Ericsson P800, P900 or P910 Alpha model phone manufactured by Sony Ericsson Mobile Communications (USA) Inc. of Research Triangle Park, N.C. Moreover, the computing device 100 can be any workstation, desktop computer, laptop or notebook computer, server, handheld computer, mobile telephone, smart phone, any other computer, or other form of computing or telecommunications device that is capable of communication and that has sufficient processor power and memory capacity to perform the operations described herein.

B. System and Appliance Architecture

Figure 2A:
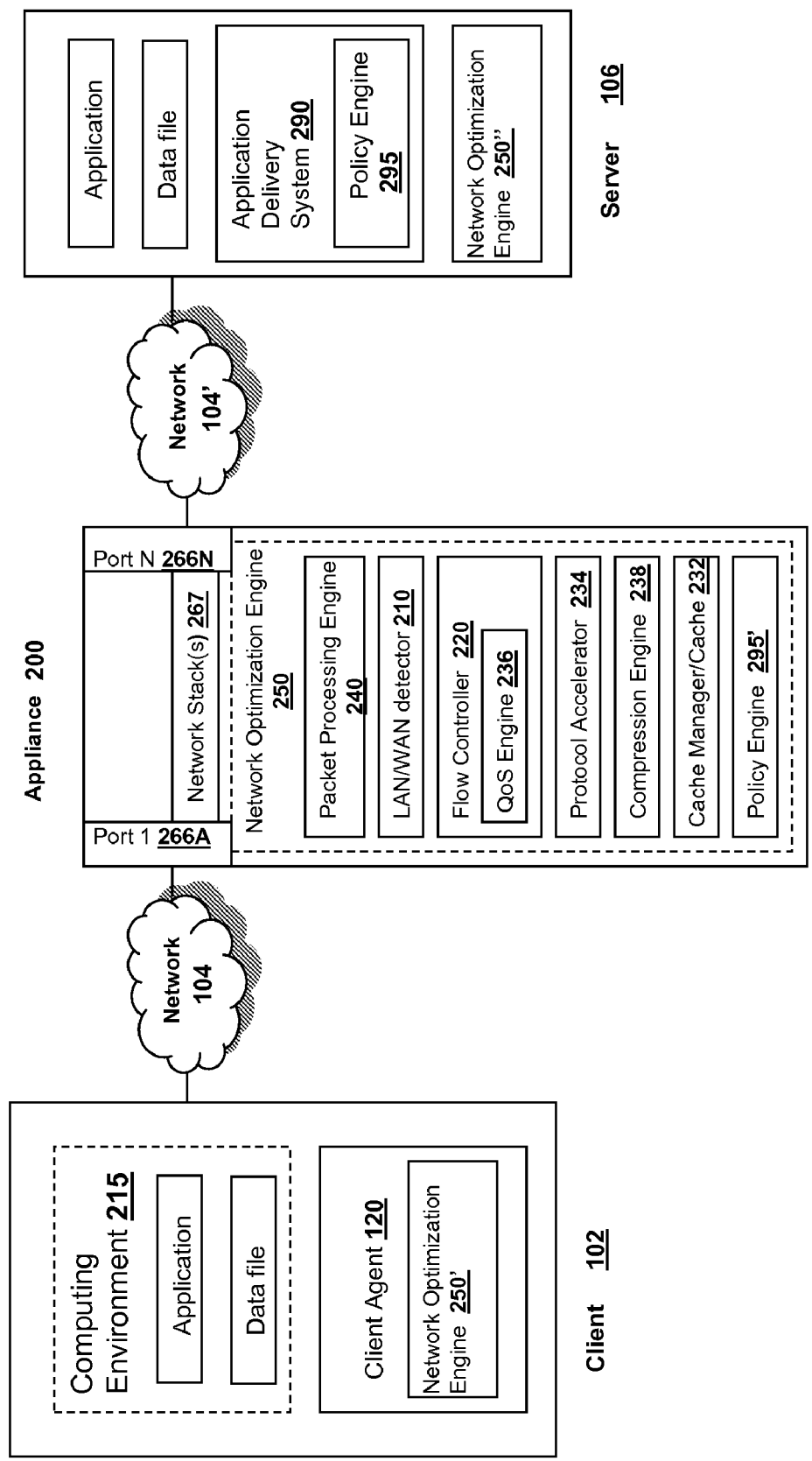
FIG. 2A is a block diagram of an embodiment of an appliance for processing communications between a client and a server.

Referring now to FIG. 2A, an embodiment of a system environment and architecture of an appliance 200 for delivering and/or operating a computing environment on a client is depicted. In some embodiments, a server 106 includes an application delivery system 290 for delivering a computing environment or an application and/or data file to one or more clients 102. In brief overview, a client 102 is in communication with a server 106 via network 104 and appliance 200. For example, the client 102 may reside in a remote office of a company, e.g., a branch office, and the server 106 may reside at a corporate data center. The client 102 has a client agent 120, and a computing environment 215. The computing environment 215 may execute or operate an application that accesses, processes or uses a data file. The computing environment 215, application and/or data file may be delivered via the appliance 200 and/or the server 106.

In some embodiments, the appliance 200 accelerates delivery of a computing environment 215, or any portion thereof, to a client 102. In one embodiment, the appliance 200 accelerates the delivery of the computing environment 215 by the application delivery system 290. For example, the embodiments described herein may be used to accelerate delivery of a streaming application and data file processable by the application from a central corporate data center to a remote user location, such as a branch office of the company. In another embodiment, the appliance 200 accelerates transport layer traffic between a client 102 and a server 106. In another embodiment, the appliance 200 controls, manages, or adjusts the transport layer protocol to accelerate delivery of the computing environment. In some embodiments, the appliance 200 uses caching and/or compression techniques to accelerate delivery of a computing environment.

In some embodiments, the application delivery management system 290 provides application delivery techniques to deliver a computing environment to a desktop of a user, remote or otherwise, based on a plurality of execution methods and based on any authentication and authorization policies applied via a policy engine 295. With these techniques, a remote user may obtain a computing environment and access to server stored applications and data files from any network connected device 100. In one embodiment, the application delivery system 290 may reside or execute on a server 106. In another embodiment, the application delivery system 290 may reside or execute on a plurality of servers 106a-106n. In some embodiments, the application delivery system 290 may execute in a server farm 38. In one embodiment, the server 106 executing the application delivery system 290 may also store or provide the application and data file. In another embodiment, a first set of one or more servers 106 may execute the application delivery system 290, and a different server 106n may store or provide the application and data file. In some embodiments, each of the application delivery system 290, the application, and data file may reside or be located on different servers. In yet another embodiment, any portion of the application delivery system 290 may reside, execute or be stored on or distributed to the appliance 200, or a plurality of appliances.

The client 102 may include a computing environment 215 for executing an application that uses or processes a data file. The client 102 via networks 104, 104' and appliance 200 may request an application and data file from the server 106. In one embodiment, the appliance 200 may forward a request from the client 102 to the server 106. For example, the client 102 may not have the application and data file stored or accessible locally. In response to the request, the application delivery system 290 and/or server 106 may deliver the application and data file to the client 102. For example, in one embodiment, the server 106 may transmit the application as an application stream to operate in computing environment 215 on client 102.

In some embodiments, the application delivery system 290 comprises any portion of the Citrix Access Suite™ by Citrix Systems, Inc., such as the MetaFrame or Citrix Presentation Server™ and/or any of the Microsoft® Windows Terminal Services manufactured by the Microsoft Corporation. In one embodiment, the application delivery system 290 may deliver one or more applications to clients 102 or users via a remote-display protocol or otherwise via remote-based or server-based computing. In another embodiment, the application delivery system 290 may deliver one or more applications to clients or users via steaming of the application.

In one embodiment, the application delivery system 290 includes a policy engine 295 for controlling and managing the access to applications, selection of application execution methods and the delivery of applications. In some embodiments, the policy engine 295 determines the one or more applications a user or client 102 may access. In another embodiment, the policy engine 295 determines how the application should be delivered to the user or client 102, e.g., the method of execution. In some embodiments, the application delivery system 290 provides a plurality of delivery techniques from which to select a method of application execution, such as a server-based computing, streaming or delivering the application locally to the client 120 for local execution.

In one embodiment, a client 102 requests execution of an application program and the application delivery system 290 comprising a server 106 selects a method of executing the application program. In some embodiments, the server 106 receives credentials from the client 102. In another embodiment, the server 106 receives a request for an enumeration of available applications from the client 102. In one embodiment, in response to the request or receipt of credentials, the application delivery system 290 enumerates a plurality of application programs available to the client 102. The application delivery system 290 receives a request to execute an enumerated application. The application delivery system 290 selects one of a predetermined number of methods for executing the enumerated application, for example, responsive to a policy of a policy engine. The application delivery system 290 may select a method of execution of the application enabling the client 102 to receive application-output data generated by execution of the application program on a server 106. The application delivery system 290 may select a method of execution of the application enabling the client or local machine 102 to execute the application program locally after retrieving a plurality of application files comprising the application. In yet another embodiment, the application delivery system 290 may select a method of execution of the application to stream the application via the network 104 to the client 102.

A client 102 may execute, operate or otherwise provide an application, which can be any type and/or form of software, program, or executable instructions such as any type and/or form of web browser, web-based client, client-server application, a thin-client computing client, an ActiveX control, or a Java applet, or any other type and/or form of executable instructions capable of executing on client 102. In some embodiments, the application may be a server-based or a remote-based application executed on behalf of the client 102 on a server 106. In one embodiment the server 106 may display output to the client 102 using any thin-client or remote-display protocol, such as the Independent Computing Architecture (ICA) protocol manufactured by Citrix Systems, Inc. of Ft. Lauderdale, Fla. or the Remote Desktop Protocol (RDP) manufactured by the Microsoft Corporation of Redmond, Wash. The application can use any type of protocol and it can be, for example, an HTTP client, an FTP client, an Oscar client, or a Telnet client. In other embodiments, the application comprises any type of software related to VoIP communications, such as a soft IP telephone. In further embodiments, the application comprises any application related to real-time data communications, such as applications for streaming video and/or audio.

In some embodiments, the server 106 or a server farm 38 may be running one or more applications, such as an application providing a thin-client computing or remote display presentation application. In one embodiment, the server 106 or server farm 38 executes, as an application, any portion of the Citrix Access Suite™ by Citrix Systems, Inc., such as the MetaFrame or Citrix Presentation Server™, and/or any of the Microsoft® Windows Terminal Services manufactured by the Microsoft Corporation. In one embodiment, the application is an ICA client, developed by Citrix Systems, Inc. of Fort Lauderdale, Fla. In other embodiments, the application includes a Remote Desktop (RDP) client, developed by Microsoft Corporation of Redmond, Wash. Also, the server 106 may run an application, which for example, may be an application server providing email services such as Microsoft Exchange manufactured by the Microsoft Corporation of Redmond, Wash., a web or Internet server, or a desktop sharing server, or a collaboration server. In some embodiments, any of the applications may comprise any type of hosted service or products, such as GoToMeeting™ provided by Citrix Online Division, Inc. of Santa Barbara, Calif., WebEx™ provided by WebEx, Inc. of Santa Clara, Calif., or Microsoft Office Live Meeting provided by Microsoft Corporation of Redmond, Wash.

Example Appliance Architecture

Figure 1E:
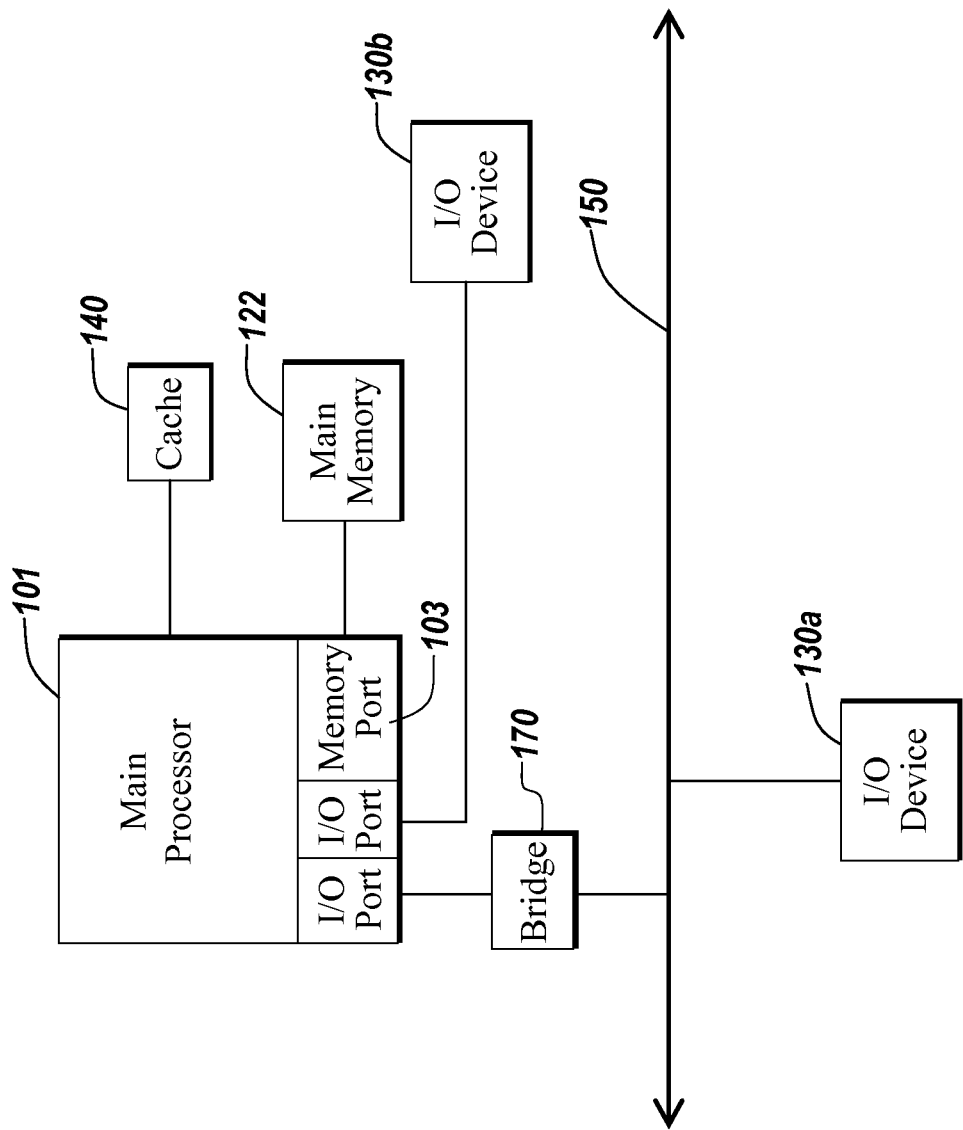

FIG. 2A also illustrates an example embodiment of the appliance 200. The architecture of the appliance 200 in FIG. 2A is provided by way of illustration only and is not intended to be limiting in any manner. The appliance 200 may include any type and form of computing device 100, such as any element or portion described in conjunction with FIGS. 1D and 1E above. In brief overview, the appliance 200 has one or more network ports 266A-226N and one or more networks stacks 267A-267N for receiving and/or transmitting communications via networks 104. The appliance 200 also has a network optimization engine 250 for optimizing, accelerating or otherwise improving the performance, operation, or quality of any network traffic or communications traversing the appliance 200.

The appliance 200 includes or is under the control of an operating system. The operating system of the appliance 200 may be any type and/or form of Unix operating system although the invention is not so limited. As such, the appliance 200 can be running any operating system such as any of the versions of the Microsoft® Windows operating systems, the different releases of the Unix and Linux operating systems, any version of the Mac OS® for Macintosh computers, any embedded operating system, any network operating system, any real-time operating system, any open source operating system, any proprietary operating system, any operating systems for mobile computing devices or network devices, or any other operating system capable of running on the appliance 200 and performing the operations described herein.

The operating system of appliance 200 allocates, manages, or otherwise segregates the available system memory into what is referred to as kernel or system space, and user or application space. The kernel space is typically reserved for running the kernel, including any device drivers, kernel extensions or other kernel related software. As known to those skilled in the art, the kernel is the core of the operating system, and provides access, control, and management of resources and hardware-related elements of the appliance 200. In accordance with an embodiment of the appliance 200, the kernel space also includes a number of network services or processes working in conjunction with the network optimization engine 250, or any portion thereof. Additionally, the embodiment of the kernel will depend on the embodiment of the operating system installed, configured, or otherwise used by the device 200. In contrast to kernel space, user space is the memory area or portion of the operating system used by user mode applications or programs otherwise running in user mode. A user mode application may not access kernel space directly and uses service calls in order to access kernel services. The operating system uses the user or application space for executing or running applications and provisioning of user level programs, services, processes and/or tasks.

The appliance 200 has one or more network ports 266 for transmitting and receiving data over a network 104. The network port 266 provides a physical and/or logical interface between the computing device and a network 104 or another device 100 for transmitting and receiving network communications. The type and form of network port 266 depends on the type and form of network and type of medium for connecting to the network. Furthermore, any software of, provisioned for or used by the network port 266 and network stack 267 may run in either kernel space or user space.

In one embodiment, the appliance 200 has one network stack 267, such as a TCP/IP based stack, for communicating on a network 105, such with the client 102 and/or the server 106. In one embodiment, the network stack 267 is used to communicate with a first network, such as network 104, and also with a second network 104'. In another embodiment, the appliance 200 has two or more network stacks, such as first network stack 267A and a second network stack 267N. The first network stack 267A may be used in conjunction with a first port 266A to communicate on a first network 104. The second network stack 267N may be used in conjunction with a second port 266N to communicate on a second network 104'. In one embodiment, the network stack(s) 267 has one or more buffers for queuing one or more network packets for transmission by the appliance 200.

The network stack 267 includes any type and form of software, or hardware, or any combinations thereof, for providing connectivity to and communications with a network. In one embodiment, the network stack 267 includes a software implementation for a network protocol suite. The network stack 267 may have one or more network layers, such as any networks layers of the Open Systems Interconnection (OSI) communications model as those skilled in the art recognize and appreciate. As such, the network stack 267 may have any type and form of protocols for any of the following layers of the OSI model: 1) physical link layer, 2) data link layer, 3) network layer, 4) transport layer, 5) session layer, 6) presentation layer, and 7) application layer. In one embodiment, the network stack 267 includes a transport control protocol (TCP) over the network layer protocol of the internet protocol (IP), generally referred to as TCP/IP. In some embodiments, the TCP/IP protocol may be carried over the Ethernet protocol, which may comprise any of the family of IEEE wide-area-network (WAN) or local-area-network (LAN) protocols, such as those protocols covered by the IEEE 802.3. In some embodiments, the network stack 267 has any type and form of a wireless protocol, such as IEEE 802.11 and/or mobile internet protocol.

In view of a TCP/IP based network, any TCP/IP based protocol may be used, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In another embodiment, the network stack 267 comprises any type and form of transport control protocol, such as a modified transport control protocol, for example a Transaction TCP (T/TCP), TCP with selection acknowledgements (TCP-SACK), TCP with large windows (TCP-LW), a congestion prediction protocol such as the TCP-Vegas protocol, and a TCP spoofing protocol. In other embodiments, any type and form of user datagram protocol (UDP), such as UDP over IP, may be used by the network stack 267, such as for voice communications or real-time data communications.

Furthermore, the network stack 267 may include one or more network drivers supporting the one or more layers, such as a TCP driver or a network layer driver. The network drivers may be included as part of the operating system of the computing device 100 or as part of any network interface cards or other network access components of the computing device 100. In some embodiments, any of the network drivers of the network stack 267 may be customized, modified or adapted to provide a custom or modified portion of the network stack 267 in support of any of the techniques described herein.

In one embodiment, the appliance 200 provides for or maintains a transport layer connection between a client 102 and server 106 using a single network stack 267. In some embodiments, the appliance 200 effectively terminates the transport layer connection by changing, managing or controlling the behavior of the transport control protocol connection between the client and the server. In these embodiments, the appliance 200 may use a single network stack 267. In other embodiments, the appliance 200 terminates a first transport layer connection, such as a TCP connection of a client 102, and establishes a second transport layer connection to a server 106 for use by or on behalf of the client 102, e.g., the second transport layer connection is terminated at the appliance 200 and the server 106. The first and second transport layer connections may be established via a single network stack 267. In other embodiments, the appliance 200 may use multiple network stacks, for example 267A and 267N. In these embodiments, the first transport layer connection may be established or terminated at one network stack 267A, and the second transport layer connection may be established or terminated on the second network stack 267N. For example, one network stack may be for receiving and transmitting network packets on a first network, and another network stack for receiving and transmitting network packets on a second network.

As shown in FIG. 2A, the network optimization engine 250 includes one or more of the following elements, components or modules: network packet processing engine 240, LAN/WAN detector 210, flow controller 220, QoS engine 236, protocol accelerator 234, compression engine 238, cache manager 232 and policy engine 295'. The network optimization engine 250, or any portion thereof, may include software, hardware or any combination of software and hardware. Furthermore, any software of, provisioned for or used by the network optimization engine 250 may run in either kernel space or user space. For example, in one embodiment, the network optimization engine 250 may run in kernel space. In another embodiment, the network optimization engine 250 may run in user space. In yet another embodiment, a first portion of the network optimization engine 250 runs in kernel space while a second portion of the network optimization engine 250 runs in user space.

Network Packet Processing Engine

The network packet engine 240, also generally referred to as a packet processing engine or packet engine, is responsible for controlling and managing the processing of packets received and transmitted by appliance 200 via network ports 266 and network stack(s) 267. The network packet engine 240 may operate at any layer of the network stack 267. In one embodiment, the network packet engine 240 operates at layer 2 or layer 3 of the network stack 267. In some embodiments, the packet engine 240 intercepts or otherwise receives packets at the network layer, such as the IP layer in a TCP/IP embodiment. In another embodiment, the packet engine 240 operates at layer 4 of the network stack 267. For example, in some embodiments, the packet engine 240 intercepts or otherwise receives packets at the transport layer, such as intercepting packets as the TCP layer in a TCP/IP embodiment. In other embodiments, the packet engine 240 operates at any session or application layer above layer 4. For example, in one embodiment, the packet engine 240 intercepts or otherwise receives network packets above the transport layer protocol layer, such as the payload of a TCP packet in a TCP embodiment.

The packet engine 240 may include a buffer for queuing one or more network packets during processing, such as for receipt of a network packet or transmission of a network packet. Additionally, the packet engine 240 is in communication with one or more network stacks 267 to send and receive network packets via network ports 266. The packet engine 240 may include a packet processing timer. In one embodiment, the packet processing timer provides one or more time intervals to trigger the processing of incoming, i.e., received, or outgoing, i.e., transmitted, network packets. In some embodiments, the packet engine 240 processes network packets responsive to the timer. The packet processing timer provides any type and form of signal to the packet engine 240 to notify, trigger, or communicate a time related event, interval or occurrence. In many embodiments, the packet processing timer operates in the order of milliseconds, such as for example 100 ms, 50 ms, 25 ms, 10 ms, 5 ms or 1 ms.

During operations, the packet engine 240 may be interfaced, integrated or be in communication with any portion of the network optimization engine 250, such as the LAN/WAN detector 210, flow controller 220, QoS engine 236, protocol accelerator 234, compression engine 238, cache manager 232 and/or policy engine 295'. As such, any of the logic, functions, or operations of the LAN/WAN detector 210, flow controller 220, QoS engine 236, protocol accelerator 234, compression engine 238, cache manager 232 and policy engine 295' may be performed responsive to the packet processing timer and/or the packet engine 240. In some embodiments, any of the logic, functions, or operations of the encryption engine 234, cache manager 232, policy engine 236 and multi-protocol compression logic 238 may be performed at the granularity of time intervals provided via the packet processing timer, for example, at a time interval of less than or equal to 10 ms. For example, in one embodiment, the cache manager 232 may perform expiration of any cached objects responsive to the integrated packet engine 240 and/or the packet processing timer 242. In another embodiment, the expiry or invalidation time of a cached object can be set to the same order of granularity as the time interval of the packet processing timer, such as at every 10 ms.

Cache Manager

The cache manager 232 may include software, hardware or any combination of software and hardware to store data, information and objects to a cache in memory or storage, provide cache access, and control and manage the cache. The data, objects or content processed and stored by the cache manager 232 may include data in any format, such as a markup language, or any type of data communicated via any protocol. In some embodiments, the cache manager 232 duplicates original data stored elsewhere or data previously computed, generated or transmitted, in which the original data may require longer access time to fetch, compute or otherwise obtain relative to reading a cache memory or storage element. Once the data is stored in the cache, future use can be made by accessing the cached copy rather than refetching or recomputing the original data, thereby reducing the access time. In some embodiments, the cache may comprise a data object in memory of the appliance 200. In another embodiment, the cache may comprise any type and form of storage element of the appliance 200, such as a portion of a hard disk. In some embodiments, the processing unit of the device may provide cache memory for use by the cache manager 232. In yet further embodiments, the cache manager 232 may use any portion and combination of memory, storage, or the processing unit for caching data, objects, and other content.

Furthermore, the cache manager 232 includes any logic, functions, rules, or operations to perform any caching techniques of the appliance 200. In some embodiments, the cache manager 232 may operate as an application, library, program, service, process, thread or task. In some embodiments, the cache manager 232 can comprise any type of general purpose processor (GPP), or any other type of integrated circuit, such as a Field Programmable Gate Array (FPGA), Programmable Logic Device (PLD), or Application Specific Integrated Circuit (ASIC).

Policy Engine

The policy engine 295' includes any logic, function or operations for providing and applying one or more policies or rules to the function, operation or configuration of any portion of the appliance 200. The policy engine 295' may include, for example, an intelligent statistical engine or other programmable application(s). In one embodiment, the policy engine 295 provides a configuration mechanism to allow a user to identify, specify, define or configure a policy for the network optimization engine 250, or any portion thereof. For example, the policy engine 295 may provide policies for what data to cache, when to cache the data, for whom to cache the data, when to expire an object in cache or refresh the cache. In other embodiments, the policy engine 236 may include any logic, rules, functions or operations to determine and provide access, control and management of objects, data or content being cached by the appliance 200 in addition to access, control and management of security, network traffic, network access, compression or any other function or operation performed by the appliance 200.

In some embodiments, the policy engine 295' provides and applies one or more policies based on any one or more of the following: a user, identification of the client, identification of the server, the type of connection, the time of the connection, the type of network, or the contents of the network traffic. In one embodiment, the policy engine 295' provides and applies a policy based on any field or header at any protocol layer of a network packet. In another embodiment, the policy engine 295' provides and applies a policy based on any payload of a network packet. For example, in one embodiment, the policy engine 295' applies a policy based on identifying a certain portion of content of an application layer protocol carried as a payload of a transport layer packet. In another example, the policy engine 295' applies a policy based on any information identified by a client, server or user certificate. In yet another embodiment, the policy engine 295' applies a policy based on any attributes or characteristics obtained about a client 102, such as via any type and form of endpoint detection (see for example the collection agent of the client agent discussed below).

In one embodiment, the policy engine 295' works in conjunction or cooperation with the policy engine 295 of the application delivery system 290. In some embodiments, the policy engine 295' is a distributed portion of the policy engine 295 of the application delivery system 290. In another embodiment, the policy engine 295 of the application delivery system 290 is deployed on or executed on the appliance 200. In some embodiments, the policy engines 295, 295' both operate on the appliance 200. In yet another embodiment, the policy engine 295', or a portion thereof, of the appliance 200 operates on a server 106.

Multi-Protocol and Multi-Layer Compression Engine

The compression engine 238 includes any logic, business rules, function or operations for compressing one or more protocols of a network packet, such as any of the protocols used by the network stack 267 of the appliance 200. The compression engine 238 may also be referred to as a multi-protocol compression engine 238 in that it may be designed, constructed or capable of compressing a plurality of protocols. In one embodiment, the compression engine 238 applies context insensitive compression, which is compression applied to data without knowledge of the type of data. In another embodiment, the compression engine 238 applies context-sensitive compression. In this embodiment, the compression engine 238 utilizes knowledge of the data type to select a specific compression algorithm from a suite of suitable algorithms. In some embodiments, knowledge of the specific protocol is used to perform context-sensitive compression. In one embodiment, the appliance 200 or compression engine 238 can use port numbers (e.g., well-known ports), as well as data from the connection itself to determine the appropriate compression algorithm to use. Some protocols use only a single type of data, requiring only a single compression algorithm that can be selected when the connection is established. Other protocols contain different types of data at different times. For example, POP, IMAP, SMTP, and HTTP all move files of arbitrary types interspersed with other protocol data.

In one embodiment, the compression engine 238 uses a delta-type compression algorithm. In another embodiment, the compression engine 238 uses first site compression as well as searching for repeated patterns among data stored in cache, memory or disk. In some embodiments, the compression engine 238 uses a lossless compression algorithm. In other embodiments, the compression engine uses a lossy compression algorithm. In some cases, knowledge of the data type and, sometimes, permission from the user are required to use a lossy compression algorithm. In some embodiments, compression is not limited to the protocol payload. The control fields of the protocol itself may be compressed. In some embodiments, the compression engine 238 uses a different algorithm for control fields than that used for the payload.

In some embodiments, the compression engine 238 compresses at one or more layers of the network stack 267. In one embodiment, the compression engine 238 compresses at a transport layer protocol. In another embodiment, the compression engine 238 compresses at an application layer protocol. In some embodiments, the compression engine 238 compresses at a layer 2-4 protocol. In other embodiments, the compression engine 238 compresses at a layer 5-7 protocol. In yet another embodiment, the compression engine compresses a transport layer protocol and an application layer protocol. In some embodiments, the compression engine 238 compresses a layer 2-4 protocol and a layer 5-7 protocol.

In some embodiments, the compression engine 238 uses memory-based compression, cache-based compression or disk-based compression or any combination thereof. As such, the compression engine 238 may be referred to as a multi-layer compression engine. In one embodiment, the compression engine 238 uses a history of data stored in memory, such as RAM. In another embodiment, the compression engine 238 uses a history of data stored in a cache, such as L2 cache of the processor. In other embodiments, the compression engine 238 uses a history of data stored to a disk or storage location. In some embodiments, the compression engine 238 uses a hierarchy of cache-based, memory-based and disk-based data history. The compression engine 238 may first use the cache-based data to determine one or more data matches for compression, and then may check the memory-based data to determine one or more data matches for compression. In another case, the compression engine 238 may check disk storage for data matches for compression after checking either the cache-based and/or memory-based data history.

In one embodiment, multi-protocol compression engine 238 compresses bi-directionally between clients 102a-102n and servers 106a-106n any TCP/IP based protocol, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In other embodiments, multi-protocol compression engine 238 provides compression of HyperText Markup Language (HTML) based protocols and in some embodiments, provides compression of any markup languages, such as the Extensible Markup Language (XML). In one embodiment, the multi-protocol compression engine 238 provides compression of any high-performance protocol, such as any protocol designed for appliance 200 to appliance 200 communications. In another embodiment, the multi-protocol compression engine 238 compresses any payload of or any communication using a modified transport control protocol, such as Transaction TCP (T/TCP), TCP with selection acknowledgements (TCP-SACK), TCP with large windows (TCP-LW), a congestion prediction protocol such as the TCP-Vegas protocol, and a TCP spoofing protocol.

As such, the multi-protocol compression engine 238 may accelerate performance for users accessing applications via desktop clients, e.g., Microsoft Outlook and non-Web thin clients, such as any client launched by popular enterprise applications like Oracle, SAP and Siebel, and even mobile clients, such as the Pocket PC. In some embodiments, the multi-protocol compression engine by integrating with packet processing engine 240 accessing the network stack 267 is able to compress any of the protocols carried by a transport layer protocol, such as any application layer protocol.

LAN/WAN Detector

The LAN/WAN detector 238 includes any logic, business rules, function or operations for automatically detecting a slow side connection (e.g., a wide area network (WAN) connection such as an Intranet) and associated port 267, and a fast side connection (e.g., a local area network (LAN) connection) and an associated port 267. In some embodiments, the LAN/WAN detector 238 monitors network traffic on the network ports 267 of the appliance 200 to detect a synchronization packet, sometimes referred to as a "tagged" network packet. The synchronization packet identifies a type or speed of the network traffic. In one embodiment, the synchronization packet identifies a WAN speed or WAN type connection. The LAN/WAN detector 238 also identifies receipt of an acknowledgement packet to a tagged synchronization packet and on which port it is received. The appliance 200 then configures itself to operate the identified port on which the tagged synchronization packet arrived so that the speed on that port is set to be the speed associated with the network connected to that port. The other port is then set to the speed associated with the network connected to that port.

For ease of discussion herein, reference to "slow" side will be made with respect to connection with a wide area network (WAN), e.g., the Internet, and operating at a network speed of the WAN. Likewise, reference to "fast" side will be made with respect to connection with a local area network (LAN) and operating at a network speed the LAN. However, it is noted that "fast" and "slow" sides in a network can change on a per-connection basis and are relative terms to the speed of the network connections or to the type of network topology. Such configurations are useful in complex network topologies, where a network is "fast" or "slow" only when compared to adjacent networks and not in any absolute sense.

In one embodiment, the LAN/WAN detector 238 may be used to allow for auto-discovery by an appliance 200 of a network to which it connects. In another embodiment, the LAN/WAN detector 238 may be used to detect the existence or presence of a second appliance 200' deployed in the network 104. For example, an auto-discovery mechanism in operation in accordance with FIG. 1A functions as follows: appliance 200 and 200' are placed in line with the connection linking client 102 and server 106. The appliances 200 and 200' are at the ends of a low-speed link, e.g., Internet, connecting two LANs. In one example embodiment, appliances 200 and 200' each include two ports—one to connect with the "lower" speed link and the other to connect with a "higher" speed link, e.g., a LAN. Any packet arriving at one port is copied to the other port. Thus, appliance 200 and 200' are each configured to function as a bridge between the two networks 104.

When an end node, such as the client 102, opens a new TCP connection with another end node, such as the server 106, the client 102 sends a TCP packet with a synchronization (SYN) header bit set, or a SYN packet, to the server 106. In the present example, client 102 opens a transport layer connection to server 106. When the SYN packet passes through appliance 200, the appliance 200 inserts, attaches or otherwise provides a characteristic TCP header option to the packet, which announces its presence. If the packet passes through a second appliance, in this example appliance 200' the second appliance notes the header option on the SYN packet. The server 106 responds to the SYN packet with a synchronization acknowledgment (SYN-ACK) packet. When the SYN-ACK packet passes through appliance 200', a TCP header option is tagged (e.g., attached, inserted or added) to the SYN-ACK packet to announce appliance 200' presence to appliance 200. When appliance 200 receives this packet, both appliances 200, 200' are now aware of each other and the connection can be appropriately accelerated.

Further to the operations of the LAN/WAN detector 238, a method or process for detecting "fast" and "slow" sides of a network using a SYN packet is described. During a transport layer connection establishment between a client 102 and a server 106, the appliance 200 via the LAN/WAN detector 238 determines whether the SYN packet is tagged with an acknowledgement (ACK). If it is tagged, the appliance 200 identifies or configures the port receiving the tagged SYN packet (SYN-ACK) as the "slow" side. In one embodiment, the appliance 200 optionally removes the ACK tag from the packet before copying the packet to the other port. If the LAN/WAN detector 238 determines that the packet is not tagged, the appliance 200 identifies or configure the port receiving the untagged packet as the "fast" side. The appliance 200 then tags the SYN packet with an ACK and copies the packet to the other port.

In another embodiment, the LAN/WAN detector 238 detects fast and slow sides of a network using a SYN-ACK packet. The appliance 200 via the LAN/WAN detector 238 determines whether the SYN-ACK packet is tagged with an acknowledgement (ACK). If it is tagged, the appliance 200 identifies or configures the port receiving the tagged SYN packet (SYN-ACK) as the "slow" side. In one embodiment, the appliance 200 optionally removes the ACK tag from the packet before copying the packet to the other port. If the LAN/WAN detector 238 determines that the packet is not tagged, the appliance 200 identifies or configures the port receiving the untagged packet as the "fast" side. The LAN/WAN detector 238 determines whether the SYN packet was tagged. If the SYN packet was not tagged, the appliance 200 copied the packet to the other port. If the SYN packet was tagged, the appliance tags the SYN-ACK packet before copying it to the other port.

The appliance 200, 200' may add, insert, modify, attach or otherwise provide any information or data in the TCP option header to provide any information, data or characteristics about the network connection, network traffic flow, or the configuration or operation of the appliance 200. In this manner, not only does an appliance 200 announce its presence to another appliance 200' or tag a higher or lower speed connection, the appliance 200 provides additional information and data via the TCP option headers about the appliance or the connection. The TCP option header information may be useful to or used by an appliance in controlling, managing, optimizing, acceleration or improving the network traffic flow traversing the appliance 200, or to otherwise configure itself or operation of a network port.

Although generally described in conjunction with detecting speeds of network connections or the presence of appliances, the LAN/WAN detector 238 can be used for applying any type of function, logic or operation of the appliance 200 to a port, connection or flow of network traffic. In particular, automated assignment of ports can occur whenever a device performs different functions on different ports, where the assignment of a port to a task can be made during the unit's operation, and/or the nature of the network segment on each port is discoverable by the appliance 200.

Flow Control

The flow controller 220 includes any logic, business rules, function or operations for optimizing, accelerating or otherwise improving the performance, operation or quality of service of transport layer communications of network packets or the delivery of packets at the transport layer. A flow controller, also sometimes referred to as a flow control module, regulates, manages and controls data transfer rates. In some embodiments, the flow controller 220 is deployed at or connected at a bandwidth bottleneck in the network 104. In one embodiment, the flow controller 220 effectively regulates, manages and controls bandwidth usage or utilization. In other embodiments, the flow control modules may also be deployed at points on the network of latency transitions (low latency to high latency) and on links with media losses (such as wireless or satellite links).

In some embodiments, a flow controller 220 may include a receiver-side flow control module for controlling the rate of receipt of network transmissions and a sender-side flow control module for the controlling the rate of transmissions of network packets. In other embodiments, a first flow controller 220 includes a receiver-side flow control module and a second flow controller 220' includes a sender-side flow control module. In some embodiments, a first flow controller 220 is deployed on a first appliance 200 and a second flow controller 220' is deployed on a second appliance 200'. As such, in some embodiments, a first appliance 200 controls the flow of data on the receiver side and a second appliance 200' controls the data flow from the sender side. In yet another embodiment, a single appliance 200 includes flow control for both the receiver-side and sender-side of network communications traversing the appliance 200.

In one embodiment, a flow control module 220 is configured to allow bandwidth at the bottleneck to be more fully utilized, and in some embodiments, not overutilized. In some embodiments, the flow control module 220 transparently buffers (or rebuffers data already buffered by, for example, the sender) network sessions that pass between nodes having associated flow control modules 220. When a session passes through two or more flow control modules 220, one or more of the flow control modules controls a rate of the session(s).

In one embodiment, the flow control module 200 is configured with predetermined data relating to bottleneck bandwidth. In another embodiment, the flow control module 220 may be configured to detect the bottleneck bandwidth or data associated therewith. A receiver-side flow control module 220 may control the data transmission rate. The receiver-side flow control module controls 220 the sender-side flow control module, e.g., 220, data transmission rate by forwarding transmission rate limits to the sender-side flow control module 220. In one embodiment, the receiver-side flow control module 220 piggybacks these transmission rate limits on acknowledgement (ACK) packets (or signals) sent to the sender, e.g., client 102, by the receiver, e.g., server 106. The receiver-side flow control module 220 does this in response to rate control requests that are sent by the sender side flow control module 220'. The requests from the sender-side flow control module 220' may be "piggybacked" on data packets sent by the sender 106.

In some embodiments, the flow controller 220 manipulates, adjusts, simulates, changes, improves or otherwise adapts the behavior of the transport layer protocol to provide improved performance or operations of delivery, data rates and/or bandwidth utilization of the transport layer. The flow controller 220 may implement a plurality of data flow control techniques at the transport layer, including but not limited to 1) pre-acknowledgements, 2) window virtualization, 3) recongestion techniques, 3) local retransmission techniques, 4) wavefront detection and disambiguation, 5) transport control protocol selective acknowledgements, 6) transaction boundary detection techniques and 7) repacketization.

Although a sender may be generally described herein as a client 102 and a receiver as a server 106, a sender may be any end point such as a server 106 or any computing device 100 on the network 104. Likewise, a receiver may be a client 102 or any other computing device on the network 104.

Pre-Acknowledgements

In brief overview of a pre-acknowledgement flow control technique, the flow controller 220, in some embodiments, handles the acknowledgements and retransmits for a sender, effectively terminating the sender's connection with the downstream portion of a network connection. In reference to FIG. 1B, one possible deployment of an appliance 200 into a network architecture to implement this feature is depicted. In this example environment, a sending computer or client 102 transmits data on network 104, for example, via a switch, which determines that the data is destined for VPN appliance 205. Because of the chosen network topology, all data destined for VPN appliance 205 traverses appliance 200, so the appliance 200 can apply any necessary algorithms to this data.

Continuing further with the example, the client 102 transmits a packet, which is received by the appliance 200. When the appliance 200 receives the packet, which is transmitted from the client 102 to a recipient via the VPN appliance 205, the appliance 200 retains a copy of the packet and forwards the packet downstream to the VPN appliance 205. The appliance 200 then generates an acknowledgement packet (ACK) and sends the ACK packet back to the client 102 or sending endpoint. This ACK, a pre-acknowledgment, causes the sender 102 to believe that the packet has been delivered successfully, freeing the sender's resources for subsequent processing. The appliance 200 retains the copy of the packet data in the event that a retransmission of the packet is required, so that the sender 102 does not have to handle retransmissions of the data. This early generation of acknowledgements may be called "preacking."

If a retransmission of the packet is required, the appliance 200 retransmits the packet to the sender. The appliance 200 may determine whether retransmission is required as a sender would in a traditional system, for example, determining that a packet is lost if an acknowledgement has not been received for the packet after a predetermined amount of time. To this end, the appliance 200 monitors acknowledgements generated by the receiving endpoint, e.g., server 106 (or any other downstream network entity) so that it can determine whether the packet has been successfully delivered or needs to be retransmitted. If the appliance 200 determines that the packet has been successfully delivered, the appliance 200 is free to discard the saved packet data. The appliance 200 may also inhibit forwarding acknowledgements for packets that have already been received by the sending endpoint.

In the embodiment described above, the appliance 200 via the flow controller 220 controls the sender 102 through the delivery of pre-acknowledgements, also referred to as "preacks", as though the appliance 200 was a receiving endpoint itself. Since the appliance 200 is not an endpoint and does not actually consume the data, the appliance 200 includes a mechanism for providing overflow control to the sending endpoint. Without overflow control, the appliance 200 could run out of memory because the appliance 200 stores packets that have been preacked to the sending endpoint but not yet acknowledged as received by the receiving endpoint. Therefore, in a situation in which the sender 102 transmits packets to the appliance 200 faster than the appliance 200 can forward the packets downstream, the memory available in the appliance 200 to store unacknowledged packet data can quickly fill. A mechanism for overflow control allows the appliance 200 to control transmission of the packets from the sender 102 to avoid this problem.

In one embodiment, the appliance 200 or flow controller 220 includes an inherent "self-clocking" overflow control mechanism. This self-clocking is due to the order in which the appliance 200 may be designed to transmit packets downstream and send ACKs to the sender 102 or 106. In some embodiments, the appliance 200 does not preack the packet until after it transmits the packet downstream. In this way, the sender 102 will receive the ACKs at the rate at which the appliance 200 is able to transmit packets rather than the rate at which the appliance 200 receives packets from the sender 100. This helps to regulate the transmission of packets from a sender 102.

Window Virtualization

Another overflow control mechanism that the appliance 200 may implement is to use the TCP window size parameter, which tells a sender how much buffer the receiver is permitting the sender to fill up. A nonzero window size (e.g., a size of at least one Maximum Segment Size (MSS)) in a preack permits the sending endpoint to continue to deliver data to the appliance, whereas a zero window size inhibits further data transmission. Accordingly, the appliance 200 may regulate the flow of packets from the sender, for example when the appliance's 200 buffer is becoming full, by appropriately setting the TCP window size in each preack.

Another technique to reduce this additional overhead is to apply hysteresis. When the appliance 200 delivers data to the slower side, the overflow control mechanism in the appliance 200 can require that a minimum amount of space be available before sending a nonzero window advertisement to the sender. In one embodiment, the appliance 200 waits until there is a minimum of a predetermined number of packets, such as four packets, of space available before sending a nonzero window packet, such as a packet indicating a window size of four packets. This may reduce the overhead by approximately a factor of four, since only two ACK packets are sent for each group of four data packets, instead of eight ACK packets for four data packets.

Another technique the appliance 200 or flow controller 220 may use for overflow control is the TCP delayed ACK mechanism, which skips ACKs to reduce network traffic. The TCP delayed ACKs automatically delay the sending of an ACK, either until two packets are received or until a fixed timeout has occurred. This mechanism alone can result in cutting the overhead in half; moreover, by increasing the numbers of packets above two, additional overhead reduction is realized. But merely delaying the ACK itself may be insufficient to control overflow, and the appliance 200 may also use the advertised window mechanism on the ACKs to control the sender. When doing this, the appliance 200 in one embodiment avoids triggering the timeout mechanism of the sender by delaying the ACK too long.

In one embodiment, the flow controller 220 does not preack the last packet of a group of packets. By not preacking the last packet, or at least one of the packets in the group, the appliance avoids a false acknowledgement for a group of packets. For example, if the appliance were to send a preack for a last packet and the packet were subsequently lost, the sender would have been tricked into thinking that the packet is delivered when it was not. Thinking that the packet had been delivered, the sender could discard that data. If the appliance also lost the packet, there would be no way to retransmit the packet to the recipient. By not preacking the last packet of a group of packets, the sender will not discard the packet until it has been delivered.

In another embodiment, the flow controller 220 may use a window virtualization technique to control the rate of flow or bandwidth utilization of a network connection. Though it may not immediately be apparent from examining conventional literature such as RFC 1323, there is effectively a send window for transport layer protocols such as TCP. The send window is similar to the receive window, in that it consumes buffer space (though on the sender). The sender's send window consists of all data sent by the application that has not been acknowledged by the receiver. This data must be retained in memory in case retransmission is required. Since memory is a shared resource, some TCP stack implementations limit the size of this data. When the send window is full, an attempt by an application program to send more data results in blocking the application program until space is available. Subsequent reception of acknowledgements will free send-window memory and unblock the application program. This window size is known as the socket buffer size in some TCP implementations.

In one embodiment, the flow control module 220 is configured to provide access to increased window (or buffer) sizes. This configuration may also be referenced to as window virtualization. In an embodiment including TCP as the transport layer protocol, the TCP header may include a bit string corresponding to a window scale. In one embodiment, "window" may be referenced in a context of send, receive, or both.

One embodiment of window virtualization is to insert a preacking appliance 200 into a TCP session. In reference to any of the environments of FIG. 1A or 1B, initiation of a data communication session between a source node, e.g., client 102 (for ease of discussion, now referenced as source node 102), and a destination node, e.g., server 106 (for ease of discussion, now referenced as destination node 106) is established. For TCP communications, the source node 102 initially transmits a synchronization signal ("SYN") through its local area network 104 to first flow control module 220. The first flow control module 220 inserts a configuration identifier into the TCP header options area. The configuration identifier identifies this point in the data path as a flow control module.

The appliances 200 via a flow control module 220 provide window (or buffer) to allow increasing data buffering capabilities within a session despite having end nodes with small buffer sizes, e.g., typically 16 k bytes. However, RFC 1323 requires window scaling for any buffer sizes greater than 64 k bytes, which must be set at the time of session initialization (SYN, SYN-ACK signals). Moreover, the window scaling corresponds to the lowest common denominator in the data path, often an end node with small buffer size. This window scale often is a scale of 0 or 1, which corresponds to a buffer size of up to 64 k or 128 k bytes. Note that because the window size is defined as the window field in each packet shifted over by the window scale, the window scale establishes an upper limit for the buffer, but does not guarantee the buffer is actually that large. Each packet indicates the current available buffer space at the receiver in the window field.

In one embodiment of scaling using the window virtualization technique, during connection establishment (i.e., initialization of a session) when the first flow control module 220 receives from the source node 102 the SYN signal (or packet), the flow control module 220 stores the windows scale of the source node 102 (which is the previous node) or stores a 0 for window scale if the scale of the previous node is missing. The first flow control module 220 also modifies the scale, e.g., increases the scale to 4 from 0 or 1, in the SYN-FCM signal. When the second flow control module 220 receives the SYN signal, it stores the increased scale from the first flow control signal and resets the scale in the SYN signal back to the source node 103 scale value for transmission to the destination node 106. When the second flow controller 220 receives the SYN-ACK signal from the destination node 106, it stores the scale from the destination node 106 scale, e.g., 0 or 1, and modifies it to an increased scale that is sent with the SYN-ACK-FCM signal. The first flow control node 220 receives and notes the received window scale and revises the windows scale sent back to the source node 102 back down to the original scale, e.g., 0 or 1. Based on the above window shift conversation during connection establishment, the window field in every subsequent packet, e.g., TCP packet, of the session must be shifted according to the window shift conversion.

The window scale, as described above, expresses buffer sizes of over 64 k and may not be required for window virtualization. Thus, shifts for window scale may be used to express increased buffer capacity in each flow control module 220. This increase in buffer capacity in may be referenced as window (or buffer) virtualization. The increase in buffer size allows greater packet throughput from and to the respective end nodes 102 and 106. Note that buffer sizes in TCP are typically expressed in terms of bytes, but for ease of discussion "packets" may be used in the description herein as it relates to virtualization.

By way of example, a window (or buffer) virtualization performed by the flow controller 220 is described. In this example, the source node 102 and the destination node 106 are configured similar to conventional end nodes having a limited buffer capacity of 16 k bytes, which equals approximately 10 packets of data. Typically, an end node 102, 106 must wait until the packet is transmitted and confirmation is received before a next group of packets can be transmitted. In one embodiment, using increased buffer capacity in the flow control modules 220, when the source node 103 transmits its data packets, the first flow control module 220 receives the packets, stores it in its larger capacity buffer, e.g., 512 packet capacity, and immediately sends back an acknowledgement signal indicating receipt of the packets ("REC-ACK") back to the source node 102. The source node 102 can then "flush" its current buffer, load the buffer with 10 new data packets, and transmit those onto the first flow control module 220. Again, the first flow control module 220 transmits a REC-ACK signal back to the source node 102 and the source node 102 flushes its buffer and loads it with 10 more new packets for transmission.

As the first flow control module 220 receives the data packets from the source nodes, it loads up its buffer accordingly. When it is ready the first flow control module 220 can begin transmitting the data packets to the second flow control module 230, which also has an increased buffer size, for example, to receive 512 packets. The second flow control module 220' receives the data packets and begins to transmit 10 packets at a time to the destination node 106. Each REC-ACK received at the second flow control node 220 from the destination node 106 results in 10 more packets being transmitted to the destination node 106 until all the data packets are transferred. Hence, the present invention is able to increase data transmission throughput between the source node (sender) 102 and the destination node (receiver) 106 by taking advantage of the larger buffer in the flow control modules 220, 220' between the devices.

It is noted that by "preacking" the transmission of data as described previously, a sender (or source node 102) is allowed to transmit more data than is possible without the preacks, thus affecting a larger window size. For example, in one embodiment this technique is effective when the flow control module 220, 220' is located "near" a node (e.g., source node 102 or destination node 106) that lacks large windows.

Recongestion

Another technique or algorithm of the flow controller 220 is referred to as recongestion. The standard TCP congestion avoidance algorithms are known to perform poorly in the face of certain network conditions, including: large RTTs (round trip times), high packet loss rates, and others. When the appliance 200 detects a congestion condition such as long round trip times or high packet loss, the appliance 200 intervenes, substituting an alternate congestion avoidance algorithm that better suits the particular network condition. In one embodiment, the recongestion algorithm uses preacks to effectively terminate the connection between the sender and the receiver. The appliance 200 then resends the packets from itself to the receiver, using a different congestion avoidance algorithm. Recongestion algorithms may be dependent on the characteristics of the TCP connection. The appliance 200 monitors each TCP connection, characterizing it with respect to the different dimensions, selecting a recongestion algorithm that is appropriate for the current characterization.

In one embodiment, upon detecting a TCP connection that is limited by round trip times (RTT), a recongestion algorithm is applied which behaves as multiple TCP connections. Each TCP connection operates within its own performance limit but the aggregate bandwidth achieves a higher performance level. One parameter in this mechanism is the number of parallel connections that are applied (N). Too large a value of N and the connection bundle achieves more than its fair share of bandwidth. Too small a value of N and the connection bundle achieves less than its fair share of bandwidth. One method of establishing "N" relies on the appliance 200 monitoring the packet loss rate, RTT, and packet size of the actual connection. These numbers are plugged into a TCP response curve formula to provide an upper limit on the performance of a single TCP connection in the present configuration. If each connection within the connection bundle is achieving substantially the same performance as that computed to be the upper limit, then additional parallel connections are applied. If the current bundle is achieving less performance than the upper limit, the number of parallel connections is reduced. In this manner, the overall fairness of the system is maintained since individual connection bundles contain no more parallelism than is required to eliminate the restrictions imposed by the protocol itself. Furthermore, each individual connection retains TCP compliance.

Another method of establishing "N" is to utilize a parallel flow control algorithm such as the TCP "Vegas" algorithm or the TCP "Stabilized Vegas" algorithm. In this method, the network information associated with the connections in the connection bundle (e.g., RTT, loss rate, average packet size, etc.) is aggregated and applied to the alternate flow control algorithm. The results of this algorithm are in turn distributed among the connections of the bundle controlling their number (i.e., N). Optionally, each connection within the bundle continues using the standard TCP congestion avoidance algorithm.

In another embodiment, the individual connections within a parallel bundle are virtualized, i.e., actual individual TCP connections are not established. Instead the congestion avoidance algorithm is modified to behave as though there were N parallel connections. This method has the advantage of appearing to transiting network nodes as a single connection. Thus the QOS, security and other monitoring methods of these nodes are unaffected by the recongestion algorithm. In yet another embodiment, the individual connections within a parallel bundle are real, i.e., a separate. TCP connection is established for each of the parallel connections within a bundle. The congestion avoidance algorithm for each TCP connection need not be modified.

Retransmission

In some embodiments, the flow controller 220 may apply a local retransmission technique. One reason for implementing preacks is to prepare to transit to a high-loss link (e.g., wireless). In these embodiments, the preacking appliance 200 or flow control module 220 is located most beneficially "before" the wireless link. This allows retransmissions to be performed closer to the high loss link, removing the retransmission burden from the remainder of the network. The appliance 200 may provide local retransmission, in which case, packets dropped due to failures of the link are retransmitted directly by the appliance 200. This is advantageous because it eliminates the retransmission burden upon an end node, such as server 106, and infrastructure of any of the networks 104. With appliance 200 providing local retransmissions, the dropped packet can be retransmitted across the high loss link without necessitating a retransmit by an end node and a corresponding decrease in the rate of data transmission from the end node.

Another reason for implementing preacks is to avoid a receive time out (RTO) penalty. In standard TCP there are many situations that result in an RTO, even though a large percentage of the packets in flight were successfully received. With standard TCP algorithms, dropping more than one packet within an RTT window would likely result in a timeout. Additionally, most TCP connections experience a timeout if a retransmitted packet is dropped. In a network with a high bandwidth delay product, even a relatively small packet loss rate will cause frequent Retransmission timeouts (RTOs). In one embodiment, the appliance 200 uses a retransmit and timeout algorithm is avoid premature RTOs. The appliance 200 or flow controller 220 maintains a count of retransmissions is maintained on a per-packet basis. Each time that a packet is retransmitted, the count is incremented by one and the appliance 200 continues to transmit packets. In some embodiments, only if a packet has been retransmitted a predetermined number of times is an RTO declared.

Wavefront Detection and Disambiguation

In some embodiments, the appliance 200 or flow controller 220 uses wavefront detection and disambiguation techniques in managing and controlling flow of network traffic. In this technique, the flow controller 220 uses transmit identifiers or numbers to determine whether particular data packets need to be retransmitted. By way of example, a sender transmits data packets over a network, where each instance of a transmitted data packet is associated with a transmit number. It can be appreciated that the transmit number for a packet is not the same as the packet's sequence number, since a sequence number references the data in the packet while the transmit number references an instance of a transmission of that data. The transmit number can be any information usable for this purpose, including a timestamp associated with a packet or simply an increasing number (similar to a sequence number or a packet number). Because a data segment may be retransmitted, different transmit numbers may be associated with a particular sequence number.

As the sender transmits data packets, the sender maintains a data structure of acknowledged instances of data packet transmissions. Each instance of a data packet transmission is referenced by its sequence number and transmit number. By maintaining a transmit number for each packet, the sender retains the ordering of the transmission of data packets. When the sender receives an ACK or a SACK, the sender determines the highest transmit number associated with packets that the receiver indicated has arrived (in the received acknowledgement). Any outstanding unacknowledged packets with lower transmit numbers are presumed lost.

In some embodiments, the sender is presented with an ambiguous situation when the arriving packet has been retransmitted: a standard ACK/SACK does not contain enough information to allow the sender to determine which transmission of the arriving packet has triggered the acknowledgement. After receiving an ambiguous acknowledgement, therefore, the sender disambiguates the acknowledgement to associate it with a transmit number. In various embodiments, one or a combination of several techniques may be used to resolve this ambiguity.

In one embodiment, the sender includes an identifier with a transmitted data packet, and the receiver returns that identifier or a function thereof with the acknowledgement. The identifier may be a timestamp (e.g., a TCP timestamp as described in RFC 1323), a sequential number, or any other information that can be used to resolve between two or more instances of a packet's transmission. In an embodiment in which the TCP timestamp option is used to disambiguate the acknowledgement, each packet is tagged with up to 32-bits of unique information. Upon receipt of the data packet, the receiver echoes this unique information back to the sender with the acknowledgement. The sender ensures that the originally sent packet and its retransmitted version or versions contain different values for the timestamp option, allowing it to unambiguously eliminate the ACK ambiguity. The sender may maintain this unique information, for example, in the data structure in which it stores the status of sent data packets. This technique is advantageous because it complies with industry standards and is thus likely to encounter little or no interoperability issues. However, this technique may require ten bytes of TCP header space in some implementations, reducing the effective throughput rate on the network and reducing space available for other TCP options.

In another embodiment, another field in the packet, such as the IP ID field, is used to disambiguate in a way similar to the TCP timestamp option described above. The sender arranges for the ID field values of the original and the retransmitted version or versions of the packet to have different ID fields in the IP header. Upon reception of the data packet at the receiver, or a proxy device thereof, the receiver sets the ID field of the ACK packet to a function of the ID field of the packet that triggers the ACK. This method is advantageous, as it requires no additional data to be sent, preserving the efficiency of the network and TCP header space. The function chosen should provide a high degree of likelihood of providing disambiguation. In a preferred embodiment, the sender selects IP ID values with the most significant bit set to 0. When the receiver responds, the IP ID value is set to the same IP ID value with the most significant bit set to a one.

In another embodiment, the transmit numbers associated with non-ambiguous acknowledgements are used to disambiguate an ambiguous acknowledgement. This technique is based on the principle that acknowledgements for two packets will tend to be received closer in time as the packets are transmitted closer in time. Packets that are not retransmitted will not result in ambiguity, as the acknowledgements received for such packets can be readily associated with a transmit number. Therefore, these known transmit numbers are compared to the possible transmit numbers for an ambiguous acknowledgement received near in time to the known acknowledgement. The sender compares the transmit numbers of the ambiguous acknowledgement against the last known received transmit number, selecting the one closest to the known received transmit number. For example, if an acknowledgement for data packet 1 is received and the last received acknowledgement was for data packet 5, the sender resolves the ambiguity by assuming that the third instance of data packet 1 caused the acknowledgement.

Selective Acknowledgements

Another technique of the appliance 200 or flow controller 220 is to implement an embodiment of transport control protocol selective acknowledgements, or TCP SACK, to determine what packets have or have not been received. This technique allows the sender to determine unambiguously a list of packets that have been received by the receiver as well as an accurate list of packets not received. This functionality may be implemented by modifying the sender and/or receiver, or by inserting sender- and receiver-side flow control modules 220 in the network path between the sender and receiver. In reference to FIG. 1A or FIG. 1B, a sender, e.g., client 102, is configured to transmit data packets to the receiver, e.g., server 106, over the network 104. In response, the receiver returns a TCP Selective Acknowledgment option, referred to as SACK packet to the sender. In one embodiment, the communication is bi-directional, although only one direction of communication is discussed here for simplicity. The receiver maintains a list, or other suitable data structure, that contains a group of ranges of sequence numbers for data packets that the receiver has actually received. In some embodiments, the list is sorted by sequence number in an ascending or descending order. The receiver also maintains a left-off pointer, which comprises a reference into the list and indicates the left-off point from the previously generated SACK packet.

Upon reception of a data packet, the receiver generates and transmits a SACK packet back to the sender. In some embodiments, the SACK packet includes a number of fields, each of which can hold a range of sequence numbers to indicate a set of received data packets. The receiver fills this first field of the SACK packet with a range of sequence numbers that includes the landing packet that triggered the SACK packet. The remaining available SACK fields are filled with ranges of sequence numbers from the list of received packets. As there are more ranges in the list than can be loaded into the SACK packet, the receiver uses the left-off pointer to determine which ranges are loaded into the SACK packet. The receiver inserts the SACK ranges consecutively from the sorted list, starting from the range referenced by the pointer and continuing down the list until the available SACK range space in the TCP header of the SACK packet is consumed. The receiver wraps around to the start of the list if it reaches the end. In some embodiments, two or three additional SACK ranges can be added to the SACK range information.

Once the receiver generates the SACK packet, the receiver sends the acknowledgement back to the sender. The receiver then advances the left-off pointer by one or more SACK range entries in the list. If the receiver inserts four SACK ranges, for example, the left-off pointer may be advanced two SACK ranges in the list. When the advanced left-off pointer reaches at the end of the list, the pointer is reset to the start of the list, effectively wrapping around the list of known received ranges. Wrapping around the list enables the system to perform well, even in the presence of large losses of SACK packets, since the SACK information that is not communicated due to a lost SACK packet will eventually be communicated once the list is wrapped around.

It can be appreciated, therefore, that a SACK packet may communicate several details about the condition of the receiver. First, the SACK packet indicates that, upon generation of the SACK packet, the receiver had just received a data packet that is within the first field of the SACK information.

Secondly, the second and subsequent fields of the SACK information indicate that the receiver has received the data packets within those ranges. The SACK information also implies that the receiver had not, at the time of the SACK packet's generation, received any of the data packets that fall between the second and subsequent fields of the SACK information. In essence, the ranges between the second and subsequent ranges in the SACK information are "holes" in the received data, the data therein known not to have been delivered. Using this method, therefore, when a SACK packet has sufficient space to include more than two SACK ranges, the receiver may indicate to the sender a range of data packets that have not yet been received by the receiver.

In another embodiment, the sender uses the SACK packet described above in combination with the retransmit technique described above to make assumptions about which data packets have been delivered to the receiver. For example, when the retransmit algorithm (using the transmit numbers) declares a packet lost, the sender considers the packet to be only conditionally lost, as it is possible that the SACK packet identifying the reception of this packet was lost rather than the data packet itself. The sender thus adds this packet to a list of potentially lost packets, called the presumed lost list. Each time a SACK packet arrives, the known missing ranges of data from the SACK packet are compared to the packets in the presumed lost list. Packets that contain data known to be missing are declared actually lost and are subsequently retransmitted. In this way, the two schemes are combined to give the sender better information about which packets have been lost and need to be retransmitted.

Transaction Boundary Detection

In some embodiments, the appliance 200 or flow controller 220 applies a technique referred to as transaction boundary detection. In one embodiment, the technique pertains to ping-pong behaved connections. At the TCP layer, ping-pong behavior is when one communicant—a sender—sends data and then waits for a response from the other communicant—the receiver. Examples of ping-pong behavior include remote procedure call, HTTP and others. The algorithms described above use retransmission timeout (RTO) to recover from the dropping of the last packet or packets associated with the transaction. Since the TCP RTO mechanism is extremely coarse in some embodiments, for example requiring a minimum one second value in all cases), poor application behavior may be seen in these situations.

In one embodiment, the sender of data or a flow control module 220 coupled to the sender detects a transaction boundary in the data being sent. Upon detecting a transaction boundary, the sender or a flow control module 220 sends additional packets, whose reception generates additional ACK or SACK responses from the receiver. Insertion of the additional packets is preferably limited to balance between improved application response time and network capacity utilization. The number of additional packets that is inserted may be selected according to the current loss rate associated with that connection, with more packets selected for connections having a higher loss rate.

One method of detecting a transaction boundary is time based. If the sender has been sending data and ceases, then after a period of time the sender or flow control module 200 declares a transaction boundary. This may be combined with other techniques. For example, the setting of the PSH (TCP Push) bit by the sender in the TCP header may indicate a transaction boundary. Accordingly, combining the time-based approach with these additional heuristics can provide for more accurate detection of a transaction boundary. In another technique, if the sender or flow control module 220 understands the application protocol, it can parse the protocol data stream and directly determine transaction boundaries. In some embodiment, this last behavior can be used independent of any time-based mechanism.

Responsive to detecting a transaction boundary, the sender or flow control module 220 transmits additional data packets to the receiver to cause acknowledgements therefrom. The additional data packets should therefore be such that the receiver will at least generate an ACK or SACK in response to receiving the data packet. In one embodiment, the last packet or packets of the transaction are simply retransmitted. This has the added benefit of retransmitting needed data if the last packet or packets had been dropped, as compared to merely sending dummy data packets. In another embodiment, fractions of the last packet or packets are sent, allowing the sender to disambiguate the arrival of these packets from their original packets. This allows the receiver to avoid falsely confusing any reordering adaptation algorithms. In another embodiment, any of a number of well-known forward error correction techniques can be used to generate additional data for the inserted packets, allowing for the reconstruction of dropped or otherwise missing data at the receiver.

In some embodiments, the boundary detection technique described herein helps to avoid a timeout when the acknowledgements for the last data packets in a transaction are dropped. When the sender or flow control module 220 receives the acknowledgements for these additional data packets, the sender can determine from these additional acknowledgements whether the last data packets have been received or need to be retransmitted, thus avoiding a timeout. In one embodiment, if the last packets have been received but their acknowledgements were dropped, a flow control module 220 generates an acknowledgement for the data packets and sends the acknowledgement to the sender, thus communicating to the sender that the data packets have been delivered. In another embodiment, if the last packets have not been received, a flow control module 200 sends a packet to the sender to cause the sender to retransmit the dropped data packets.

Repacketization

In yet another embodiment, the appliance 200 or flow controller 220 applies a repacketization technique for improving the flow of transport layer network traffic. In some embodiments, performance of TCP is proportional to packet size. Thus increasing packet sizes improves performance unless it causes substantially increased packet loss rates or other nonlinear effects, like IP fragmentation. In general, wired media (such as copper or fibre optics) have extremely low bit-error rates, low enough that these can be ignored. For these media, it is advantageous for the packet size to be the maximum possible before fragmentation occurs (the maximum packet size is limited by the protocols of the underlying transmission media). Whereas for transmission media with higher loss rates (e.g., wireless technologies such as WiFi, etc., or high-loss environments such as power-line networking, etc.), increasing the packet size may lead to lower transmission rates, as media-induced errors cause an entire packet to be dropped (i.e., media-induced errors beyond the capability of the standard error correcting code for that media), increasing the packet loss rate. A sufficiently large increase in the packet loss rate will actually negate any performance benefit of increasing packet size. In some cases, it may be difficult for a TCP endpoint to choose an optimal packet size. For example, the optimal packet size may vary across the transmission path, depending on the nature of each link.

By inserting an appliance 200 or flow control module 220 into the transmission path, the flow controller 220 monitors characteristics of the link and repacketizes according to determined link characteristics. In one embodiment, an appliance 200 or flow controller 220 repacketizes packets with sequential data into a smaller number of larger packets. In another embodiment, an appliance 200 or flow controller 220 repacketizes packets by breaking part a sequence of large packets into a larger number of smaller packets. In other embodiments, an appliance 200 or flow controller 220 monitors the link characteristics and adjusts the packet sizes through recombination to improve throughput.

QoS

Still referring to FIG. 2A, the flow controller 220, in some embodiments, may include a QoS Engine 236, also referred to as a QoS controller. In another embodiment, the appliance 200 and/or network optimization engine 250 includes the QoS engine 236, for example, separately but in communication with the flow controller 220. The QoS Engine 236 includes any logic, business rules, function or operations for performing one or more Quality of Service (QoS) techniques improving the performance, operation or quality of service of any of the network connections. In some embodiments, the QoS engine 236 includes network traffic control and management mechanisms that provide different priorities to different users, applications, data flows or connections. In other embodiments, the QoS engine 236 controls, maintains, or assures a certain level of performance to a user, application, data flow or connection. In one embodiment, the QoS engine 236 controls, maintains or assures a certain portion of bandwidth or network capacity for a user, application, data flow or connection. In some embodiments, the QoS engine 236 monitors the achieved level of performance or the quality of service corresponding to a user, application, data flow or connection, for example, the data rate and delay. In response to monitoring, the QoS engine 236 dynamically controls or adjusts scheduling priorities of network packets to achieve the desired level of performance or quality of service.

In some embodiments, the QoS engine 236 prioritizes, schedules and transmits network packets according to one or more classes or levels of services. In some embodiments, the class or level service may include: 1) best efforts, 2) controlled load, 3) guaranteed or 4) qualitative. For a best efforts class of service, the appliance 200 makes reasonable effort to deliver packets (a standard service level). For a controlled load class of service, the appliance 200 or QoS engine 236 approximates the standard packet error loss of the transmission medium or approximates the behavior of best-effort service in lightly loaded network conditions. For a guaranteed class of service, the appliance 200 or QoS engine 236 guarantees the ability to transmit data at a determined rate for the duration of the connection. For a qualitative class of service, the appliance 200 or QoS engine 236 the qualitative service class is used for applications, users, data flows or connection that require or desire prioritized traffic but cannot quantify resource needs or level of service. In these cases, the appliance 200 or QoS engine 236 determines the class of service or prioritization based on any logic or configuration of the QoS engine 236 or based on business rules or policies. For example, in one embodiment, the QoS engine 236 prioritizes, schedules and transmits network packets according to one or more policies as specified by the policy engine 295, 295'.

Protocol Acceleration

The protocol accelerator 234 includes any logic, business rules, function or operations for optimizing, accelerating, or otherwise improving the performance, operation or quality of service of one or more protocols. In one embodiment, the protocol accelerator 234 accelerates any application layer protocol or protocols at layers 5-7 of the network stack. In other embodiments, the protocol accelerator 234 accelerates a transport layer or a layer 4 protocol. In one embodiment, the protocol accelerator 234 accelerates layer 2 or layer 3 protocols. In some embodiments, the protocol accelerator 234 is configured, constructed or designed to optimize or accelerate each of one or more protocols according to the type of data, characteristics and/or behavior of the protocol. In another embodiment, the protocol accelerator 234 is configured, constructed or designed to improve a user experience, response times, network or computer load, and/or network or bandwidth utilization with respect to a protocol.

In one embodiment, the protocol accelerator 234 is configured, constructed or designed to minimize the effect of WAN latency on file system access. In some embodiments, the protocol accelerator 234 optimizes or accelerates the use of the CIFS (Common Internet File System) protocol to improve file system access times or access times to data and files. In some embodiments, the protocol accelerator 234 optimizes or accelerates the use of the NFS (Network File System) protocol. In another embodiment, the protocol accelerator 234 optimizes or accelerates the use of the File Transfer protocol (FTP).

In one embodiment, the protocol accelerator 234 is configured, constructed or designed to optimize or accelerate a protocol carrying as a payload or using any type and form of markup language. In other embodiments, the protocol accelerator 234 is configured, constructed or designed to optimize or accelerate a HyperText Transfer Protocol (HTTP). In another embodiment, the protocol accelerator 234 is configured, constructed or designed to optimize or accelerate a protocol carrying as a payload or otherwise using XML (eXtensible Markup Language).

Transparency and Multiple Deployment Configurations

In some embodiments, the appliance 200 and/or network optimization engine 250 is transparent to any data flowing across a network connection or link, such as a WAN link. In one embodiment, the appliance 200 and/or network optimization engine 250 operates in such a manner that the data flow across the WAN is recognizable by any network monitoring, QOS management or network analysis tools. In some embodiments, the appliance 200 and/or network optimization engine 250 does not create any tunnels or streams for transmitting data that may hide, obscure or otherwise make the network traffic not transparent. In other embodiments, the appliance 200 operates transparently in that the appliance does not change any of the source and/or destination address information or port information of a network packet, such as internet protocol addresses or port numbers. In other embodiments, the appliance 200 and/or network optimization engine 250 is considered to operate or behave transparently to the network, an application, client, server or other appliances or computing device in the network infrastructure. That is, in some embodiments, the appliance is transparent in that network related configuration of any device or appliance on the network does not need to be modified to support the appliance 200.

The appliance 200 may be deployed in any of the following deployment configurations: 1) in-line of traffic, 2) in proxy mode, or 3) in a virtual in-line mode. In some embodiments, the appliance 200 may be deployed inline to one or more of the following: a router, a client, a server or another network device or appliance. In other embodiments, the appliance 200 may be deployed in parallel to one or more of the following:

a router, a client, a server or another network device or appliance. In parallel deployments, a client, server, router or other network appliance may be configured to forward, transfer or transit networks to or via the appliance 200.

In the embodiment of in-line, the appliance 200 is deployed inline with a WAN link of a router. In this way, all traffic from the WAN passes through the appliance before arriving at a destination of a LAN.

In the embodiment of a proxy mode, the appliance 200 is deployed as a proxy device between a client and a server. In some embodiments, the appliance 200 allows clients to make indirect connections to a resource on a network. For example, a client connects to a resource via the appliance 200, and the appliance provides the resource either by connecting to the resource, a different resource, or by serving the resource from a cache. In some cases, the appliance may alter the client's request or the server's response for various purposes, such as for any of the optimization techniques discussed herein. In one embodiment, the client 102 send requests addressed to the proxy. In one case, the proxy responds to the client in place of or acting as a server 106. In other embodiments, the appliance 200 behaves as a transparent proxy, by intercepting and forwarding requests and responses transparently to a client and/or server. Without client-side configuration, the appliance 200 may redirect client requests to different servers or networks. In some embodiments, the appliance 200 may perform any type and form of network address translation, referred to as NAT, on any network traffic traversing the appliance.

In some embodiments, the appliance 200 is deployed in a virtual in-line mode configuration. In this embodiment, a router or a network device with routing or switching functionality is configured to forward, reroute or otherwise provide network packets destined to a network to the appliance 200. The appliance 200 then performs any desired processing on the network packets, such as any of the WAN optimization techniques discussed herein. Upon completion of processing, the appliance 200 forwards the processed network packet to the router to transmit to the destination on the network. In this way, the appliance 200 can be coupled to the router in parallel but still operate as it if the appliance 200 were inline. This deployment mode also provides transparency in that the source and destination addresses and port information are preserved as the packet is processed and transmitted via the appliance through the network.

End Node Deployment

Although the network optimization engine 250 is generally described above in conjunction with an appliance 200, the network optimization engine 250, or any portion thereof, may be deployed, distributed or otherwise operated on any end node, such as a client 102 and/or server 106. As such, a client or server may provide any of the systems and methods of the network optimization engine 250 described herein in conjunction with one or more appliances 200 or without an appliance 200.

Figure 2B:
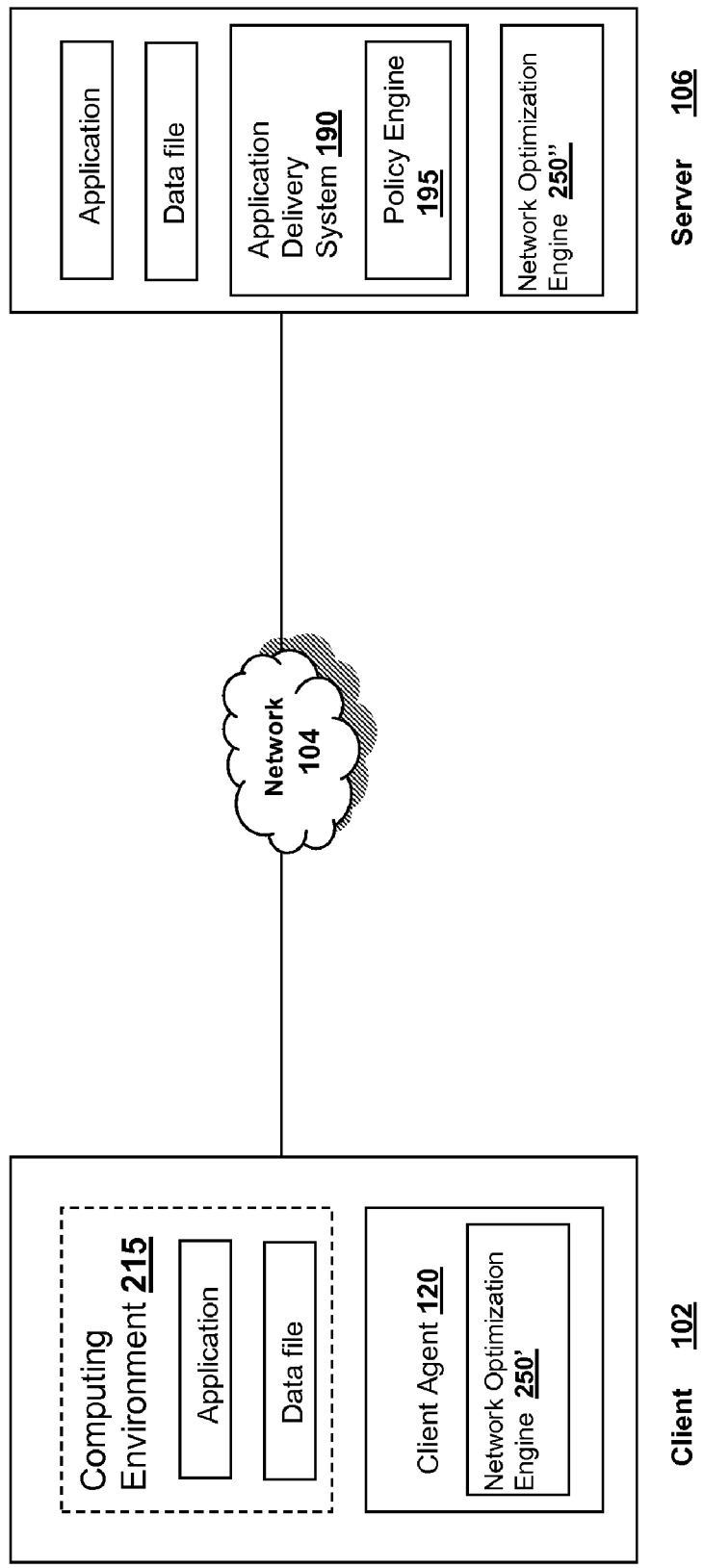
FIG. 2B is a block diagram of another embodiment of a client and/or server deploying the network optimization features of the appliance.

Referring now to FIG. 2B, an example embodiment of the network optimization engine 250 deployed on one or more end nodes is depicted. In brief overview, the client 102 may include a first network optimization engine 250' and the server 106 may include a second network optimization engine 250". The client 102 and server 106 may establish a transport layer connection and exchange communications with or without traversing an appliance 200.

In one embodiment, the network optimization engine 250' of the client 102 performs the techniques described herein to optimize, accelerate or otherwise improve the performance, operation or quality of service of network traffic communicated with the server 106. In another embodiment, the network optimization engine 250" of the server 106 performs the techniques described herein to optimize, accelerate or otherwise improve the performance, operation or quality of service of network traffic communicated with the client 102. In some embodiments, the network optimization engine 250' of the client 102 and the network optimization engine 250" of the server 106 perform the techniques described herein to optimize, accelerate or otherwise improve the performance, operation or quality of service of network traffic communicated between the client 102 and the server 106. In yet another embodiment, the network optimization engine 250' of the client 102 performs the techniques described herein in conjunction with an appliance 200 to optimize, accelerate or otherwise improve the performance, operation or quality of service of network traffic communicated with the client 102. In still another embodiment, the network optimization engine 250" of the server 106 performs the techniques described herein in conjunction with an appliance 200 to optimize, accelerate or otherwise improve the performance, operation or quality of service of network traffic communicated with the server 106.

C. Client Agent

As illustrated in FIGS. 2A and 2B, a client deployed in the system or with an appliance 200 or 205 may include a client agent 120. In one embodiment, the client agent 120 is used to facilitate communications with one or more appliances 200 or 205. In some embodiments, any of the systems and methods of the appliance 200 or 205 described herein may be deployed, implemented or embodied in a client, such as via a client agent 120. In other embodiments, the client agent 120 may include applications, programs, or agents providing additional functionality such as end point detection and authorization, virtual private network connectivity, and application streaming. Prior to discussing other embodiments of systems and methods of the appliance 200, embodiments of the client agent 120 will be described.

Figure 3:
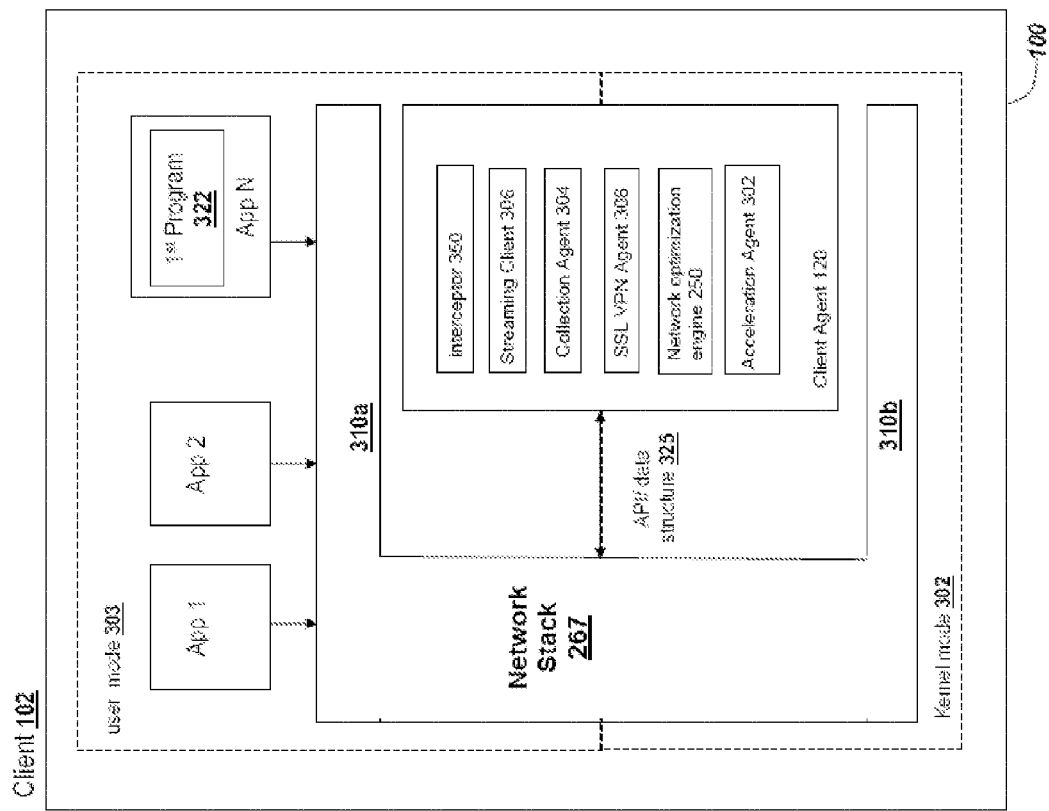
FIG. 3 is a block diagram of an embodiment of a client for communicating with a server using the network optimization feature.

Referring now to FIG. 3, an embodiment of a client agent 120 is depicted. The client 102 has a client agent 120 for establishing, exchanging, managing or controlling communications with the appliance 200, appliance 205 and/or server 106 via a network 104. In some embodiments, the client agent 120, which may also be referred to as a WAN client, accelerates WAN network communications and/or is used to communicate via appliance 200 on a network. In brief overview, the client 102 operates on computing device 100 having an operating system with a kernel mode 302 and a user mode 303, and a network stack 267 with one or more layers 310a-310b. The client 102 may have installed and/or execute one or more applications. In some embodiments, one or more applications may communicate via the network stack 267 to a network 104. One of the applications, such as a web browser, may also include a first program 322. For example, the first program 322 may be used in some embodiments to install and/or execute the client agent 120, or any portion thereof. The client agent 120 includes an interception mechanism, or interceptor 350, for intercepting network communications from the network stack 267 from the one or more applications.

As with the appliance 200, the client has a network stack 267 including any type and form of software, hardware, or any combinations thereof, for providing connectivity to and communications with a network 104. The network stack 267 of the client 102 includes any of the network stack embodiments described above in conjunction with the appliance 200.

In some embodiments, the client agent 120, or any portion thereof, is designed and constructed to operate with or work in conjunction with the network stack 267 installed or otherwise provided by the operating system of the client 102.

In further details, the network stack 267 of the client 102 or appliance 200 (or 205) may include any type and form of interfaces for receiving, obtaining, providing or otherwise accessing any information and data related to network communications of the client 102. In one embodiment, an interface to the network stack 267 includes an application programming interface (API). The interface may also have any function call, hooking or filtering mechanism, event or call back mechanism, or any type of interfacing technique. The network stack 267 via the interface may receive or provide any type and form of data structure, such as an object, related to functionality or operation of the network stack 267. For example, the data structure may include information and data related to a network packet or one or more network packets. In some embodiments, the data structure includes, references or identifies a portion of the network packet processed at a protocol layer of the network stack 267, such as a network packet of the transport layer. In some embodiments, the data structure 325 is a kernel-level data structure, while in other embodiments, the data structure 325 is a user-mode data structure. A kernel-level data structure may have a data structure obtained or related to a portion of the network stack 267 operating in kernel-mode 302, or a network driver or other software running in kernel-mode 302, or any data structure obtained or received by a service, process, task, thread or other executable instructions running or operating in kernel-mode of the operating system.

Additionally, some portions of the network stack 267 may execute or operate in kernel-mode 302, for example, the data link or network layer, while other portions execute or operate in user-mode 303, such as an application layer of the network stack 267. For example, a first portion 310a of the network stack may provide user-mode access to the network stack 267 to an application while a second portion 310a of the network stack 267 provides access to a network. In some embodiments, a first portion 310a of the network stack has one or more upper layers of the network stack 267, such as any of layers 5-7. In other embodiments, a second portion 310b of the network stack 267 includes one or more lower layers, such as any of layers 1-4. Each of the first portion 310a and second portion 310b of the network stack 267 may include any portion of the network stack 267, at any one or more network layers, in user-mode 303, kernel-mode, 302, or combinations thereof, or at any portion of a network layer or interface point to a network layer or any portion of or interface point to the user-mode 302 and kernel-mode 203.

The interceptor 350 may include software, hardware, or any combination of software and hardware. In one embodiment, the interceptor 350 intercepts or otherwise receives a network communication at any point in the network stack 267, and redirects or transmits the network communication to a destination desired, managed or controlled by the interceptor 350 or client agent 120. For example, the interceptor 350 may intercept a network communication of a network stack 267 of a first network and transmit the network communication to the appliance 200 for transmission on a second network 104. In some embodiments, the interceptor 350 includes or is a driver, such as a network driver constructed and designed to interface and work with the network stack 267. In some embodiments, the client agent 120 and/or interceptor 350 operates at one or more layers of the network stack 267, such as at the transport layer. In one embodiment, the interceptor 350 includes a filter driver, hooking mechanism, or any form and type of suitable network driver interface that interfaces to the transport layer of the network stack, such as via the transport driver interface (TDI). In some embodiments, the interceptor 350 interfaces to a first protocol layer, such as the transport layer and another protocol layer, such as any layer above the transport protocol layer, for example, an application protocol layer. In one embodiment, the interceptor 350 includes a driver complying with the Network Driver Interface Specification (NDIS), or a NDIS driver. In another embodiment, the interceptor 350 may be a min-filter or a mini-port driver. In one embodiment, the interceptor 350, or portion thereof, operates in kernel-mode 202. In another embodiment, the interceptor 350, or portion thereof, operates in user-mode 203. In some embodiments, a portion of the interceptor 350 operates in kernel-mode 202 while another portion of the interceptor 350 operates in user-mode 203. In other embodiments, the client agent 120 operates in user-mode 203 but interfaces via the interceptor 350 to a kernel-mode driver, process, service, task or portion of the operating system, such as to obtain a kernel-level data structure 225. In further embodiments, the interceptor 350 is a user-mode application or program, such as application.

In one embodiment, the interceptor 350 intercepts or receives any transport layer connection requests. In these embodiments, the interceptor 350 executes transport layer application programming interface (API) calls to set the destination information, such as destination IP address and/or port to a desired location for the location. In this manner, the interceptor 350 intercepts and redirects the transport layer connection to an IP address and port controlled or managed by the interceptor 350 or client agent 120. In one embodiment, the interceptor 350 sets the destination information for the connection to a local IP address and port of the client 102 on which the client agent 120 is listening. For example, the client agent 120 may comprise a proxy service listening on a local IP address and port for redirected transport layer communications. In some embodiments, the client agent 120 then communicates the redirected transport layer communication to the appliance 200.

In some embodiments, the interceptor 350 intercepts a Domain Name Service (DNS) request. In one embodiment, the client agent 120 and/or interceptor 350 resolves the DNS request. In another embodiment, the interceptor transmits the intercepted DNS request to the appliance 200 for DNS resolution. In one embodiment, the appliance 200 resolves the DNS request and communicates the DNS response to the client agent 120. In some embodiments, the appliance 200 resolves the DNS request via another appliance 200' or a DNS server 106.

In yet another embodiment, the client agent 120 may include two agents 120 and 120'. In one embodiment, a first agent 120 may include an interceptor 350 operating at the network layer of the network stack 267. In some embodiments, the first agent 120 intercepts network layer requests such as Internet Control Message Protocol (ICMP) requests (e.g., ping and traceroute). In other embodiments, the second agent 120' may operate at the transport layer and intercept transport layer communications. In some embodiments, the first agent 120 intercepts communications at one layer of the network stack 210 and interfaces with or communicates the intercepted communication to the second agent 120'.

The client agent 120 and/or interceptor 350 may operate at or interface with a protocol layer in a manner transparent to any other protocol layer of the network stack 267. For example, in one embodiment, the interceptor 350 operates or interfaces with the transport layer of the network stack 267 transparently to any protocol layer below the transport layer, such as the network layer, and any protocol layer above the transport layer, such as the session, presentation or application layer protocols. This allows the other protocol layers of the network stack 267 to operate as desired and without modification for using the interceptor 350. As such, the client agent 120 and/or interceptor 350 interfaces with or operates at the level of the transport layer to secure, optimize, accelerate, route or load-balance any communications provided via any protocol carried by the transport layer, such as any application layer protocol over TCP/IP.

Furthermore, the client agent 120 and/or interceptor 350 may operate at or interface with the network stack 267 in a manner transparent to any application, a user of the client 102, the client 102 and/or any other computing device 100, such as a server or appliance 200, 206, in communications with the client 102. The client agent 120, or any portion thereof, may be installed and/or executed on the client 102 in a manner without modification of an application. In one embodiment, the client agent 120, or any portion thereof, is installed and/or executed in a manner transparent to any network configuration of the client 102, appliance 200, 205 or server 106. In some embodiments, the client agent 120, or any portion thereof, is installed and/or executed with modification to any network configuration of the client 102, appliance 200, 205 or server 106. In one embodiment, the user of the client 102 or a computing device in communications with the client 102 are not aware of the existence, execution or operation of the client agent 12, or any portion thereof. As such, in some embodiments, the client agent 120 and/or interceptor 350 is installed, executed, and/or operated transparently to an application, user of the client 102, the client 102, another computing device, such as a server or appliance 200, 2005, or any of the protocol layers above and/or below the protocol layer interfaced to by the interceptor 350.

The client agent 120 includes a streaming client 306, a collection agent 304, SSL VPN agent 308, a network optimization engine 250, and/or acceleration program 302. In one embodiment, the client agent 120 is an Independent Computing Architecture (ICA) client, or any portion thereof, developed by Citrix Systems, Inc. of Fort Lauderdale, Fla., and is also referred to as an ICA client. In some embodiments, the client agent 120 has an application streaming client 306 for streaming an application from a server 106 to a client 102. In another embodiment, the client agent 120 includes a collection agent 304 for performing end-point detection/scanning and collecting end-point information for the appliance 200 and/or server 106. In some embodiments, the client agent 120 has one or more network accelerating or optimizing programs or agents, such as a network optimization engine 250 and an acceleration program 302. In one embodiment, the acceleration program 302 accelerates communications between client 102 and server 106 via appliance 205'. In some embodiments, the network optimization engine 250 provides WAN optimization techniques as discussed herein.

The streaming client 306 is an application, program, process, service, task or set of executable instructions for receiving and executing a streamed application from a server 106. A server 106 may stream one or more application data files to the streaming client 306 for playing, executing or otherwise causing to be executed the application on the client 102. In some embodiments, the server 106 transmits a set of compressed or packaged application data files to the streaming client 306. In some embodiments, the plurality of application files are compressed and stored on a file server within an archive file such as a CAB, ZIP, SIT, TAR, JAR or other archive. In one embodiment, the server 106 decompresses, unpackages or unarchives the application files and transmits the files to the client 102. In another embodiment, the client 102 decompresses, unpackages or unarchives the application files. The streaming client 306 dynamically installs the application, or portion thereof, and executes the application. In one embodiment, the streaming client 306 may be an executable program. In some embodiments, the streaming client 306 may be able to launch another executable program.

The collection agent 304 is an application, program, process, service, task or set of executable instructions for identifying, obtaining and/or collecting information about the client 102. In some embodiments, the appliance 200 transmits the collection agent 304 to the client 102 or client agent 120. The collection agent 304 may be configured according to one or more policies of the policy engine 236 of the appliance. In other embodiments, the collection agent 304 transmits collected information on the client 102 to the appliance 200. In one embodiment, the policy engine 236 of the appliance 200 uses the collected information to determine and provide access, authentication and authorization control of the client's connection to a network 104.

In one embodiment, the collection agent 304 is an endpoint detection and scanning program, which identifies and determines one or more attributes or characteristics of the client. For example, the collection agent 304 may identify and determine any one or more of the following client-side attributes: 1) the operating system an/or a version of an operating system, 2) a service pack of the operating system, 3) a running service, 4) a running process, and 5) a file. The collection agent 304 may also identify and determine the presence or version of any one or more of the following on the client: 1) antivirus software, 2) personal firewall software, 3) anti-spam software, and 4) internet security software. The policy engine 236 may have one or more policies based on any one or more of the attributes or characteristics of the client or client-side attributes.

The SSL VPN agent 308 is an application, program, process, service, task or set of executable instructions for establishing a Secure Socket Layer (SSL) virtual private network (VPN) connection from a first network 104 to a second network 104', 104", or a SSL VPN connection from a client 102 to a server 106. In one embodiment, the SSL VPN agent 308 establishes a SSL VPN connection from a public network 104 to a private network 104' or 104". In some embodiments, the SSL VPN agent 308 works in conjunction with appliance 205 to provide the SSL VPN connection. In one embodiment, the SSL VPN agent 308 establishes a first transport layer connection with appliance 205. In some embodiment, the appliance 205 establishes a second transport layer connection with a server 106. In another embodiment, the SSL VPN agent 308 establishes a first transport layer connection with an application on the client, and a second transport layer connection with the appliance 205. In other embodiments, the SSL VPN agent 308 works in conjunction with WAN optimization appliance 200 to provide SSL VPN connectivity.

In some embodiments, the acceleration program 302 is a client-side acceleration program for performing one or more acceleration techniques to accelerate, enhance or otherwise improve a client's communications with and/or access to a server 106, such as accessing an application provided by a server 106. The logic, functions, and/or operations of the executable instructions of the acceleration program 302 may perform one or more of the following acceleration techniques: 1) multi-protocol compression, 2) transport control protocol pooling, 3) transport control protocol multiplexing, 4) transport control protocol buffering, and 5) caching via a cache manager. Additionally, the acceleration program 302 may perform encryption and/or decryption of any communications received and/or transmitted by the client 102. In some embodiments, the acceleration program 302 performs one or more of the acceleration techniques in an integrated manner or fashion. Additionally, the acceleration program 302 can perform compression on any of the protocols, or multiple-protocols, carried as a payload of a network packet of the transport layer protocol.

In one embodiment, the acceleration program 302 is designed, constructed or configured to work with appliance 205 to provide LAN side acceleration or to provide acceleration techniques provided via appliance 205. For example, in one embodiment of a NetScaler appliance 205 manufactured by Citrix Systems, Inc., the acceleration program 302 includes a NetScaler client. In some embodiments, the acceleration program 302 provides NetScaler acceleration techniques stand-alone in a remote device, such as in a branch office. In other embodiments, the acceleration program 302 works in conjunction with one or more NetScaler appliances 205. In one embodiment, the acceleration program 302 provides LAN-side or LAN based acceleration or optimization of network traffic.

In some embodiments, the network optimization engine 250 may be designed, constructed or configured to work with WAN optimization appliance 200. In other embodiments, network optimization engine 250 may be designed, constructed or configured to provide the WAN optimization techniques of appliance 200, with or without an appliance 200. For example, in one embodiment of a WANScaler appliance 200 manufactured by Citrix Systems, Inc. the network optimization engine 250 includes the WANscaler client. In some embodiments, the network optimization engine 250 provides WANScaler acceleration techniques stand-alone in a remote location, such as a branch office. In other embodiments, the network optimization engine 250 works in conjunction with one or more WANScaler appliances 200.

In another embodiment, the network optimization engine 250 includes the acceleration program 302, or the function, operations and logic of the acceleration program 302. In some embodiments, the acceleration program 302 includes the network optimization engine 250 or the function, operations and logic of the network optimization engine 250. In yet another embodiment, the network optimization engine 250 is provided or installed as a separate program or set of executable instructions from the acceleration program 302. In other embodiments, the network optimization engine 250 and acceleration program 302 are included in the same program or same set of executable instructions.

In some embodiments, and still referring to FIG. 3, a first program 322 may be used to install and/or execute the client agent 120, or any portion thereof, automatically, silently, transparently, or otherwise. In one embodiment, the first program 322 is a plugin component, such an ActiveX control or Java control or script that is loaded into and executed by an application. For example, the first program comprises an ActiveX control loaded and run by a web browser application, such as in the memory space or context of the application. In another embodiment, the first program 322 comprises a set of executable instructions loaded into and run by the application, such as a browser. In one embodiment, the first program 322 is a designed and constructed program to install the client agent 120. In some embodiments, the first program 322 obtains, downloads, or receives the client agent 120 via the network from another computing device. In another embodiment, the first program 322 is an installer program or a plug and play manager for installing programs, such as network drivers and the client agent 120, or any portion thereof, on the operating system of the client 102.

In some embodiments, each or any of the portions of the client agent 120—a streaming client 306, a collection agent 304, SSL VPN agent 308, a network optimization engine 250, acceleration program 302, and interceptor 350—may be installed, executed, configured or operated as a separate application, program, process, service, task or set of executable instructions. In other embodiments, each or any of the portions of the client agent 120 may be installed, executed, configured or operated together as a single client agent 120.

D. Systems and Methods for Using Shared Compression Histories

Figure 4A:
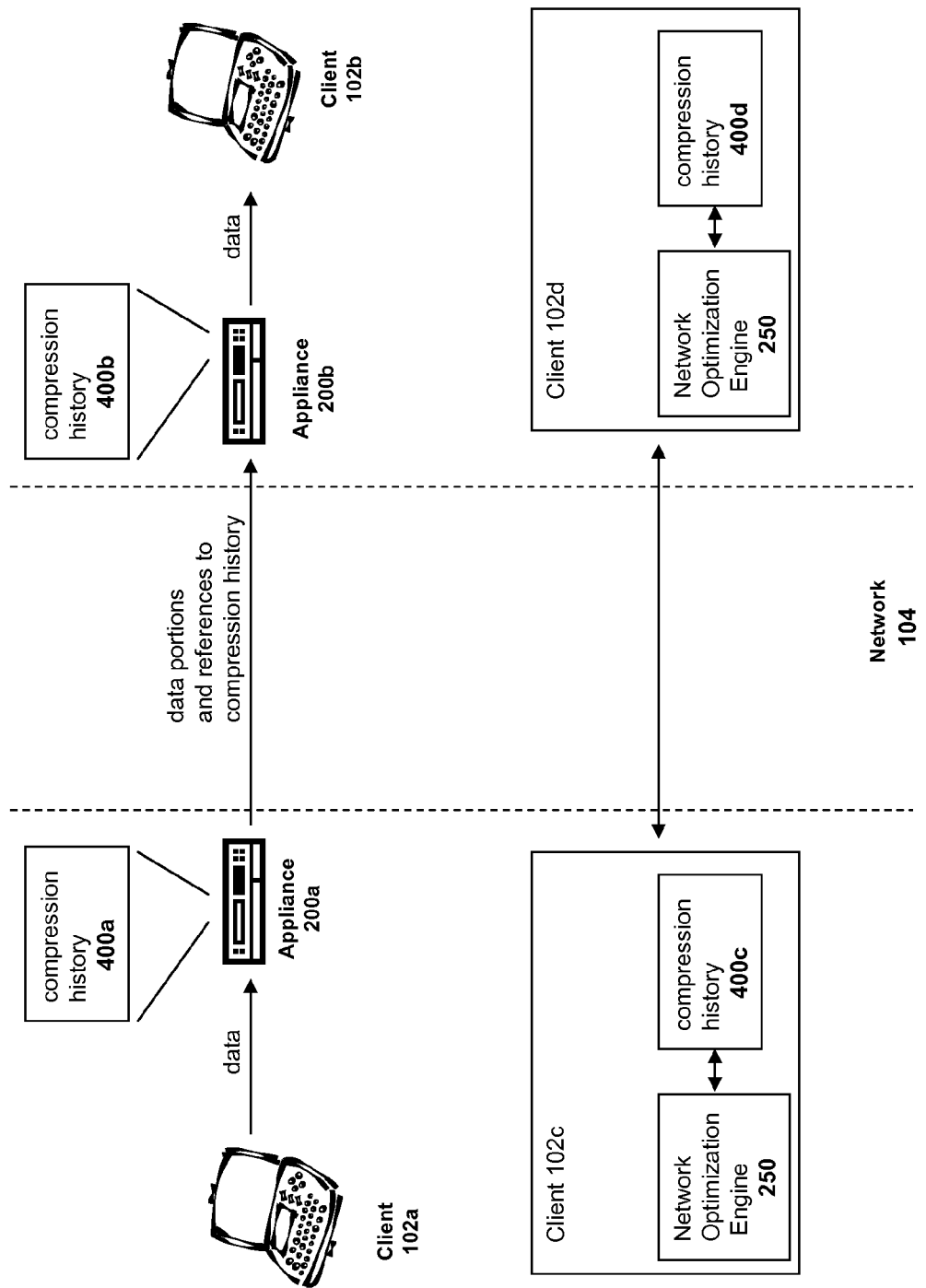
FIG. 4A is a block diagram of an embodiment of using a shared compression history to reduce the size of transmitted data.

Referring now to FIG. 4A, a block diagram of an embodiment of using a shared compression history to reduce the size of transmitted data is shown. In brief overview, two clients, 102a and 102b, transmit data via two appliances, 200a and 200b, having compression histories 400a and 400b (generally 400) respectively and which communicate over a network 104. The compression histories 400a and 400b are used to compress data transmitted between the appliances 200a, 200b, and comprise portions of data previously transmitted between the two appliances 200a, 200b. The appliance 200a compresses the data transmitted via the network 104 by identifying portions of data in a data stream sent by a client 102a which have previously been transmitted between the two clients. The appliance 200a then replaces those portions of data with a reference to a location in the compression histories 400a, 400b, reducing the volume of data transmitted, while allowing the corresponding appliance 200b to accurately reconstruct the original data stream. A client 102c containing a network optimization engine 250a may also use a compression history 400c to accelerate communications with an appliance 200 or second client 102d having a compression history 400d.

Still referring to FIG. 4A, now in greater detail, a client 102a transmits a data stream to an appliance 200a. The data stream may comprise any type of data sent over a network, including any protocol. In some embodiments, the data stream may be transmitted via a transport layer connection, such as a TCP connection. In other embodiments, the data stream may be transmitted via a session-layer protocol, such as SSL. In some embodiments, some or all of the data stream may be encrypted.

In some embodiments, one or more of the appliances 200a may operate transparently to one or more of the clients 102a, 102b. In other embodiments, one or more of the appliances 200a may operate as a transparent proxy for one or more of the clients 102a, 102b. For example, the appliances 200a and 200b may intercept and compress network traffic via a TCP connection between clients 102a and 102b transparently to one or both of the clients 102a, 102b. In this example, the client 102a may send a TCP stream addressed to client 102b which is intercepted by the appliances 200a. The appliance 200a may then compress the data stream and forward to client 102b via appliance 200b. Appliance 200b, after receiving the stream, may then decompress and forward the data stream to client 102b. In this way, client 102a and client 102b are able to maintain their use of standard TCP protocols and addresses.

The appliances 200a, 200b maintain synchronized compression histories 400a, 400b, each of which contain data previously transmitted between the appliances 200b. These synchronized compression histories may also be referred to as shared compression histories. The compression histories 400a, 400b may be synchronized by any means. In one embodiment, the compression histories may be synchronized by means of the appliances 200a 200b intercepting and storing the same data streams to the compression histories 400a 400b. In another embodiment, the appliances 200a, 200b may transfer all or a portion of a compression history between themselves. In some embodiments, the compression histories may be only imperfectly or partially synchronized. A compression history 400 may reside on any storage medium, including without limitation, RAM and disks. In some embodiments, a compression engine 238 residing on an appliance 200 may maintain a compression history 400.

A compression history 400 may store any type and form of data, including any previously transmitted data. In some embodiments, an appliance may store all data that passes through the appliance to the compression history. In other embodiments, an appliance may select portions of data from a data stream to be stored in the compression history based on any factor including, without limitation, the data stream source, data stream destination, transmission protocol, application protocols, available disk space, current disk usage, available memory space, current available bandwidth, and size of the data portions. In some embodiments, the data stored in the compression history may be compressed using a lossless compression algorithm. In one embodiment, a compression history may store data in chunks, which will be discussed with reference to FIG. 4B.

In some embodiments, an appliance may store the payloads, or any portions thereof, of any protocol layer of packets passing transmitted via the appliance in the compression history. In one embodiment, an appliance may store only the payload of TCP packets transmitted via the appliance in a compression history. In one embodiment, the appliance stores application data obtained via an application layer protocol to the compression history 1138. In some embodiments, the appliance stores headers of the network packet, such as application layer header of an HTTP payload, to a compression history. In other embodiments, the appliance does not store headers of the network packet. In another embodiment, an appliance may store only the payload of a UDP packet transmitted via the appliance in a compression history. In one embodiment, an appliance may elect not to store any encrypted data in the compression history. In another embodiment, an appliance may decrypt encrypted data and store the decrypted data in a compression history. In still another embodiment, an appliance may store encrypted data to a compression history.

A compression engine 238 may store the compression history 400 in storage 128, such as disk, memory, such as RAM, or a combination of storage and memory. In some embodiments, the compression engine 238 uses an object or data index to reference or identify corresponding objects or data stored in the compression history. A specific example of one embodiment of such an index is given in FIG. 4C. In one embodiment, a compression engine 238 uses an object index stored in memory. In other embodiments, a compression engine 238 uses an object index stored to disk. An object index may comprise any type and form of indexing scheme for corresponding an index to an object in a compression history 400. In one embodiment, an object index is maintained in memory while the corresponding object is stored a compression history 400. In some embodiments, an object index comprises an entry that references or identifies a location or pointer to the object stored in the compression history 400. In some embodiments, some or all of a compression history or an index may be stored in a cache 232. In other embodiments, some or all of a cache 232 may be stored using a compression history.

In writing a portion of transmitted data to the compression history, an appliance may create a shared identifier to enable the appliance and an appliance receiving the transmitted data to refer to the portion of data in later communications. In one embodiment, this identifier may be a unique identifier between the two appliances. In other embodiments, this shared identifier may be a globally unique identifier among a plurality of appliances. The shared identifier may be created, for example, by tracking the number of bytes sent via a connection between the appliances and assigning successive identifiers to successive bytes transmitted.

In some embodiments, a single appliance 200 may maintain multiple compression histories. For example, an appliance 200a in communication with multiple other appliances may maintain a separate compression history containing the data transmitted to and from each appliance. In one embodiment, these separate compression histories may be physically separate, such as where separate disks are maintained for each compression history. In another embodiment, these separate compression histories may be logically separate, such as where multiple compression histories are intermingled on a single disk, with identifiers or indices identifying which compression history or compression histories a given data portion belongs to.

In the embodiment shown, the appliance 200a used the compression history 400a to identify portions of data in the data stream from the client 102a which have previously been transmitted to the appliance 200b. The appliance then replaces those portions of the data stream with identifiers identifying the locations of the compression history containing those portions before sending the data stream to appliance 200b. For example, the appliance may replace a sequence of 120 bytes with a reference to a memory location containing the sequence and an instruction to include 120 bytes from the referenced location.

Upon receiving the data stream containing a reference to a location in the compression history, the appliance 200b searches its compression history 400b for the identified portion of data. The appliance 200b then replaces the identifier in the data stream with the identified portion of data, and sends the reconstructed data stream to the client 102b.

In these embodiments and subsequent embodiments discussed below, the compression history and caching functions performed by the appliances 200a, 200b may be performed by one or more of a client 102, client agent 120, or server 106. For example, a client agent 120 may maintain a compression history 400 comprising portions of data previously transmitted to a server, the server also maintain a corresponding compression history. The client agent 120 and the server 106 may then compress data sent between the server and a client on which the client agent 120 resides by using the compression histories.

Figure 4B:
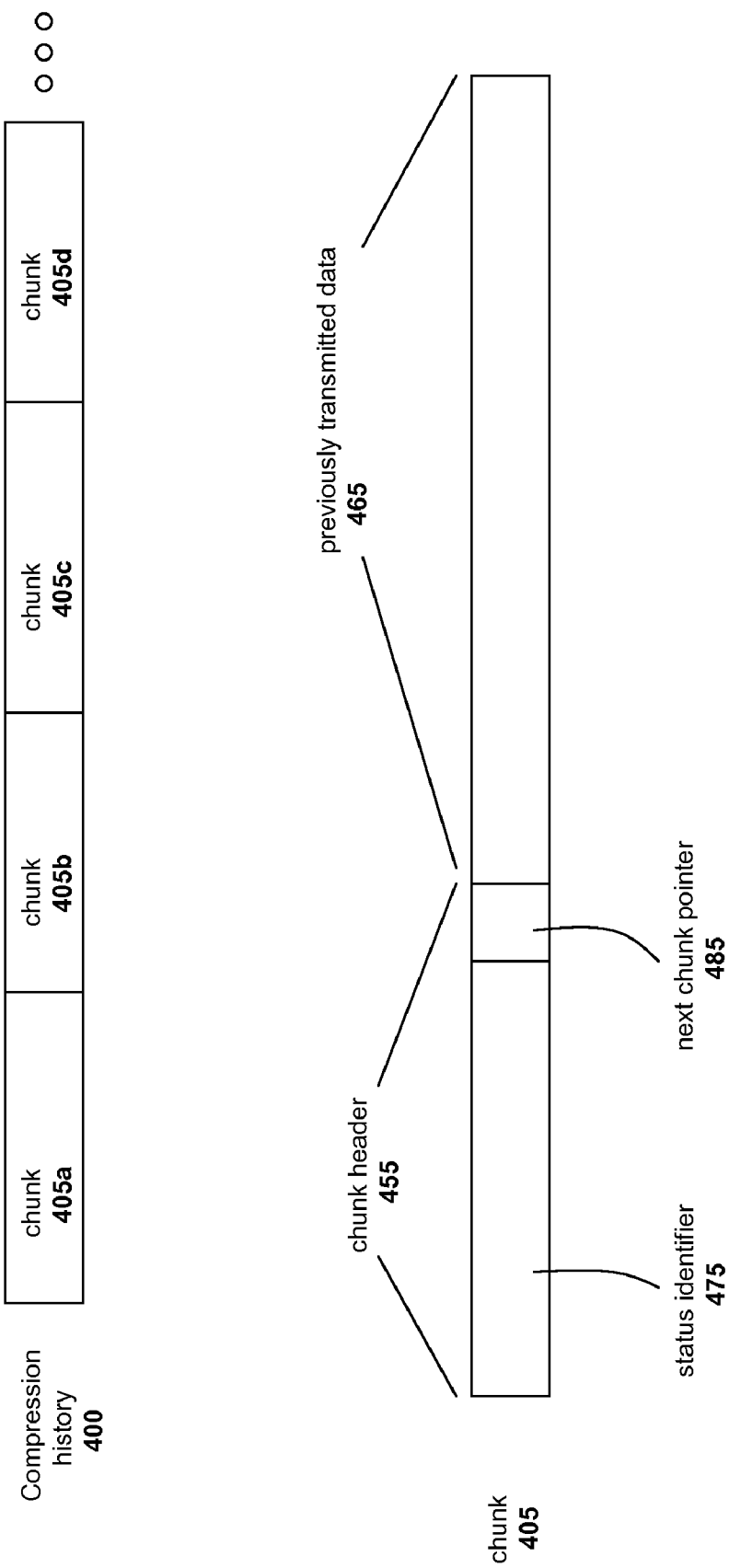
FIG. 4B is a block diagram of one embodiment of a data structure used to store data in a compression history.

Referring now to FIG. 4B, a block diagram of one embodiment of a data structure used to store data in a compression history is shown. In brief overview, a compression history 400 comprises a plurality storage units referred to as chunks 405a, 405b, 405c, 405d (generally referred to as 405) for storing data of a compression history. Each chunk 405 comprises a header 455 having a status identifier 475 and a next chunk pointer 485. Each chunk also includes a section containing previously transmitted data 465.

Still referring to FIG. 4B, now in greater detail, a compression history 400 comprises a number of chunks 405. A chunk may refer to any discrete physical or logical storage element. Examples of a chunk may include a region of a disk, multiple sequential regions of a disk, and a memory location, a series of consecutive memory locations. For example, a 10 MB disk may be divided into 1,000 10 KB chunks, where each chunk is a 10K logically contiguous region on the disk. Or for example, two 10 MB disks may be divided into 20,000 1 KB chunks, with one or more chunks crossing disks. In other embodiments, a chunk may comprise non-sequential areas of a disk or disks. For example, a 2K chunk may be stored in 4 separate 512-byte pieces, and a data structure may be maintained which identifies the locations of the separate pieces. In still other embodiments, a chunk header 455 may be stored in a different location than a chunk payload 465. For example, one or more chunk headers 455 may be maintained in memory, while the chunk data 465 may be maintained on a disk.

A chunk may be any size, including without limitation 32 bytes, 64 bytes, 100 bytes, 128 bytes, 256 bytes, 512 bytes, 1K, 2K, 3K, 4K, 8K, 10K, 16K, 32K, 64K, and 128K. In some embodiments, some chunks may only be partially filled with data. For example, in an embodiment where chunks have a fixed size of 5K, a chunk may only include 2K of data in a case where the chunk held the last bytes of a given transmission.

In some embodiments, a series of chunks may be stored sequentially on a disk or in memory. In other embodiments, chunks may be stored in a plurality of locations on a disk or in memory. For example, in one embodiment, an appliance may store chunks which contain data transmitted to another appliance in a contiguous section of a disk. In another embodiment, a compression engine on a client may store chunks with data transmitted to a first appliance interleaved on disk with chunks including data transmitted to a second appliance.

In some embodiments, an appliance may create a new chunk for each new connection that is opened via the appliance. For example, in an appliance serving as an intermediary for a plurality of TCP connections, an appliance may create a new chunk each time a new TCP connection is opened, and store the data from the TCP connection in the chunk. In this example, the appliance may create additional chunks for a TCP connection if the initial chunk becomes full. In this embodiment, the appliance may ensure that each chunk holds data from only one TCP connection. The appliance may store any information relating to the TCP connection, including timestamps, sequence numbers, and source and destination addresses in one or more chunk headers.

In some embodiments, a compression history may contain chunks of a uniform size. In other embodiments, a compression history may contain chunks of varying sizes.

The compression history shown comprises a plurality of chunks 405. Each chunk contains a chunk header 455. A chunk header 405 may comprise any identifying, navigational, or historical data relating to the chunk. Examples of data which may be stored in a chunk header include, without limitation, a chunk identifier, a pointer to the next chunk in a sequence, a pointer to a previous chunk in a sequence, a size for the chunk, a time the chunk was created, a time the chunk was last accessed, a total number of times the chunk has been accessed, and a checksum or other error correcting measures.

In the embodiment shown, the chunk includes a chunk identifier, which may comprise a unique serial number assigned to the chunk. In one embodiment, this unique serial number may correspond to a memory address of the chunk, such as a starting address of the location of the chunk in memory or on a disk. In other embodiments, the chunk identifier may correspond to a location within a sequence of transmitted data. For example, in a compression history shared between two devices, a chunk with serial number 4,500,000 may contain the 4,500,000$^{th}$ byte transmitted between the two appliances and some number of subsequent bytes. The chunk identifier corresponding to a portion of transmitted data may be shared with the corresponding appliance either explicitly or implicitly. For example, two appliances may use the above method such that a given portion of transmitted data will have the same chunk identifier on both appliances. In this manner the unique serial number refers to an identical portion of data residing on two or more appliances. In another example, after a first appliance transmits a given number of bytes to a second appliance, the first appliance may transmit a chunk identifier identifying the chunk in which the first appliance stored the transmitted data. The second appliance may then record the received chunk identifier in a table corresponding to the second appliance's chunk identifier assigned to the same data.

In one embodiment, chunk identifiers may be globally unique among a plurality of appliances. For example, in a set of appliances, each with unique serial numbers, an appliance may append the appliance's serial number to the beginning or end of a locally unique chunk identifier to create a globally unique chunk identifier. In another embodiment, each device storing transmitted data to chunks on a disk may create a chunk identifier by appending the disk serial number to a chunk serial number. If the chunk serial numbers are never reused, this technique may be used to create globally unique chunk identifiers. A device may then transmit to a recipient of the transmitted data the created chunk identifier so that a table of correspondences can be maintained on the receiving device.

In some embodiments, some or all of the data included in the chunk header 455 may be stored in a footer after the chunk. In still other embodiments, some or all of the data contained in the chunk header 455 may be stored in an external table or other data structure.

Figure 4C:
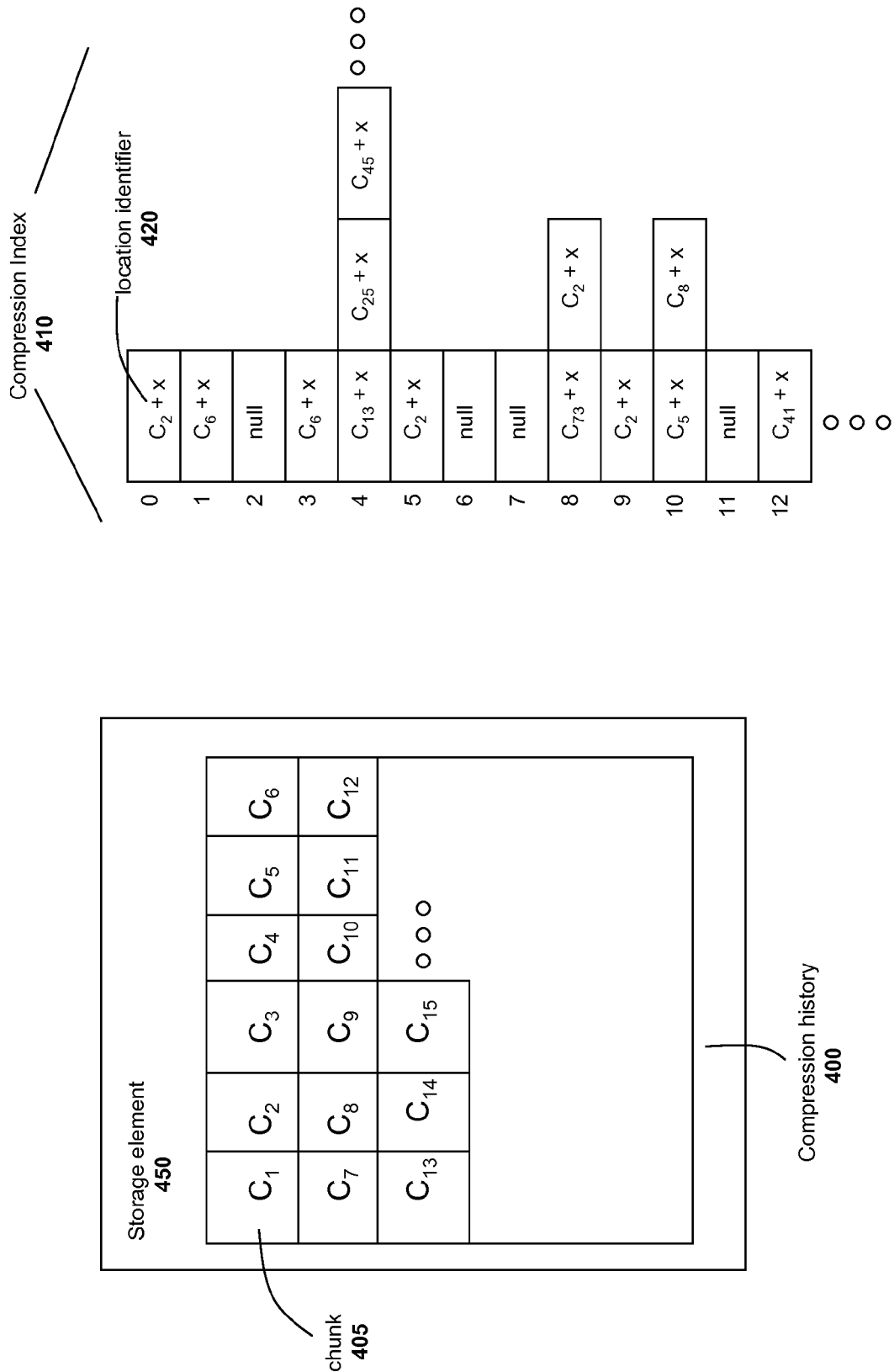
FIG. 4C is a block diagram of one embodiment of a data structure which can be used to locate data portions in a compression history.

Referring now to FIG. 4C, a block diagram of one embodiment of a data structure which can be used to locate data portions in a compression history a compression index 410 is shown. In brief overview, a compression index 410 contains a number of location identifiers 420 arranged in a table. Each row of the table corresponds to a given data fingerprint. For example, row 4 of the table contains location identifiers for portions of data in the compression history that have a data fingerprint equal to 4. Each of the location identifiers 420 points to a location in a compression history 400 by identifying a location within a given chunk. In the embodiment shown, the location identifiers identify a particular chunk and an offset within the chunk.

Still referring to FIG. 4C, now in greater detail, a compression index 410 includes a number of location identifiers 420 arranged in an index where each row corresponds to a given data fingerprint. The index may be implemented using any data structure, including arrays, tables, hash tables, and linked lists, binary trees, red-black trees, and tries. The index may also be implemented using any technique for implementing a hash table. For example, in one embodiment, the index may be implemented as an array of linked lists, where each linked list corresponds to a row of the index. In another embodiment, the table may be implemented as a single two dimensional array. In this embodiment, if a row of the array becomes full, the least recently used location identifier in the row may be discarded. In still other embodiments, the index may be implemented as a single array where hash collisions are resolved by placing location identifiers in array slots subsequent to a slot of the overloaded hash value. Throughout this specification the word "entry" may be also be used to indicate the portion of a compression index having location identifiers corresponding to a given fingerprint. Thus, with respect to FIG. 4C, entry 8 stores location identifiers $C_{73}$+x and $C_2$+x (where x represents any offset).

The location identifiers 420 may comprise any identifier which allows the appliance to locate the corresponding portion of data in a compression history. In one embodiment, a location identifier may comprise a chunk identifier 475 and an offset. In another embodiment, a location identifier may comprise a single address corresponding to a memory or disk location of the data portion. In still another embodiment, a location identifier may comprise an address and a size indicator.

After determining a portion of a compression history matches a portion of an input stream, an appliance may then perform a run-length extension to determine a total length for the matching sequence. A run-length extension may be performed by comparing successive bytes in the compression history to successive bytes of the input stream, without the need for computing fingerprints. In some embodiments, a run-length extension may also compare previous bytes in the compression history to previous bytes in the input stream. For example, if a 600-byte sequence of input data has been buffered by an appliance 200 for later transmission and a match is found in a compression history with respect to the 140-145th bytes, the appliance may compare previous and successive bytes in the compression history with previous and successive bytes of the input stream to identify the full extent of the compression history match. In some embodiments, a run-length extension may extend over a plurality of chunks. In these embodiments, next chunk and previous chunk pointers contained within a given chunk may be used to identify successive and preceding areas of the compression history.

E. Systems and Methods for Efficiently Identifying Compression History Matches

Figure 5A:
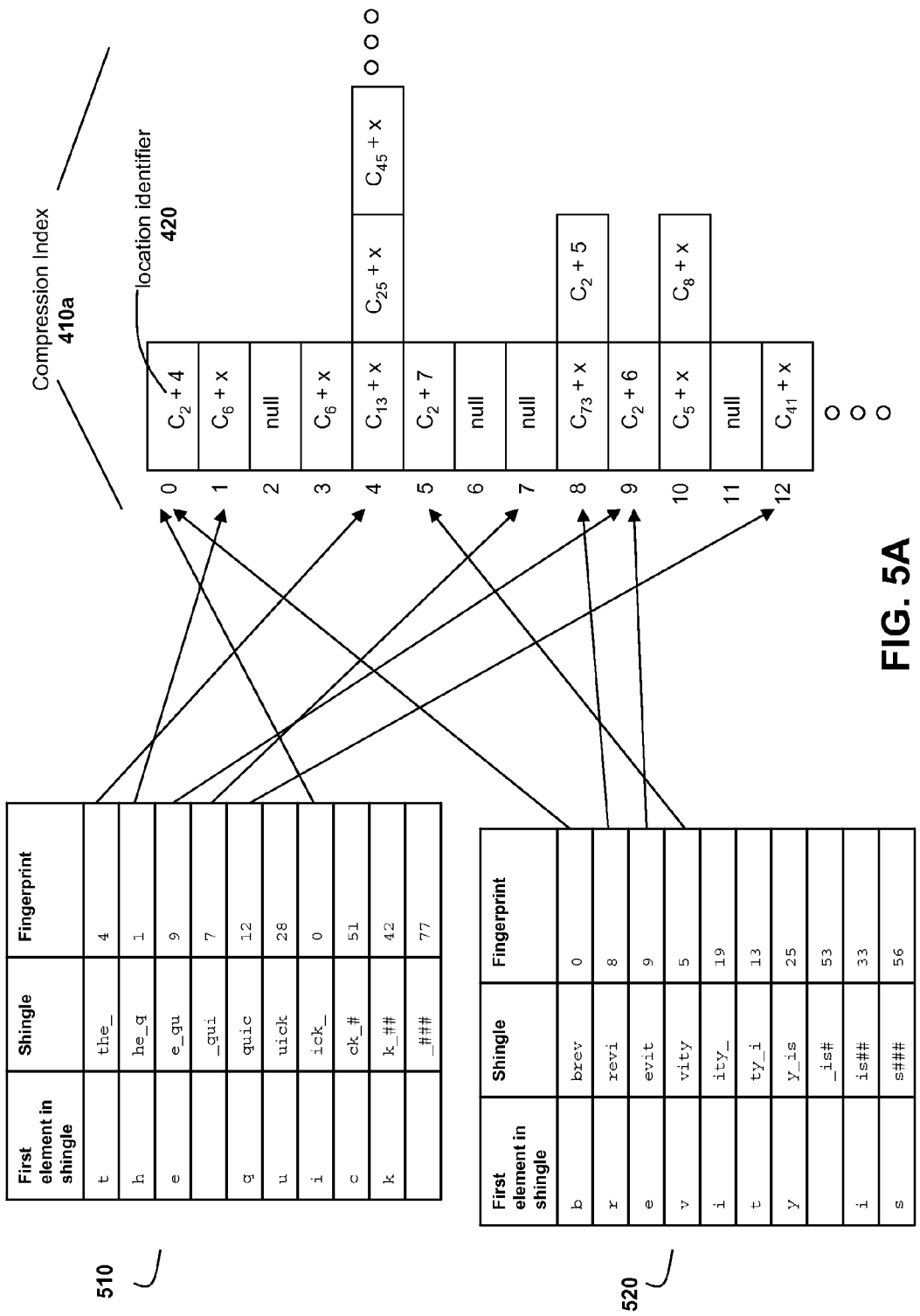
FIG. 5A is a block diagram illustrating one embodiment of using a compression index to locate compression history matches corresponding to input data.

Referring now to FIG. 5A, a block diagram illustrating one embodiment of a method of using a compression index to locate compression history matches corresponding to input data is shown. In brief overview, an appliance may intercept one or more data streams 510, 520. The appliance organizes a data stream 510, 520 into a number of shingles, and then computes a fingerprint for each shingle. For example, the 10 character stream "the quick" is treated as ten four-byte overlapping shingles. Each fingerprint then serves as an index into a compression index 410a. For example, the shingle "the" produces a fingerprint of 4, which corresponds to row 4 of the compression index 410a. This row has a number of location identifiers pointing to locations in a compression history including shingles which also have a fingerprint of 4.

Still referring to FIG. 5A, now in greater detail, an appliance divides a data stream 510 into a number of shingles. In the embodiment shown, the data stream is the string "the quick". The appliance breaks the string into 4-byte shingles. In other embodiments, the shingles may be any other length, including, without limitation, 3, 5, 6, 7, 8, 10, 12, 16, 32, or 64 bytes. In the embodiment shown, the appliance creates overlapping shingles of 4 bytes for each successive byte in the data stream. In other embodiments, shingles may be non-overlapping. In still other embodiments, an appliance may create shingles for only a subset of the bytes in a data stream. For example, an appliance may create a shingle for every other byte in a data stream, or every third byte in a data stream. In some embodiments, the appliance may compute a fingerprint for a number of shingles in order to select the fingerprint which will be looked up in a compression index. This technique and other fingerprint techniques are described more fully in U.S. Pat. No. 7,098,815, "Method and apparatus for efficient compression," the entire contents of which are expressly incorporated by reference herein.

In the embodiment shown, the appliance computes a fingerprint value for each shingle, which is then used as an index into a compression index 410a. In some embodiments, the appliance may then access the data portion identified by a location identifier residing in the index. The appliance may then do a byte-by-byte comparison of the data portion in the compression history with the shingle to ensure that a match has been found. For example, this comparison may be necessary if the fingerprinting method does not produce a unique fingerprint for every possible shingle, or if multiple fingerprints are consolidated into a given "row" of the compression index 410a. In one embodiment, when a shingle is found to match a given portion of data in the compression history, an appliance may then do a run length extension of the match to determine whether subsequent portions of the data in the compression history match subsequent portions of the received input stream.

In one embodiment, an appliance may utilize a strategy of checking for a plurality of fingerprint matches before accessing a compression history to confirm a match is found. In this embodiment, the appliance compares the location identifiers corresponding to subsequent shingles to see if the locations pointed to are subsequent sections of a single chunk. The appliance may do this strategy to establish some likelihood that a match of a given length actually exists, and is not either a false positive from the fingerprinting algorithm or a match of such a small length as to not provide significant compression benefit. The strategy may result in performance improvements in cases where a compression history is stored on a disk, and thus may have slower access times than the compression index, which may be stored in memory. This strategy also may result in performance improvements in cases where a compression history is being heavily used by a plurality of connections, by minimizing the number of times a disk or memory region is accessed.

Still referring to FIG. 5A, an appliance may compute a fingerprint for the first shingle "the" in the data stream 510. Upon checking the compression index for entries corresponding to the fingerprint, the appliance finds a large number of entries, perhaps as a result of large numbers of previously transmitted data containing the byte sequence "the". The appliance may then compute a fingerprint for the next shingle "he_q", and find only a single match, identifying chunk 6 and a given offset. The appliance may then compute a fingerprint for the next shingle "e_qu", and find only a single match, identifying chunk 2 and an offset of 6. Since chunk 2 and chunk 6 do not represent sequential areas in the compression history, there is a very low probability that either of these chunks will contain a match for anything other than the individual shingles. The appliance may thus determine to not access either of these portions of data in the compression history, and instead send the data uncompressed, or compressed using a compression mechanism other than a compression history.

With respect to data stream 520, the appliance may determine that the location identifiers associated with the consecutive shingles "brev" "revi" "evit" and "vity" identify consecutive portions of the compression history, namely, they identify bytes 4, 5, 6, and 7 of chunk 2. This indicates a substantial likelihood that a long match exists for the data stream 520 on chunk 2. The appliance may then determine to access that portion of the compression history and perform a run-length extension to determine a total length for the matching sequence.

Referring now to FIG. 5B, a flow chart of one embodiment of a method of determining whether to perform disk based compression by identifying in an index maintained in memory an estimated extent of a match of input data to contiguous data stored on disk is above or below a predetermined threshold is shown. In brief overview, a device having a compression history establishes an index in memory that corresponds fingerprints of a plurality of portions of data of the compression history to location identifiers identifying locations in a storage element having the plurality of portions of data (step 501). The device identifies a number of fingerprints of input data match fingerprints of a plurality of entries of the index in memory (step 503), and determines, from the number of identified fingerprints in memory having entries corresponding to a first location identifier that an estimated match of input data to contiguous data on disk is extendable below a predetermined threshold (step 505). If the match is extendable below a given threshold, the device transmits the data uncompressed (step 507). If the match is extendable above the given threshold, the device uses the compression history to compress the data (step 509). Although the method may be discussed below in the context of being performed by an appliance, the device may comprise a client 102, server 106, appliance 200, or any other computing device 100.

Still referring to FIG. 5B, now in greater detail, a device having a compression history stored establishes an index in memory that corresponds fingerprints of a plurality of portions of data of the compression history to location identifiers identifying locations in a storage element having the plurality of portions of data (step 501). In one embodiment, the index may comprise a compression index 410 as described herein. The location identifiers may also comprise location identifiers 420 as described herein. In one embodiment, the locations on disk may correspond to chunks 400 as described herein. The index may be established and maintained at any times. In one embodiment, the index may be updated each time data is stored in a compression history. The storage element may comprise any means of storage, including one or more of RAM, disks, and flash memory. In some embodiments, the storage element may reside on the device. In other embodiments, the storage element may be connected to the device via a network. In one embodiment, the storage element may have a higher latency than the memory containing the index.

In the embodiment shown, a device identifies a number of fingerprints of input data match fingerprints of a plurality of entries of the index in memory (step 503). The input data may comprise input data from any source. In one embodiment, the input data may comprise a data stream transmitted to the device from a client 102 or server 106. In one embodiment, the data stream may comprise data from a TCP connection for which the device is serving as a proxy. In another embodiment, the input data may comprise data sent from an application running on the device.

The device may compute fingerprints of the input data using any fingerprinting method including, without limitation, a shingle method as described herein. The number of fingerprints may be any number 2 or greater, including 2, 3, 4, 5, 6, 7, 8, 9, and 10. For example, an appliance may compute fingerprints for four successive shingles of a given data stream. In another embodiment, an appliance may compute fingerprints for five proximate non-overlapping shingles in the input data. In one embodiment, the number of fingerprints may be predetermined in order to balance the drawbacks of potentially skipping over small matching segments against the benefits gained by fewer disk accesses.

In the embodiment shown, the method then comprises determining, by the device, from the number of identified fingerprints in memory having entries corresponding to a first location identifier that an estimated match of input data to contiguous data on disk is extendable below a predetermined threshold (step 505). In one embodiment, this method may comprise identifying that one or more of the fingerprints correspond to entries in the index which contain null pointers or another indication that no match exists in the compression history for the fingerprint. In another embodiment, this method may comprise identifying that two or more of the fingerprints correspond to entries containing location identifiers pointing to non-contiguous locations of the compression history. For example, with respect to the input stream 510, the device may determine that the locations identified by the fingerprints 1 and 9 are not contiguous in the compression history. This indicates that the match in the compression history corresponding to the beginning of the input stream is no longer than 5 characters.

The predetermined threshold may comprise any number of bytes. In one embodiment, the predetermined threshold may be 8, 12, 16, 32, 64, 128, or 256 bytes. In some embodiments, the predetermined threshold may be altered in response to operational characteristics of the device. In one embodiment, the threshold may be increased in response to an increase in the number of connections passing through the device, an increase in the amount of data passing through the device, or an increase in a connection speed relating to the input data. In another embodiment, the threshold may be decreased in response to a reduction in the number of connections, a decrease in the amount of data passing through the device, or a decrease in connection speed relating to the input data. For example, in an appliance serving as a proxy compressing a number of TCP connections, the appliance may increase the threshold in response to additional TCP connections being opened in order to minimize the occurrences of compression routines for two connections needing to simultaneously access a disk containing compression histories.

In the embodiment shown, the method then comprises transmitting, by the device, the data uncompressed in response to a determination that the match is not extendable above a given threshold (step 507). The device may then continue to compute fingerprints for subsequently received portions of input data to identify potential matches in the compression history. The uncompressed data may be transmitted to an appliance, a client, or any other device. In some embodiments, the transmitted data may be compressed using a compression method other than the compression history. For example, the data may then be compressed using run-length compression or LZW compression. In one embodiment, the data may be compressed using only portions of the compression history that are available in a faster storage element. For example, a device may maintain recently accessed portions of the compression history in a cache. The device may choose to compress the data using only those portions which are available in cache.

If the match is extendable above a given threshold, the device may use the compression history to compress the input data. Using the compression history may comprise any method of accessing, referencing, or otherwise leveraging the compression history to attempt to compress the input data. For example, the device may access the compression history to determine whether portions of the compression history with fingerprints corresponding to the input data are byte-for-byte matches of the input data. Or the device may, after accessing the compression history to confirm a match, replace one or more portions of the input data with references to the compression history before retransmitting the input data.

A potential problem with using shingles as indexes into compression histories is that in some cases a given shingle may occur in a large number of transmitted files or data. This may impede the ability of a compression engine to find long continuous matches in a compression history for a given input stream. These long continuous matches may be desirable for reducing the amount of transmitted data as well as reducing the number of disk accesses if a compression history is stored on a disk. For example, the shingle "<HTML" might be present in a large number of web pages. If an appliance then receives an input stream that begins with "<HTML", even if the input stream is the beginning of a file which exists in the compression history of the appliance, the appliance may have difficulty identifying which of a number of chunks containing the shingle "<HTML" will match the rest of the input stream.

Figure 6A:
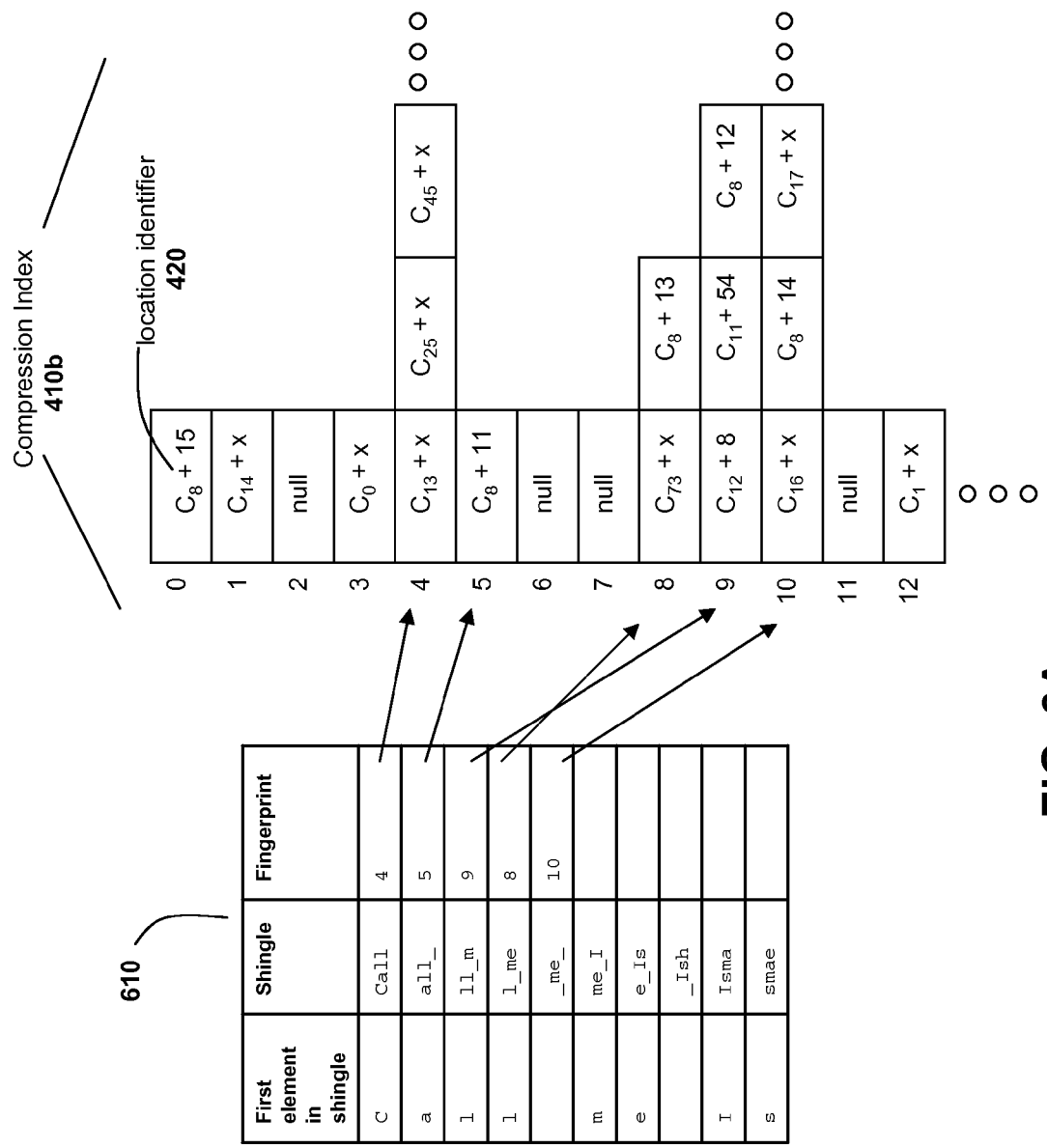
FIG. 6A is a block diagram illustrating a second embodiment of using a compression index to locate compression history matches corresponding to input data.

Referring now to FIG. 6A, a block diagram illustrating a second embodiment of using a compression index to locate compression history matches corresponding to input data is shown. In brief overview, an input stream "Call me Ishmael" is processed into a number of shingles. A fingerprint is computed for each shingle and the corresponding row in the index is identified. The appliance then counts the number of location identifiers in each row to determine which row to select for the purposes of accessing the disk.

Still referring to FIG. 6A, an appliance (or client agent or server agent) computes fingerprints for a number of shingles before accessing a compression history. After receiving the input string "Call me Ishmael", the appliance computes fingerprints for each of the successive overlapping four-byte shingles that make up the input string. The first shingle "Call" has a fingerprint value of 4, and the corresponding compression index 410*b* entry has a plurality of location identifiers. This may indicate that a number of chunks on disk contain the character sequence "Call." Rather than attempt to access one of these chunks, the appliance then proceeds to compute fingerprints for a number of successive shingles of the input string. In the example shown, the appliance computes fingerprints for the next 4 shingles. The appliance then counts the number of location identifiers in each index entry. In the example shown, the shingle "all" has a fingerprint which matches one compression history location, the single "ll m" has a fingerprint which matches three compression history locations, the shingle "l me" has a fingerprint which matches two compression history locations, and the shingle "me" has a fingerprint which matches more than three compression history locations. An observation may then be made that any long compression history match containing the input string must contain matches to each of the shingles. Thus, if a long match exists in the compression history, it must contain a match to the shingle "all", which only has one location identifier in the corresponding entry. The compression engine may deduce that this location identifier is the most likely to point to an area of the compression history containing a long match, and access the compression history in the specified location. The compression engine may then perform a run-length expansion of the match to determine a total length of the matching sequence.

The compression engine may determine the number of location identifiers in a compression index entry using any method. In one embodiment, the compression engine may count the location identifiers in a given index entry by iterating over each location identifier. In another embodiment, the compression engine may count the location identifiers by determining a total size of the compression index entry. In still another embodiment, each entry of a compression index may store a count of the number of location identifiers contained within the entry.

Figure 6B:
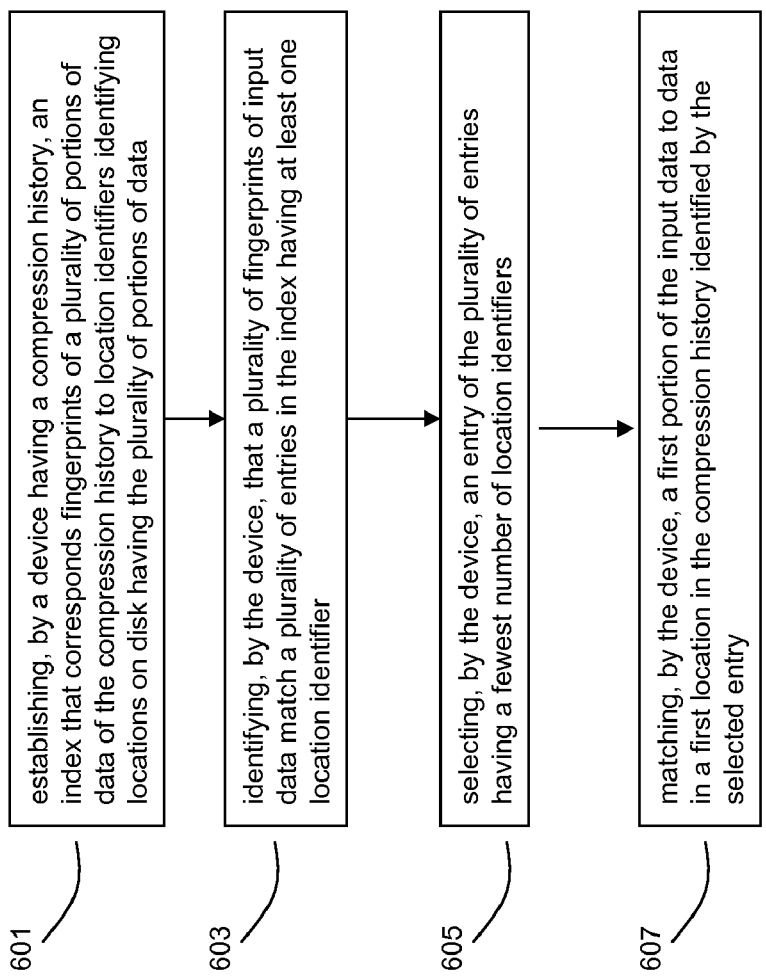
FIG. 6B is a flow diagram of one embodiment of a method for determining a precedence for matching fingerprints of input data to an index of fingerprints identifying a plurality of instances of data in a compression history.

Referring now to FIG. 6B, a flow diagram of one embodiment of a method for determining a precedence for matching fingerprints of input data to an index of fingerprints identifying a plurality of instances of data in a compression history is shown. In brief overview, the method comprises a device having a compression history establishing an index that corresponds fingerprints of a plurality of portions of data of the compression history to location identifiers identifying locations an a storage element having the plurality of portions of data (step 601). The device identifies that a plurality of fingerprints of input data match a plurality of entries in the index having at least one location identifier (step 603) and selects an entry of the plurality of entries having a fewest number of location identifiers (step 605). The device may then match a first portion of the input data to data in a first location in the compression history identified by the selected entry (step 607). The method may be performed by any device having a compression history, including a client, client agent, server, or server agent. Further, this method may be performed in combination with any of the other compression history methods and systems described herein. For example, this method may be performed in combination with the method described in conjunction with FIG. 5B. In this example, a compression engine might compute fingerprints for a number of shingles, identify the shingles having the fewest location identifiers in the index, and then check whether the location identifiers for those shingles pointed to sequential areas of the compression history.

Still referring to FIG. 6B, now in greater detail, a device establishes any type and form of index for a compression history a (step 601). In one embodiment, the index may comprise a compression index 410. In another embodiment, the device may use a network optimization engine 250 and/or compression engine 238 to establish the index. The index can use any data fingerprinting method, and the portions of data can be chosen using any method. In one embodiment, the index may correspond fingerprints taken from a plurality of overlapping shingles to chunk identifiers and offsets. In another embodiment, the index may correspond fingerprints taken from a plurality of overlapping shingles to memory addresses in a compression history. The data in the compression history may be received from any source. In one embodiment, the data in the compression history may comprise data previously transmitted by the device. The storage element storing the compression history may comprise any means of storage, including one or more of RAM, disks, and flash memory. In some embodiments, the storage element may reside on the device. In other embodiments, the storage element may be connected to the device via a network. In one embodiment, the storage element may have a higher latency than the memory containing the index.

After establishing the index, the device may identify that a plurality of fingerprints of input data match a plurality of entries in the index having at least one location identifier (step 603). The device may compute fingerprints for any number and amount of input data. In one embodiment, the device may compute fingerprints for four portions of input data. In another embodiment, the device may compute fingerprints for two, three, five, six, seven, eight, nine, ten, or more portions of input data. In one embodiment, the device may identify that a plurality of fingerprints, each corresponding to a successive overlapping shingle of input data, match a plurality of entries.

In some embodiments, the device may compute fingerprints for a plurality of portions of input data before checking the index for corresponding location identifiers. In other embodiments, the device may compute a fingerprint for a portion of data, check the index for a corresponding location identifier, and then, if more than one location identifier is found, the device may compute fingerprints for subsequent portions of data before accessing a compression history. For example, the device may continue to compute fingerprints and count corresponding location identifiers until the device computes a fingerprint for which only one location identifier is in the corresponding index entry. The device may then select this entry (step 605) and access the location in the compression history identified by the one location identifier and determine a length of the match.

The device may select an entry of the plurality of entries having a fewest number of location identifiers (step 605). In some cases, the device may select an entry having only one location identifier. In other cases, the device may select an entry having more than one location identifier, but has the fewest number of location identifiers of the plurality. In these cases, the device may choose a location identifier to access from the entry using any method including, without limitation, selecting a location identifier randomly, or selecting a location identifier using the method described in FIG. 5B.

After selecting an entry, the device may match a first portion of the input data to data in a first location in the compression history identified by the selected entry (step 607). This first portion may be the portion whose fingerprint corresponded to the selected entry. The matching may be performed by any method, including without limitation byte-by-byte comparison, a second fingerprinting process, checksums, and run length expansion.

If a match is found, the device may then compress the input data by replacing the matching sequence of data with a reference to the matching portion of the compression history in the subsequent transmission. The device may then repeat any or all of the above steps with respect to subsequent input data.

F. Systems and Methods for Removing Application Layer Headers from Compression History Data As discussed previously, many benefits may be associated with identifying and using longer compression history matches as opposed to shorter matches. Potential benefits include fewer compression history accesses, improved compression ratios, and lower processing overhead. Another way to increase the likelihood of generating longer compression history matches is to remove from compression history consideration input data which is unlikely to be repeated. One example of data that may be unlikely to repeat is application layer protocol headers, which may include session numbers, timestamps, and other unique data. By removing these application layer headers from compression history data, longer compression history matches may be obtained, and compression history space may be conserved.

Figure 7A:
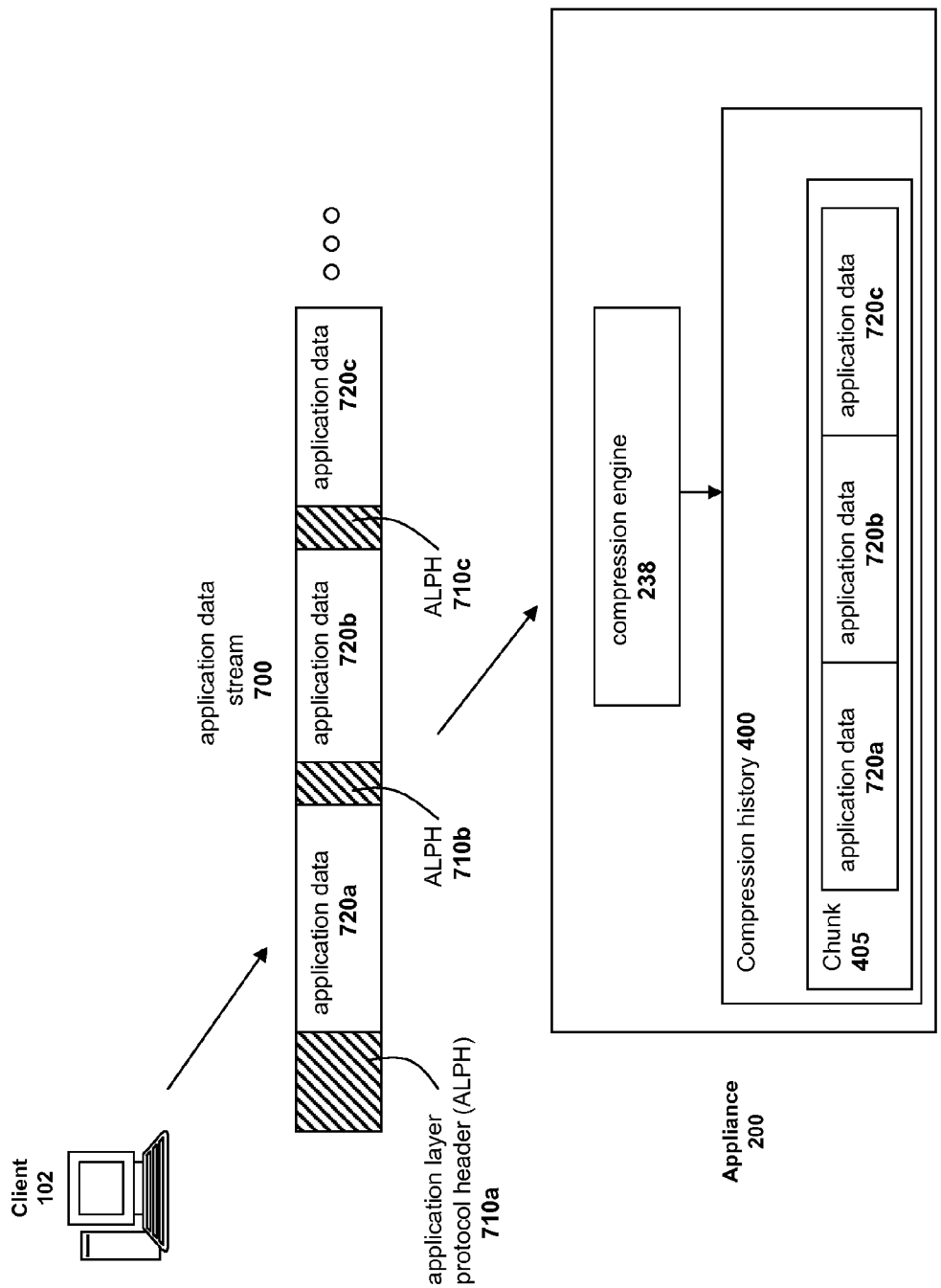
FIG. 7A is a block diagram illustrating one embodiment of removing application layer protocol headers from data stored in a compression history.

Referring now to FIG. 7A, a block diagram illustrating one embodiment of a technique for removing application layer protocol headers from data stored in a compression history is shown. In brief overview, an application data stream 700 is transmitted from a client 102 to an appliance 200. The application data stream comprises a number of sequences of application data 720a, 720b, 720c (generally 720) separated by application layer protocol headers 710a, 710b, 710c (generally 710). The appliance 200 stores the portions of the application data 720 in a contiguous region of a compression history 400.

Still referring to FIG. 7A, now in greater detail, an appliance 200 (in other embodiments, this could be a client agent, server agent, client, or server) receives an application data stream 700 via any type and form of protocol. An application data stream 700 may comprise any stream of application layer data. As used in FIGS. 7A, 7B, 7C, 7D and the accompanying description, the application layer may refer to the application layer (or layer 7) of the OSI model or the application layer may refer to any layer above the transport layer in the OSI model. Examples of application data streams include, without limitation, HTTP communications, Common Internet File System (CIFS) communications, Network File System (NFS) communications, ICA communications, and File Transfer Protocol (FTP) communications. In one embodiment, the appliance 200 may be serving as a proxy or as a transparent proxy for a data stream containing the application data stream 700. For example, the appliance 200 may be serving as a transparent proxy for a TCP connection, wherein the payloads of the TCP packets comprise an application data stream.

An application data stream 700 may comprise a number of application layer protocol headers 710. Application layer protocol headers may comprise any sequence used by an application protocol to format, delineate, or carry information with respect to application data. Application layer protocol headers may occur anywhere within an application data stream, and anywhere within an application data object. The term application layer protocol header equally encompasses footers, trailers, and mid-object sequences. For example, a file access application, such as CIFS, may transmit portions of files interspersed with headers which indicate the size and location of the file data transmitted with the headers. Application layer protocol headers 710 may be delineated with special characters, formatting, and/or application-specific conventions. For example, an application layer protocol header 710 may contain a size field indicating the size of a following portion of application data 720. Following a sequence of application data 720 of the specified size may be another application layer protocol header 710.

Application data 720 may comprise any data other than the application layer protocol headers 710 transmitted for use by an application. Examples of application data 720 may include, without limitation, text, documents, files, images, objects, video streams, and audio streams. In one case, application data 720 may comprise a file which is being transmitted between two computing devices using FTP. In another case, application data 720 may comprise portions of a file being transmitted between two computing devices using CIFS. In a third case, application data 720 may comprise a file or data object to be used in a virtualized application. For example, a remote user may be accessing a word processing application provided by a central server. The central server may provide access to the application by transmitting a number of data objects including, without limitation, executable portions of the application, graphical data to be displayed to the user, and one or more document files.

After receiving the application data stream 700, the appliance may parse the application data stream 700 to identify the application layer protocol headers 710 and the application data 720. In one embodiment, the appliance may identify application layer protocol headers by utilizing a parsing engine or a portion of a parsing engine tailored for a given application. For example, an appliance may be programmed to specifically identify CIFS headers.

Once the application data 720 and application layer protocol headers 710 have been identified, the appliance 200 may then store the application data 720 in a sequential area of a compression history. In some embodiments, a sequential area of a compression history may comprise a physically contiguous region of memory. In other embodiments, a sequential area of a compression history may comprise a sequential area of a single compression history chunk. In still other embodiments, a sequential area of a compression history may comprise portions of a plurality of chunks that are logically sequential. For example, the application data 720 may be stored in a number of chunks, each chunk containing a pointer to the next chunk in the sequence. Or for example the application data 720 may be stored in a number of chunks scattered across a compression history, with an external data structure indicating the sequence of chunks including the application data 720.

In one embodiment, the appliance may not store the application layer protocol headers 710. In another embodiment, the appliance may store the application layer protocol headers 710 in a separate area of the compression history from the application data 720.

By storing the application data 720 sequentially in the compression history, the appliance may be able to achieve longer compression history matches if the identical application data is later transmitted via the appliance. Many application layer protocols utilize headers that may be unique to each transmission of application data. For example, application layer protocol headers may include information specific to a sender or recipient of the application data, or specific to a particular session in which application data is transmitted. By storing the application data sequentially and subsequently searching for compression history matches only with respect to the application data, longer matches may be found.

Although in the embodiment shown the application data 720 is stored in a sequential region of a compression history, in other embodiments the application data 720 may be stored in non-sequential regions of a compression history.

Figure 7B:
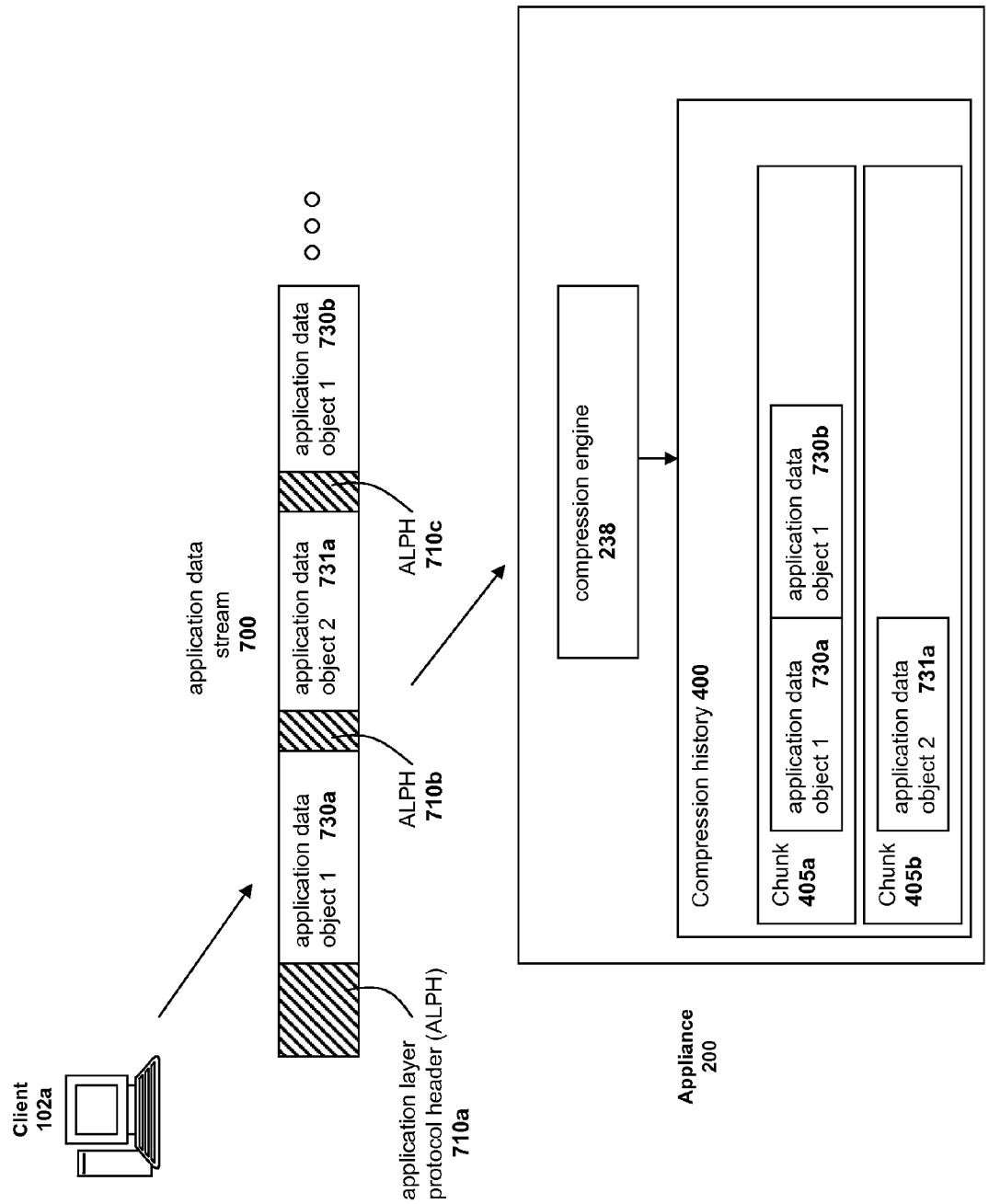
FIG. 7B is a block diagram illustrating a second embodiment of a technique for removing application layer protocol headers and from data stored in a compression history.

Referring now to FIG. 7B, a block diagram illustrating a second embodiment of removing application layer protocol headers and from data stored in a compression history is shown. In brief overview, an appliance receives an application data stream 700 comprising a plurality of application data objects 720, 721, which have been multiplexed over the application data stream 700, and are separated by application layer protocol headers 710. The appliance parses the application data stream 700 to identify the application data objects, and stores each application data object in a separate chunk of a compression history 400.

Still referring to FIG. 7B, now in greater detail, an application data object may comprise any discrete unit of application data. Examples of an application data object include, without limitation, a document, a file, an image, a video stream, and an audio stream. For example, an application may transmit a plurality of files via a single transport layer connection. Portions of the plurality of files may be interspersed with each other, and separated by application layer protocol headers which identify the files. In another example, a server may provide access to an application to a user. The server may transmit a number of objects comprising the application or objects used by the application over a single transport layer connection.

The appliance may use any information contained in the application data stream 700 to identify the application data objects 730, 731. In one embodiment, the appliance may parse one or more application layer protocol headers to identify the application data objects. In the embodiment shown, the appliance identifies that an application data object 730, has been split into two parts 730a, 730b for transmission. The appliance then stores the two parts 730a, 730b in a separate sequential regions of the compression history. Although FIG. 7B shows an appliance identifying two interspersed application data objects, in other embodiments an appliance may identify any number of interspersed application data objects. Also, although FIG. 7B shows an appliance storing the application data objects in separate chunks, in other embodiments the application data objects may be stored in the same chunk where the first object is stored in a first contiguous region of the chunk and the second application data object is stored in a second contiguous region of the chunk.

Storing application data objects in contiguous regions of a compression history may enable longer compression history to be found if the same application data object is again transmitted via the appliance. It may be unlikely that a given application data object is interspersed in the same way, and between the same other application data objects, as previously occurred. Thus while a given application data object 730 may be transmitted many times via a given appliance 200, a search for compression history matches based on the application data stream as transmitted may only yield matches as long as the application data object fragments 730a and 730b. By storing and parsing the application data objects as complete units, an appliance may be able to improve the length of subsequent compression history matches.

Figure 7C:
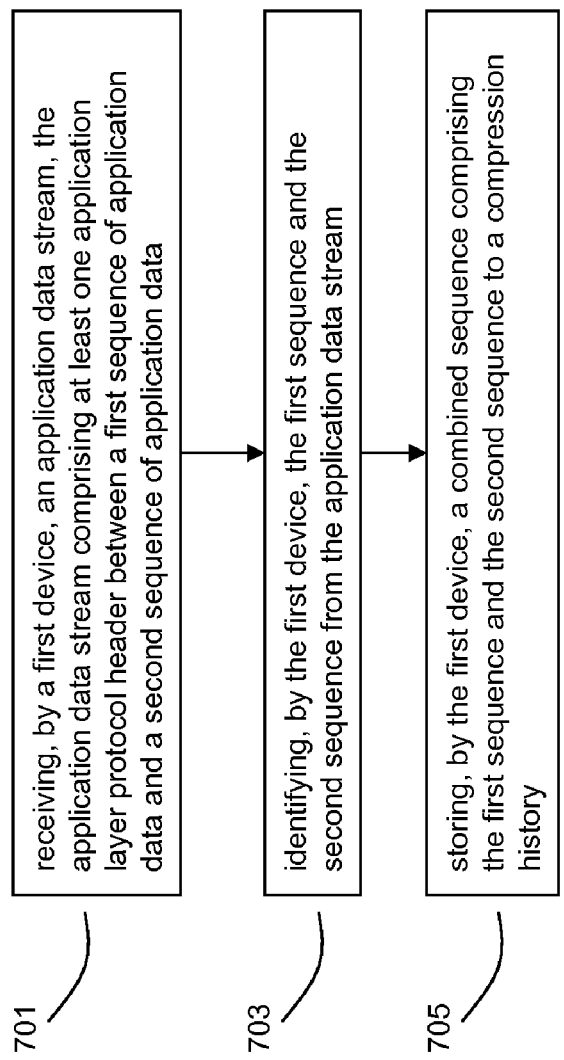
FIG. 7C is a flow diagram of one embodiment of a method for improving compression history matches by removing application layer protocol headers from compression history data.

Referring now to FIG. 7C, a flow diagram of one embodiment of a method for improving compression history matches by removing application layer protocol headers from compression history data is shown. In brief overview, the method comprises transmitting, between a first device and a second device, an application data stream, the application data stream comprising at least one application layer protocol header between a first sequence of application data and a second sequence of application data (step 701). The first device identifies the first sequence and the second sequence from the application data stream (step 703); and stores a combined sequence comprising the first sequence and the third sequence to a compression history (step 705).

Still referring to FIG. 7C, now in greater detail, the method shown comprises transmitting, between a first device and a second device, an application data stream 700, the application data stream 700 comprising at least one application layer protocol header 710 between a first sequence of application data 720 and a second sequence of application data 720 (step 701). The first and second devices may be any computing device 100. In one embodiment, the first and second devices may be appliances 200. In another embodiment, one or more of the first and second devices may be a client, server, client agent, or server agent. In one embodiment, the first and second devices may be WAN optimization devices. In another embodiment, the first and second devices may be serving as transparent proxies for a transport layer connection between a client and a server.

The first and second sequences of application data 720 may comprise any sequences of application data. Examples of sequences of application data include sequential portions of a file, data object, image, text, or document being transferred. For example, the first sequence of application data may comprise the first 5000 bytes of a portion of a file being transmitted via CIFS. The second sequence of application data may then comprise the next 5000 bytes of the file, the first and second sequences separated by a CIFS header.

In some embodiments, the first device may transmit a plurality of sequences of application data, with an application layer protocol header in between each sequence of application data. For example, two WAN optimization devices may be serving as transparent proxies for the connection between the client and server. The server may then transmit a 10 MB file to a client using NFS wherein the file is separated into 10 1 MB portions with each portion delineated by an NFS header.

The first device identifies the first sequence and the second sequence from the application data stream by any means (step 703). In one embodiment, the first device may parse one or more application layer protocol header. In another embodiment, the first device may parse one or more sequences of application data. The first device may identify any number of sequences of application data, separated by any number of application layer protocol headers. In some embodiments, the second device may similarly identify the first and second sequences of application data, so that the second device can synchronize its compression history with that of the first device. In other embodiments, the first device may transmit explicit notifications to the second device identifying the first and second sequences of application data.

The first device may then store a combined sequence comprising the first sequence and the second sequence to a compression history (step 705). The combined sequence may be stored to a logically or physically sequential region of the compression history. In other embodiments, the combined sequence may comprise any number of sequences of application data. The second device may also store a combined sequence comprising the first sequence and the second sequence to a compression history.

For example, two WAN optimization devices may be serving as transparent proxies for the connection between the client and server. The server may then transmit a 10 MB file to a client using NFS, wherein the file is separated into 10 1 MB portions, with each portion delineated by an NFS header. Each WAN optimization device may identify the portions of the file by parsing the NFS headers. Each WAN optimization device may then store the portions in a sequential region of their respective compression histories. In this manner, the file as a whole may be represented in the compression histories without the intervening protocol headers. The appliances may then be able to achieve longer compression history matches in the event that the file is transmitted again between the two devices.

Now referring to FIG. 7D, a flow diagram of a second embodiment of a method for improving compression history matches by removing application layer protocol headers from received data is shown. In brief overview, the method comprises receiving, by a first device, an application data stream, the application data stream comprising at least one application layer protocol header between a first sequence of application data and a second sequence of application data (step 751). The device identifies the first sequence and the second sequence from the application data stream (step 753); and determines that a combined sequence comprising the first sequence and second sequence matches a portion of a compression history (step 755). The device then transmits, to a second device, information identifying the matched portion of the compression history (step 757).

Still referring to FIG. 7D, now in greater detail, the method comprises receiving, by a first device, an application data stream, the application data stream comprising at least one application layer protocol header between a first sequence of application data and a second sequence of application data (step 751). The first device may comprise any of a client, server, client agent, server agent, appliance, WAN optimization appliance, and transparent proxy. The first device may receive the application data stream from any of a client, server, client agent, server agent, appliance, and WAN optimization appliance. In one embodiment, the first device may comprise a WAN optimization appliance receiving an application data stream from a server. In another embodiment, the first device may comprise a client agent receiving an application data stream from a client. The first device may be retransmitting some or all of the application data stream to a second device. In one embodiment, the first device may be serving as a transparent proxy for a client or server from which the first device is receiving the data.

The first device may then identify the first sequence and the second sequence from the application data stream (step 753). The first device may identify the first and second sequence using any technique described herein. In some embodiments, the first device may delay retransmitting the application data stream while the first device is identifying the first and second sequence. For example, upon receiving a CIFS stream, a WAN optimization device may wait to retransmit the stream until the appliance identifies one or more sequences of a file being transmitted via the stream so that the appliance can check for matches of the one or more of the file sequences within a compression history.

The first device may then determine that a combined sequence comprising the first sequence and second sequence matches a portion of a compression history (step 755). In some embodiments, first device appliance may determine the match by using a fingerprinting method and/or a compression index as a described herein. In other embodiments, the first device may use run length extension to determine the match. For example, upon finding a match to an initial part of the first sequence of data, the first device may do a byte by byte comparison of the received application data stream with the matched portion of the compression history, but omitting any application layer protocol headers from the byte by byte comparison. The matching portion of the compression history may have been stored using the method described with respect to FIG. 7C.

The first device may then transmit to a second device, information identifying the matched portion of the compression history (step 757). In one embodiment, information identifying the matched portion of the compression history may comprise a chunk identifier, a chunk identifier plus an offset, and/or a memory address. The second device may then reconstruct the application data stream using a corresponding portion of a compression history.

As an example of the above method, the first and second devices may be WAN optimization devices serving as proxies for a transport layer connection between a client and a server, with the first device on the server side, and the second device on the client side. The first WAN optimization device may receive a CIFS stream comprising a file spread out over a number of sequences separated by CIFS headers. The first device identifies that the file has been previously transmitted between the first and second devices by identifying the sequences of the file, and using run length expansion to match the file sequences to a sequential area of the compression history of the first device. The first device may then transmit a chunk identifier to the second device identifying the matching portion of the compression history, along with the CIFS headers. The second device may then access the portion of the compression history on the second device corresponding to the chunk identifier. The second device can then reconstruct the stream from the server by inserting the appropriate file sequences from the compression history of the second device between the CIFS headers received from the first appliance. The second device may then transmit the decompressed stream to the client.

G. Systems and Methods for Synchronizing Expiration of Shared Compression History Data This section describes techniques and devices for synchronizing compression histories shared between two devices. By maintaining a prioritized list of data portions in a compression history, and then transmitting the number of data portions in the list to the other device, two devices may maintain at least rough synchronization of compression history contents. This may result in the benefit of fewer instances where a device compresses data using a reference to a data portion not held by the recipient's compression history. This also may allow a device to more efficiently delete unusable or unlikely to be used data portions from a compression history.

Figure 8A:
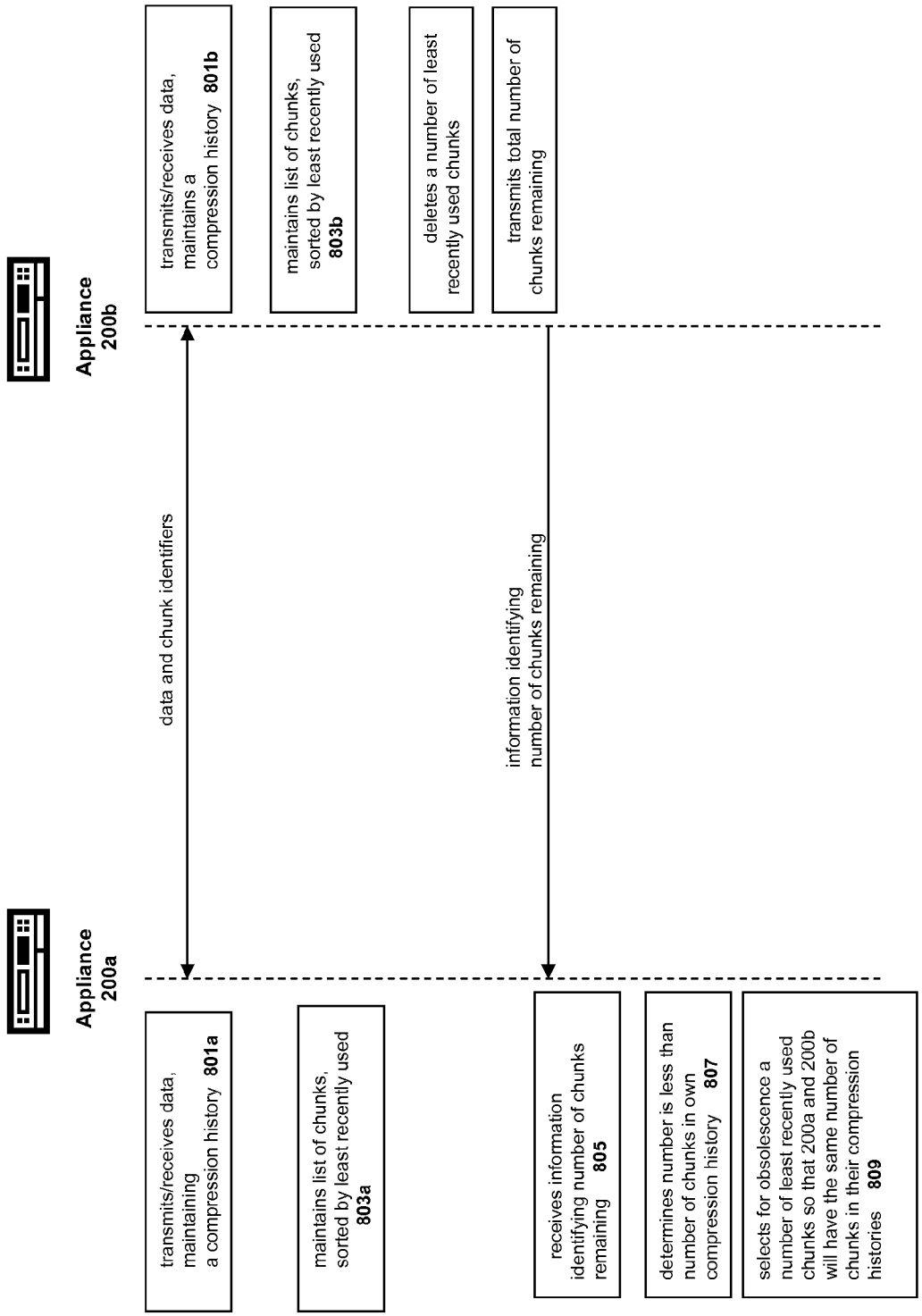
FIG. 8A is a block diagram of one embodiment of a system for synchronizing compression histories shared between two devices.
Figure 8B:
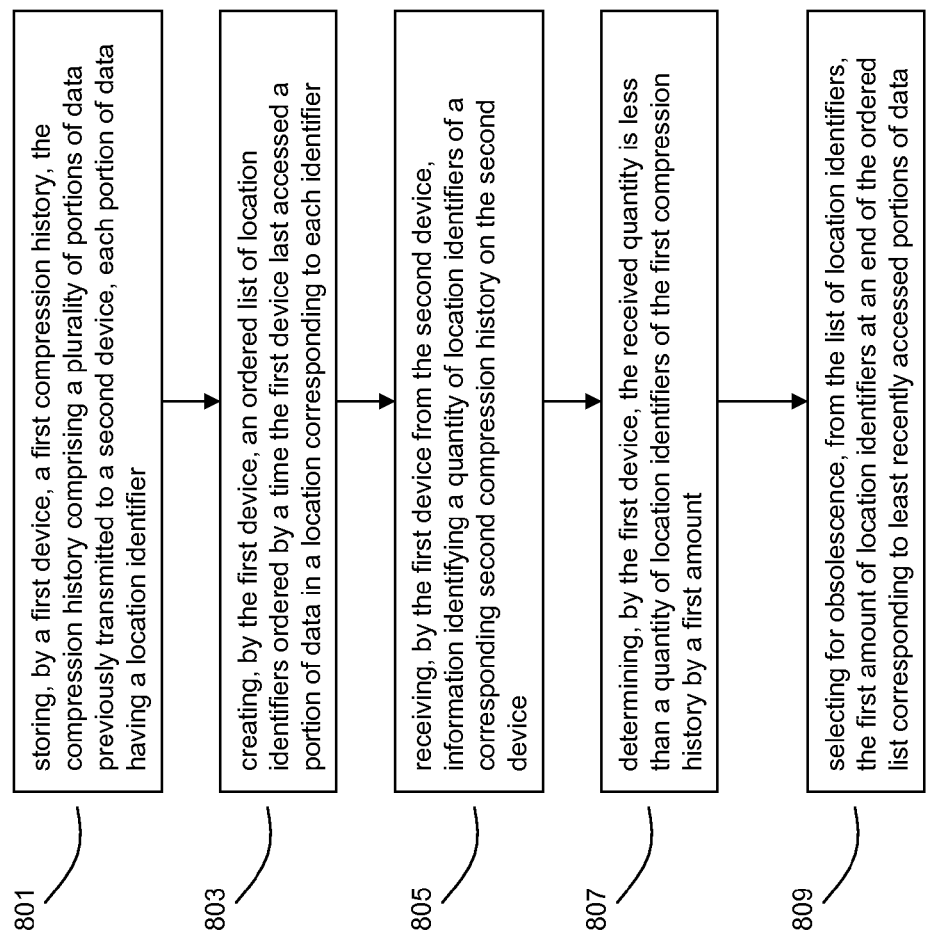
FIG. 8B is a flow diagram of a method for synchronizing compression histories shared between two devices.

Now referring to FIGS. 8A and 8B, a method for synchronizing compression histories shared between two devices is shown. In brief overview, the method comprises: storing, by a first device, a first compression history, the compression history comprising a plurality of portions of data previously transmitted to a second device, each portion of data having a location identifier (step 801). The first device may then create an ordered list of location identifiers ordered by a time the first device last accessed a portion of data in a location corresponding to each identifier (step 803). The second device may then delete one or more portions of data, and transmit the quantity of the remaining number of portions to the first device. The first device receives, from the second device, information identifying a quantity of location identifiers of a corresponding second compression history on the second device (step 805); and determines the received quantity is less than a quantity of location identifiers of the first compression history by a first amount (step 807). The first device may then select for obsolescence, from the list of location identifiers, the first amount of location identifiers at an end of the ordered list corresponding to least recently accessed portions of data (step 809). The first and second devices may comprise any of a client, server, client agent, server agent, appliance, WAN optimization device, and/or transparent proxy.

Still referring to FIGS. 8A and 8B, now in greater detail, the method shown comprises: storing, by a first device, a first compression history, the compression history comprising a plurality of portions of data previously transmitted to a second device, each portion of data having a location identifier (step 801). This compression history may be created and stored by any method, including all the method described herein. In one embodiment, the portions of data may comprise chunks 405, and the location identifiers may comprise chunk identifiers and/or chunk identifiers and offsets. The creation of the first compression history may be synchronized with the creation of a second compression history on a second device.

The first device may then create an ordered list of location identifiers ordered by a time the first device last accessed a portion of data in a location corresponding to each identifier (step 803). The ordered list may comprise any data structure which allows the representation of ordering, including without limitation an array, tree, heap, or linked list. The ordered list may be stored in any manner, including on a disk, in memory, or in any combination. For example, a long ordered list may be stored on a disk, with active portions of the list being transferred into RAM.

In one embodiment, the time last accessed of a given portion of a compression history may represent the time the portion was last used to compress a data stream. In another embodiment, the time last accessed may represent the time the portion was created. In still another embodiment, the time last accessed may represent the time the portion was last used to compress a data stream transmitted to a given device. In this embodiment, a device may maintain a separate ordered list for each of a plurality of devices to which the device transmits compressed data. In some embodiments, a device may also maintain a count of the number of location identifiers in a given ordered list.

In one embodiment, a device may maintain the ordered list by moving a location identifier corresponding to a portion of the compression history to the front of the list each time the portion of the compression history is accessed. As the device creates a new portion of a compression history, the device may also place the location identifier for the new portion at the front of the list. For example, a device may initially create a compression history comprising data portions A, B, C, D, E, F, G, H, I, and J. The ordered list may then be J, I, H, G, F, E, D, C, B, A, reflecting the order the portions were created, with J being the most recent. If the device then receives and compresses data comprising data from portion F, the device may reorder the list to F, J, I, H, G, E, D, C, B, A. If the device then creates a new portion, K, the list may again be updated to K, F, J, I, H, G, E, D, C, B, A. If the device then receives and compresses data from portions C and D, the list may again be updated to D, C, K, F, J, I, H, G, E, B, A.

The device may also maintain the ordered list by moving, to the end of the list a location identifier corresponding to a data portion if the device receives an indication that the data portion is corrupt. The device may also move to the end of the list a location identifier corresponding to a data portion if the device receives an indication that the data portion is no longer stored in a corresponding compression history on the second device. For example, the first device may attempt to compress a data stream by replacing a given data portion with a reference to an identical portion of data in the compression history. The first device may then receive an error message from the recipient indicating that the recipient does not have the data portion in its corresponding compression history, possibly because it was deleted to make room for more recently transmitted data portions. The first device may then move the location identifier corresponding to the data portion to the end of its ordered list.

The first device may receive, from the second device, information identifying a quantity of location identifiers of a corresponding second compression history on the second device (step 805). This information may be received by any means. In some embodiments, the information may be received via a control protocol used between the first and second devices. In one embodiment, the information may be received upon establishment and/or termination of communications with the second device. For example, upon establishing of communications between two WAN optimization devices, each may transmit the total number of chunks in a compression history corresponding to the other device. In another embodiment, the information may be encoded within another data stream transmitted between the two devices.

The first device may then determine the received quantity is less than a quantity of location identifiers of the first compression history by a first amount (step 807). For example, the first device may receive an indication that the second device has a total of 1546 chunks in its compression history corresponding to the first device. The first device may then identify that it has a total of 1613 chunks in its compression history corresponding to the second device. In this example, the received quantity is less than the local quantity by 67 chunks. A discrepancy in chunk amounts may be caused by any factor, including differences in available disk spaces, corruption of one or more data portions, or differing software versions.

The first device may then select for obsolescence, from the list, the first amount of location identifiers corresponding to the least recently used portions of data (step 809). For example, if the first device's ordered list of chunks was the list D, C, K, F, J, I, H, G, E, B, A from the example above, and the first device received an indication that the second device only had 8 chunks in its corresponding compression history, the first device may select the chunks E, B and A for obsolescence.

In some embodiments, the first device may then deactivate, delete, or otherwise remove the selected location identifiers from the ordered list. In one embodiment, the first device may also then deactivate, delete, or otherwise remove the data portions corresponding to the selected location identifiers. In some embodiments, the first device may deactivate a data portion from a compression history only with respect to a single device, but keep the data portion active with respect to other devices.

The above method may also be coupled with a general policy of always deleting the least recently used compression history data portions when portions need to be deleted. For example, a WAN optimization device located at a central office may be used to accelerate and compress communications with a number of WAN optimization devices located at branch offices. The WAN optimization device at the central office may run out of disk space for compression histories before any of the branch office devices, since the central office device must maintain a compression history corresponding to each of the branch office devices. As the central office device transmits data to a branch office device A, the central office device may be forced to delete a number of portions of data in one of its compression histories to make room for the new portions of data being written to the compression history. In some cases, the central office device may delete portions from the compression history corresponding to device A. In other cases, the central office device may delete portions from a compression history corresponding to a different branch office device. However, the central device may choose to delete the least recently used portions of data from whichever compression history it chooses to delete portions from. Then, at a later time, the central device may transmit the total number of portions remaining in the compression history from which the portions were deleted. The device receiving the updated total number may then use the above method to delete the least recently used portions of data, enabling the compression histories on the central and branch office devices to be at least approximately synchronized.

H. Systems and Methods for Leveraging Shared Compression Histories and Caches Across More than Two Devices By transmitting portions of compression histories and/or compression history indexes between devices, the benefit of efficient compression of data previously transmitted can be extended beyond the two devices making the initial transmission. To use a simple example, if device A transfers to device B a compression history corresponding to device C, devices C and B can now communicate with the ability to compress data previously transmitted between C and A. The following section discusses systems and method for leveraging compression histories to provide compression between devices other than the original transmitters.

Figure 9A:
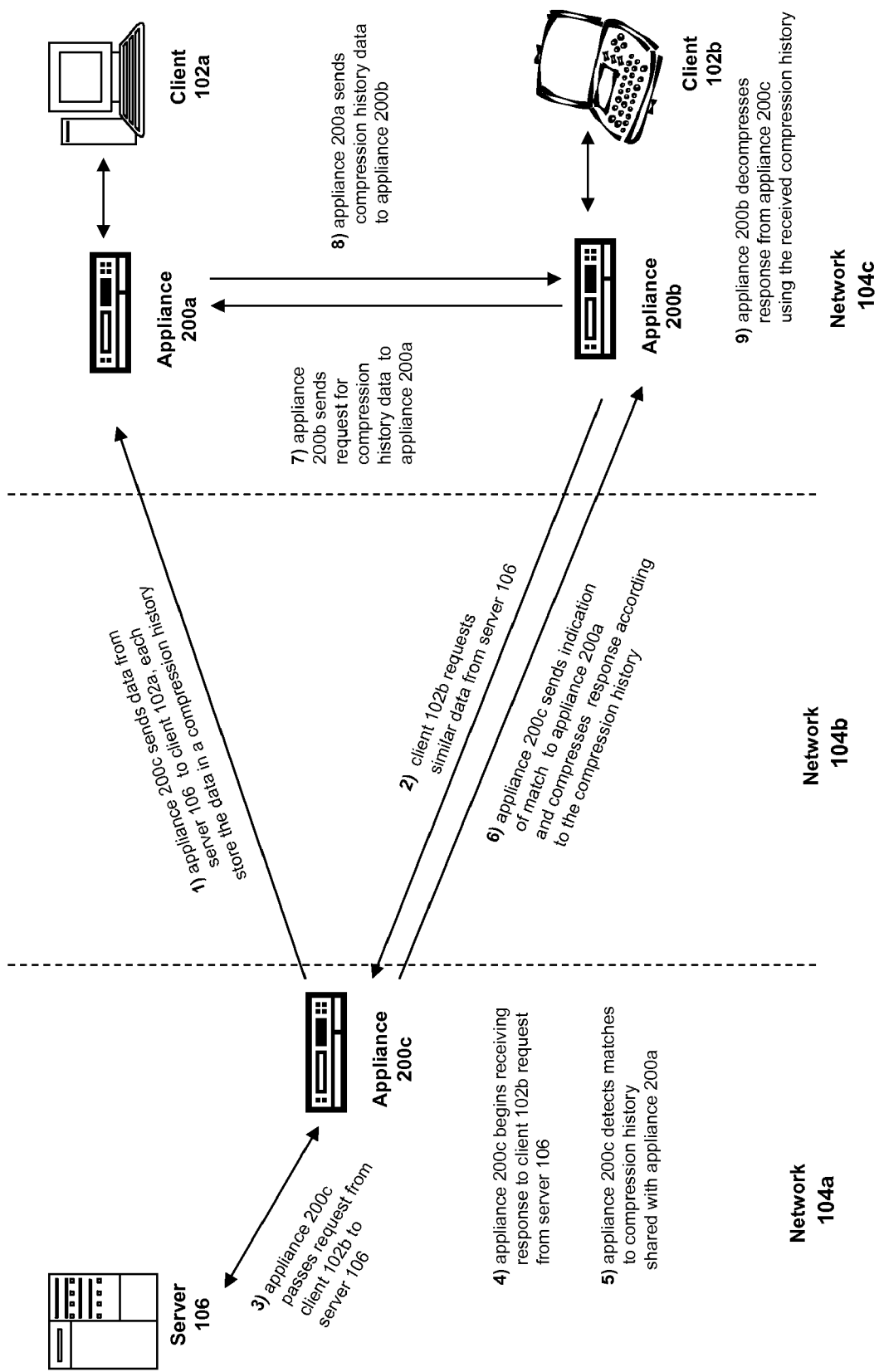
FIG. 9A is a block diagram illustrating one embodiment of sharing compression histories among a plurality of devices.

Referring now to FIG. 9A, a block diagram illustrating one embodiment of sharing compression histories among a plurality of devices is shown. In brief overview, an appliance 200c transmits data to an appliance 200a across a low performance network 104b. The appliance 200c then receives a request for similar data from another appliance 200b. As appliance 200c receives the response to the request, the appliance may detect a match with the data stored in the compression history that was transmitted to appliance 200a. Appliance 200c then sends an indication of the match to appliance 200b. This indication may take the form of compressing the response according to the compression, and using location identifiers which point to appliance 200a. Appliance 200b may then request the matched data from a compression history maintained by appliance 200a. After appliance 200b receives the requested data from appliance 200a, appliance 200a may then decompress the data received from appliance 200a and send it to the client 102b.

Still referring to FIG. 9A, now in greater detail, a number of appliances 200a, 200b, 200c communicate over a number of networks 104a, 104b, 104c. In some embodiments, the appliances may be WAN optimization devices, and network 104b may comprise a WAN. In other embodiments, the appliances may be serving as transparent proxies for communications between a number of clients 102a, 102b and a server 106. The server may be on a LAN 104a with the appliance 200c. The two appliances 200a, 200b may be on a LAN with the one or more clients 102a, 102b. In one embodiment, the appliance 200c and server 106 may be located in a central office, and the appliances 200a, 200b and clients 102a 102b may be located in one or more branch offices. Although FIG. 9A depicts appliances, the systems and methods described with respect to FIG. 9A may apply equally to clients, client agents, servers, and server agents. For example, one or more of appliances 200a or 200b may be replaced in FIG. 9A by a client agent 120 executing on a client.

In the embodiment shown, the appliance 200c transmits data from the server 106 to the appliance 200a. This data may be sent in the course of responding to a request from the client 102a for the data from the server 106. Although FIG. 9A depicts the data as being sent from a server, the data may come from any other source, including another appliance or a cache in appliance 200c. As the data is being transmitted from the appliance 200c to the appliance 200a, the two appliances may store copies of the data in their respective compression histories. In one embodiment, the appliances may store a record along with the stored data indicating the appliance to which the data was transmitted. For example, the data may be stored in a chunk in the compression history of appliance 200c, where the chunk contains an indicator that the data in the chunk was transmitted to appliance 200a.

Appliance 200c may then receive a request from appliance 200b for the server 106. The request may originate from a client 102b. In another embodiment, the request may originate from the same client 102a as the previous data. This embodiment may be applicable where more than one WAN optimization device is used to provide access for a given branch office or set of clients. The appliance 200c passes the request to the server 106. In other embodiments, the appliance may pass the request to any other computing device, or service the request using an internal cache.

As the appliance 200c receives the response to the request from the server 106, the appliance may detect one or more compression history matches corresponding to the received data. The appliance may detect these matches using any method, including any of the fingerprinting and indexing methods described herein. The appliance may then determine that the matches correspond to data previously transmitted to appliance 200a.

The appliance 200c may then begin transmitting the data stream received from the server to appliance 200b compressed according to the compression history shared with appliance 200a. In some embodiments, the appliance 200c may determine that network 104b is sufficiently low-performance with respect to network 104c that transmission of the requested data to appliance 200b will be faster if it is compressed using the compression history from appliance 200a. In other embodiments, the appliance 200c may have no information about the performance of the networks 104b, 104c but still transmit the indication to appliance 200b in the hopes that the transmission will be improved. In either of these embodiments, appliance 200c may also begin transmitting the requested data to appliance 200b in uncompressed form in case that appliance 200a is unavailable or no longer has the requested data in its compression history.

Appliance 200b, after receiving the compressed data stream, may then request the indicated portions of the compression history from appliance 200a. In some cases, appliance 200b may request a number of subsequent compression history chunks.

After appliance 200a receives the request for the matching portions of compression history, appliance 200a may then transmit the requested portions of data to the appliance 200b. In one embodiment, appliance 200b may then store the received portions in compression history used to accelerate communications between appliance 200b and appliance 200c.

In another embodiment, rather than sending a compressed data stream directly to appliance 200b, appliance 200c may transmit a request to appliance 200a to serve as an intermediary for the connection between appliance 200c and appliance 200b. Appliance 200c may then begin transmitting the requested data stream to 200a, using the previous compression history to accelerate the transmission. Appliance 200a may then forward the data stream to appliance 200b.

Figure 9B:
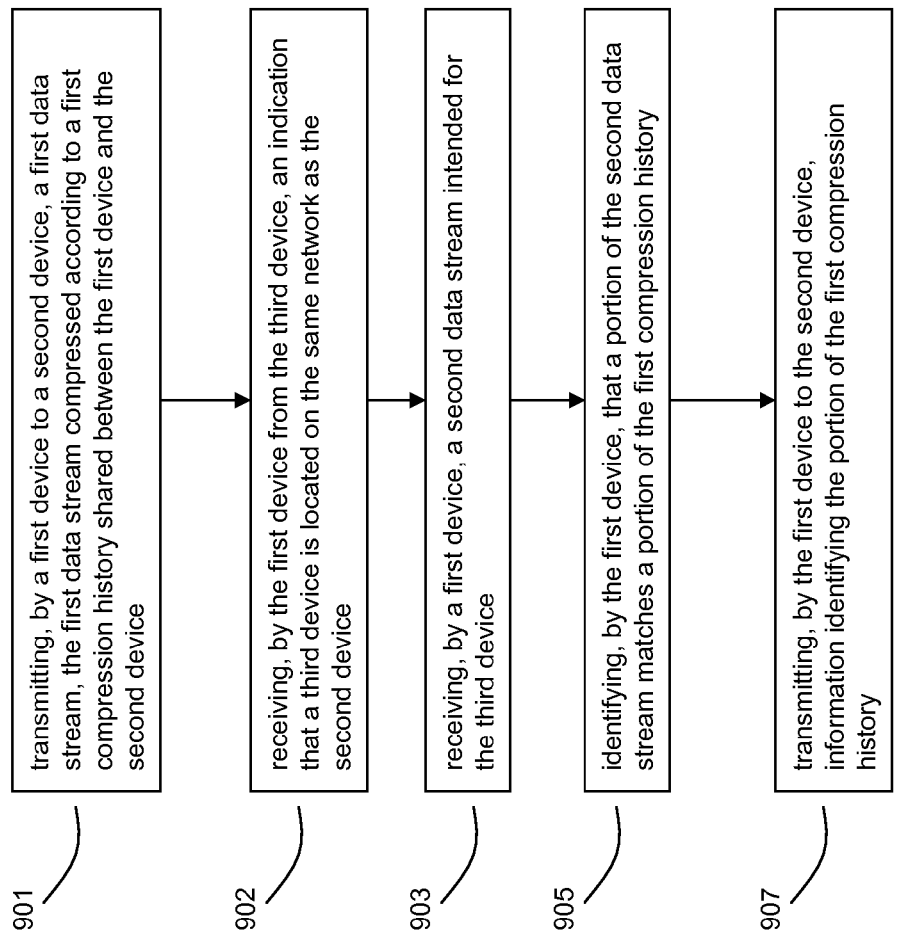
FIG. 9B is a flow diagram of one embodiment of a method for sharing compression histories among a plurality of devices to improve compression of data transmitted via a plurality of connections.

Now referring to FIG. 9B, a flow diagram of one embodiment of a method for sharing compression histories among a plurality of devices to improve compression of data transmitted via a plurality of connections is shown. In brief overview, a first device transmits, to a second device, a first data stream, the first data stream compressed according to a first compression history shared between the first device and the second device (step 901). The first device may receive, from the third device, an indication that a third device is located on the same network as the second device. The first device receives a second data stream intended for the third device (step 903). The first device identifies that a portion of the data stream matches within a predetermined threshold a portion of the first compression history (step 905); and transmits, to the third device, information identifying the portion of the first compression history (step 907). The first, second and third devices may be any of a client, server, client agent, server agent, appliance, WAN optimization device, and/or transparent proxy. In one embodiment, this method may reflect steps performed by the appliance 200c in FIG. 9A.

Still referring to FIG. 9B, now in greater detail, the method comprises transmitting, between a first device and a second device, a first data stream, the first data stream compressed according to a first compression history shared between the first device and the second device (step 901). In one embodiment, the data stream may be transmitted from the first appliance to the second appliance. In another embodiment, the data stream may be transmitted from the second appliance to the first appliance. The data stream is compressed according to a compression history shared by the first and second devices. This compression may be performed by any manner, including any described herein, and the compression history may comprise any compression history, including any compression history described herein. In one embodiment, the shared compression history may already contain one or more data portions contained in the first data stream. In some cases, the data may transmitted uncompressed if no matches are found for the data in the shared compression history. The shared compression history may be updated to include one or more data portions contained in the first data stream not already in the first compression history.

The first device may receive an indication that a third device is on the same network as the second device in any manner (step 902). The first device may receive the indication from any source. In some embodiments, the first device may receive the indication from the second or third device. In other embodiments, the first device may receive the indication from another device. In still other embodiments, the first device may be manually configured with the indication.

In one embodiment, upon establishing a connection between two devices, each device may send the other information identifying one or more other devices on the same network. For example, on startup, an appliance may automatically discover, using any network techniques, other appliances residing on a LAN or otherwise clustered with the appliance. Each appliance may, on startup, identify the other appliances located in the same cluster.

In one embodiment, appliances in the same cluster may exchange information identifying a range of chunk identifiers corresponding to compression history portions held by each device. In another embodiment, appliances in a cluster may exchange information identifying the disks held by each appliance. In this manner, each appliance in a cluster may be able to identify whether a given location identifier or chunk identifier corresponds to a compression history located on another appliance in the cluster. For example, in the case where chunk identifiers are created by appending a serial number to a globally unique disk identifier, each appliance may send to other appliances in a cluster the identifier for each disk of the appliance and a range specifying valid serial numbers for each disk identifier. In this manner, when an appliance in a cluster receives a chunk identifier, the appliance may be able to check the disk identifier contained within the chunk identifier to determine whether the disk is held by an appliance in the cluster.

After this discovery step, when the appliance establishes a connection with any other appliance or client agent, the appliance may transmit a list of the appliances locally clustered with the appliance. The appliance may also receive, upon establishing the connection, a list of appliances or client agents on a LAN or otherwise clustered with the connection recipient. In this manner, each appliance or client agent in communication with another appliance or client agent may know the identities of any other appliances or client agents local to the other appliance or client agent. In other embodiments, any or all of this discovery of clustered devices may be accomplished via manual configuration.

To give a detailed example, a central office may use a cluster of WAN optimization appliances to communicate with a number of branch offices, each branch office also having a cluster of WAN optimization devices. When an appliance from the central office establishes a connection with an appliance at a branch office, the central office appliance may transmit to the branch office appliance information identifying the other appliances located in the central office cluster. The branch office appliance may also transmit to the central office appliance information identifying the other appliances located in the branch office cluster. Along with this identifying information, the appliances may exchange any other information relating to other appliances in their respective clusters, including IP addresses, capacity, performance, disk identifiers, and configuration information.

The method shown then comprises receiving, by a first device, a data stream intended for the third device (step 903). The first device may receive the data stream from any source, including a client 102, server 106 or client agent 120. In one embodiment, the data stream may comprise a response from a server 106 to a client request. For example, the first device may be serving as a transparent proxy to a TCP connection between a client and a server, and the data stream may comprise a response to an HTTP request by the client. Or, for example, the data stream may comprise an ICA stream from an application server to a client agent.

The first device then identifies that a portion of the data stream matches a portion of the first compression history (step 905). The first device may identify the matching using any technique, including any of the fingerprinting and indexing techniques described herein. In one embodiment, the first device may identify that one or more shingles of the data stream match portions of chunks stored in the first compression history. For example, a chunk comprising the matched portion may have a header indicating that the data was sent to the second device. Or for example, a compression index entry may indicate that the matching portion of data was transmitted to the second device. After determining that the matched portion of data is held by a compression history not shared with the intended recipient, the first device may determine that the matched portion of data is held by a compression history shared with an appliance or other device in a cluster with the intended recipient.

In one embodiment, the first device may determine that a portion of the data stream matches within a predetermined threshold a portion of the first compression history. The predetermined threshold may comprise any amount, percentage, or distribution of data. In one embodiment, the predetermined threshold may comprise a minimum number of bytes. For example, the first device may identify that at least 64 bytes of the data stream matches a portion of the first compression history. A minimum number of bytes may be any number of bytes, including 4, 8, 16, 32, 64, 128, 256, 512, 1024, 2048, and 3072 bytes. In some embodiments, the predetermined threshold may require that a minimum number of matching bytes be sequential. In other embodiments, the predetermined threshold may require that a minimum number of matching bytes be found at a given distribution throughout the data stream. For example, a predetermined threshold might require that at least 50 out of three consecutive 100 byte sequences match. Or a predetermined threshold might require that at least three different matching sequences of at least 64 bytes be found. In some embodiments, the predetermined threshold may require that the matching portions of the compression history are sequential. For example, the predetermined threshold may require that a sequence of at least 128 bytes matches a consecutive sequence of 128 bytes in the first compression history. In some embodiments, the first device may use a technique such as the ones described with respect to FIGS. 5B and 6B to efficiently determine the existence of any long sequential matches. In still other embodiments, the predetermined threshold may require that a certain percentage of the data stream matches data in the first compression history. For example, the predetermined threshold may require that 85% of a first number of bytes of the data stream match the first compression history.

In one embodiment, the predetermined threshold may be set automatically by the first device. In other embodiments, the predetermined threshold may be manually configured. In some embodiments, the predetermined threshold may be calibrated to take into account the potential overhead of using compression history chunks not held by the destination device, but rather the result of a successful transfer of compression history data. For example, the predetermined threshold may be lowered in response to slower performance of the network 104*b*. Or the predetermined threshold may be raised as the performance of the network connecting the first device to the second and third devices becomes faster. In another example, the predetermined threshold may be lower if the bandwidth of the connection between the first and third devices is substantially lower than the bandwidth of the connection between the second and third devices. In some embodiments, the predetermined threshold may comprise the same threshold for compression using a compression history shared with the intended recipient of the data stream. In other embodiments, the predetermined threshold may be higher for cases in which the matching portion or portions are not held by the intended recipient, but instead held by a device clustered with the intended recipient of the data stream.

The first device may then transmit, to the third device, information identifying the matching portion of the first compression history (step 907). In one embodiment, this step may comprise transmitting the data stream to the third device compressed according to the matching portions of the first compression history. The first device may perform this compression according to the matching portions of the first compression history in any manner. In one embodiment, the first device may replace portions of the data stream with location identifiers identifying the matching portions of the first compression history. In this embodiment, the first device may also compress the data stream using any other techniques, including without limitation additionally compressing the data stream according to a second compression history shared between the first device and third device. In one embodiment, this step may comprise transmitting one or more chunk identifiers to the third device. In another embodiment, this step may comprise transmitting one or more location identifiers to the third device. In one embodiment, the first device may also transmit information identifying the second device.

In one embodiment, the first device may also include location identifiers of one or more portions of the first compression history that are subsequent to the identified matching portions. The first device may include these portions based on a speculation that the subsequent portions will also match subsequent portions of the second data stream. In some embodiments, the number of subsequent portions the first device identifies may be determined by the quality or quantity of the found matches.

After the third device receives the data stream compressed according to the first compression history, the third device may transmit, to the second device, a request for the identified portions of the first compression history. These portions may then be transmitted from the second device to the third device using any means and any protocol. In some embodiments, the third device may then signal to the first device that it has received one or more portions of the compression history. In other embodiments, the third device may transmit an indication to the first device that the identified portions of the compression history cannot be obtained, which may occur if the second device is inoperable or busy. In these cases, the first device may then retransmit the data stream to the third device without compressing it according to the first compression history.

Figure 9C:
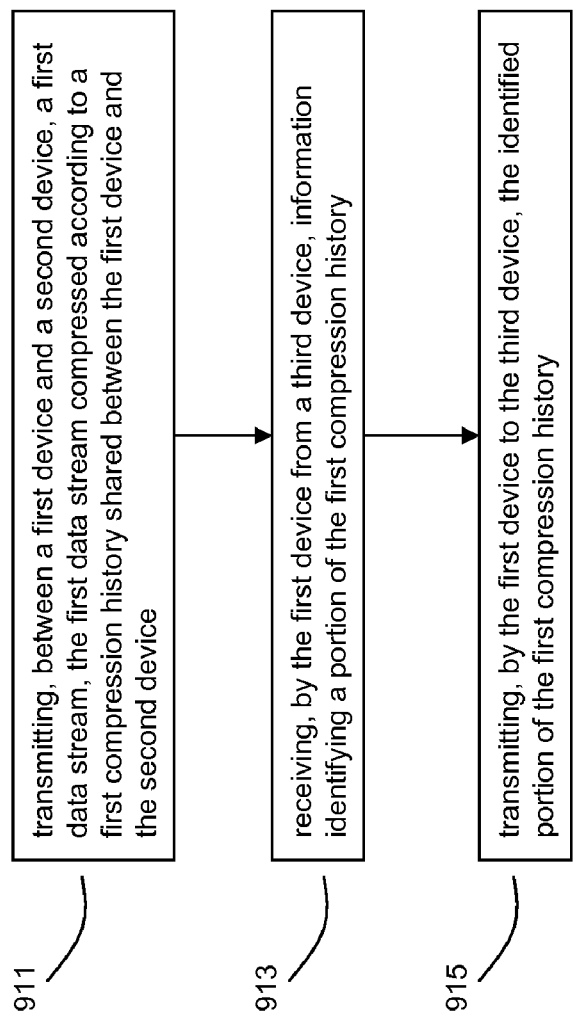
FIG. 9C is a flow diagram of a second embodiment of a method for sharing compression histories among a plurality of devices to improve compression of data transmitted via a plurality of connections.

Referring now to FIG. 9C, a flow diagram of a second embodiment of a method for sharing compression histories among a plurality of devices to improve compression of data transmitted via a plurality of connections is shown. In brief overview, the method comprises transmitting, between a first device and a second device, a first data stream, the first data stream compressed according to a first compression history shared between the first device and the second device (step 911). The first device receives information identifying a third device and a portion of the first compression history (step 913) and transmits, to the third device, the identified portion of the first compression history (step 915). The first, second and third devices may be any of a client, server, client agent, server agent, appliance, WAN optimization device, and/or transparent proxy. In one embodiment, this method may reflect steps performed by the appliance 200*a* in FIG. 9A.

Still referring to FIG. 9C, now in greater detail, the method comprises transmitting, between a first device and a second device, a first data stream, the first data stream compressed according to a first compression history shared between the first device and the second device (step 911). This step may correspond to step 901 of the previous method, and may be performed according to any of the embodiments discussed herein. The first device may be either the sender or the recipient of the first data stream.

The first device may then receive, from a third device, information identifying a portion of the first compression history (step 913). In some embodiments, the received information may comprise any of the information transmitted according to step 907 of the previously discussed method. In one embodiment, the information may also comprise a request to transmit the identified portion to the third device. In another embodiment, the information may identify a plurality of portions of the first compression history to transmit to the third device. In another embodiment, the first device may receive a number of chunk identifiers. In still another embodiment, the first device may receive a location identifier and a byte count indicating a number of bytes following the location identifier to transmit to the third device.

In some embodiments, the first device may receive a plurality of transmissions from the third device with information identifying a third device and a portion of the first compression history. For example, the second device may be transmitting a long data stream to the third device, and continually be identifying portions of the data stream which match portions of the first compression history and compressing the stream accordingly. As the third device receives each location identifier in the place of data from the data stream, the third device may request the identified portion or portions of the first compression history from the first device. The third device may then reconstruct the data stream using the requested portions of the first compression history.

The second device may then transmit, to the third device, the identified portions of the first compression history (step 915). The second device may transmit these portions of the first compression history using any protocol or protocols. In some embodiments, the second device may transmit a plurality of identified portions at once. In other embodiments, the second device may transmit a plurality of identified portions in a sequence.

Referring now to FIG. 9D, a flow diagram of a third embodiment of a method for sharing compression histories among a plurality of devices to improve compression of data transmitted via a plurality of connections is shown. In brief overview, the method comprises a first device receiving, by a first device from a second device, a data stream, the data stream compressed according to a compression history shared between the first device and a third device (step 921). The first device identifies the third device (step 923) and transmits, to the third device, a request for a portion of the compression history (step 925). The first device receives, from the third device, the requested portion of the compression history (step 927). The first device may then decompress the data stream (step 929) and transmit the decompressed stream to the client (step 931). The first, second and third devices may be any of a client, server, client agent, server agent, appliance, WAN optimization device, and/or transparent proxy. In one embodiment, this method may reflect steps performed by the appliance 200*b* in FIG. 9A.

Still referring to FIG. 9D, now in greater detail, a first device receives, from a second device, a data stream, the data stream compressed according to a compression history shared between the first device and a third device (step 921).

This step may be performed according to any embodiment described herein. In some embodiments, this step may correspond to receiving a compressed data stream transmitted according to step 907 of the method in FIG. 9B. In one embodiment, the first device may receive a data stream comprising a number of location identifiers, where the location identifiers identify portions of data to be inserted into the data stream.

The first device may identify the third device in any manner (step 923). In one embodiment, the third device may be on a LAN or otherwise clustered with the first device. The first device may use any of the discovery techniques and clustering techniques described herein to identify the third device. In some embodiments, the first device may identify the third device by determining a disk identifier included in a chunk identifier in the data stream corresponds to a disk held by the third device. In another embodiment, the first device may determine that a location identifier contained in the data stream falls within a range of location identifiers advertised by the third device.

The first device may then transmit, to the third device, a request for a portion of the compression history (step 925). The request may be transmitted via any protocol or protocols. In some embodiments, the request may request a plurality of portions of the compression history. In some embodiments, the first device may transmit a separate request for each of a number of identifiers received in the data stream. In another embodiment, the first device may include more than one identifier in a single request. In some embodiments, the first device may request one or more portions of the compression history subsequent to the identified portions. For example, if the first device receives a data stream comprising a chunk identifier identifying a chunk held by the third device, the first device may transmit to the third device a request for the identified chunk as well as one or more subsequent chunks. This may be based on a likelihood that subsequent matches will occur and include the subsequent chunks. Or, for example, if the first device receives a data stream comprising a location identifier identifying 212 bytes of a chunk held by the third device, the first device may transmit to the third device a request for the identified bytes as well as a number of subsequent bytes from the chunk. The number of subsequent bytes requested may be determined in any manner, including without limitation based on a number or length of previous matches.

The first device may then receive, from a third device, the requested portion of the compression history (step 927). The portion may be received via any protocol or protocols. In one embodiment, the portion may be received as a result of the third device performing step 915 of the previously described method. In some embodiments, the first device may receive a plurality of portions of the compression history. In some embodiments, the first device may receive entire chunks of the compression history. For example, in response to a request for 514 bytes of a chunk, the first appliance may receive the entire chunk containing the requested bytes. In other embodiments, the first device may receive a portion of a chunk. The first device may also receive any additional information with the requested portion of the compression history, including without limitation any information contained in a chunk header or compression index corresponding to the requested portion.

In some embodiments, after receiving the requested portion of the compression history, the first device may then insert the portion of the second compression history into one or more compression histories on the first device (step 925). This insertion may be done by any means. In some embodiments, this step may comprise incorporating one or more chunks received from the third device into the a compression history shared with the second device. In one embodiment, the insertion may be done temporarily, and the chunks may be removed or deactivated after completion of their use. In another embodiment, the insertion may be such that the portions are incorporated into the first compression history as though they had been created in the normal course of transmitting data to or from the second device.

In some embodiments, the first device may transmit an indication to the second device upon successfully receiving the portion from the third device. This indication may serve to notify the second device that it may begin or continue compressing the second data stream according to the portions of the second compression. In some embodiments, the first device may transmit an indication to the second device if the requested portions were not received from the third device. This indication may server to instruct the second device to not use portions of data from the compression history to compress the data stream. The second device may also, in response to the indication, retransmit one or more portions of the data stream.

After receiving, the requested portion of the compression history, the first device may decompress the received data stream (step 927). This decompression may be done in any manner. In one embodiment, the first device may replace a number of location identifiers with portions of data identified by the location identifiers. The first device may use any number of decompression methods. For example, the first device may first decompress the data stream using a run-length decompression method, and then decompress the data stream further by using the received portions of compression history data. In some embodiments, the first device may also use portions of data from a locally stored compression history to decompress the data stream.

After decompressing the data stream, the first device may transmit the data stream to a client (step 929). In other embodiments, the first device may transmit the data stream to any other device, including a client, server, or appliance.

In some embodiments, the method described can be applied continuously over the course of servicing one or more requests. For example, a client at a branch office may be accessing a number of applications from an application server at a central office using ICA. The branch office and central office may each have clusters of WAN optimization appliances 200. The ICA connection may be proxied through a first central office appliance and a first branch office appliance. As data from the application server is transmitted through the central office WAN appliance, the central office appliance may determine that portions of the data have previously been sent to a second branch office WAN optimization appliance in the cluster with the first branch office appliance. The central office appliance may compress the data as it is passing through using references to the compression history portions shared with the second branch office device. As each reference in the compressed data stream is received by the first branch office appliance, it may send a request for the referenced data. As each piece of referenced data is received, the first branch office appliance may use the received data to reconstruct a potion data stream and forward the portion of the reconstructed data stream to the client.

Figure 10A:
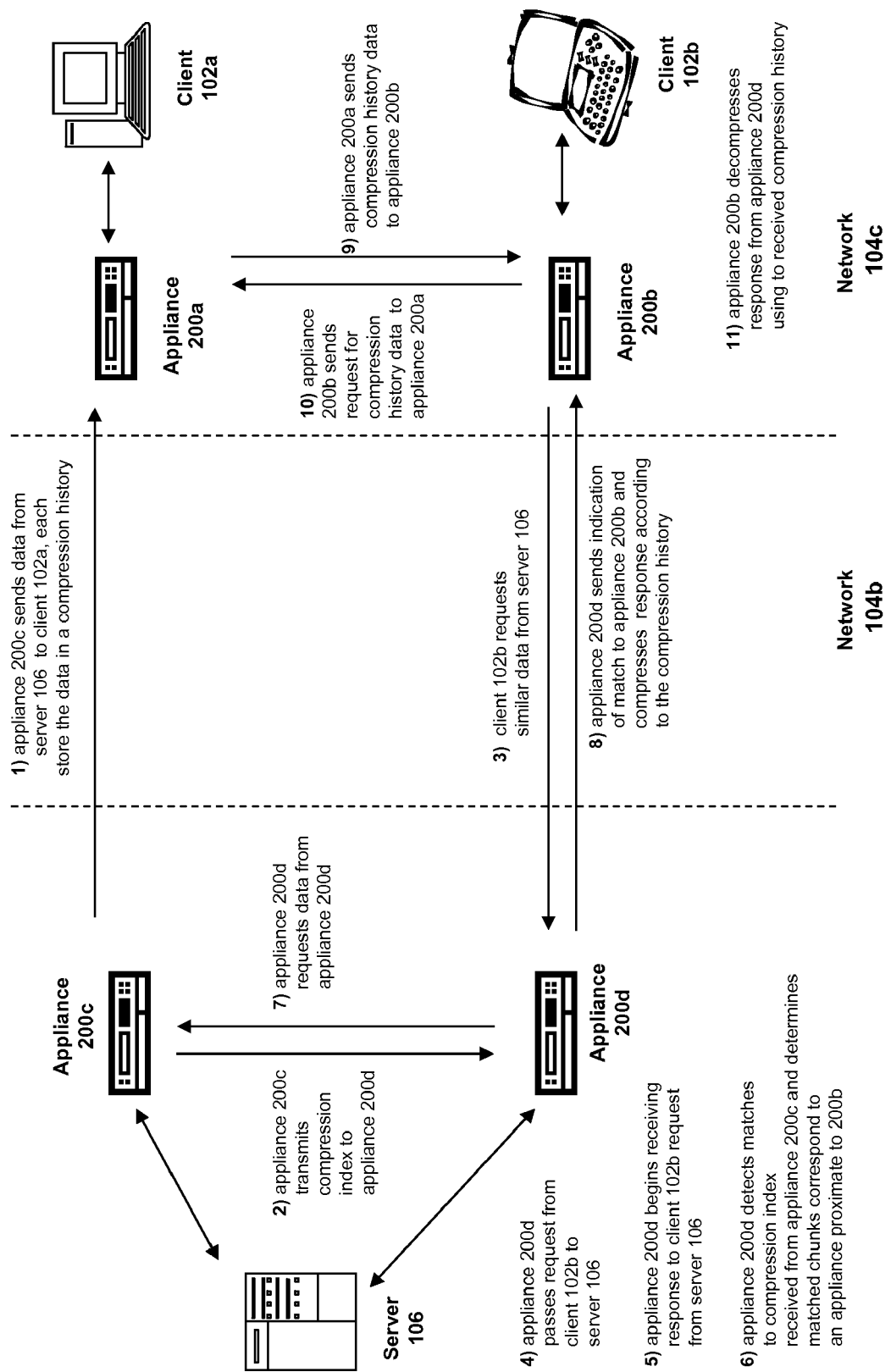
FIG. 10A is a block diagram illustrating one embodiment of a system for sharing compression history indexes to accelerate data transmission between two groups of devices.

Now referring to FIG. 10A, a block diagram of one embodiment of a system for sharing compression history indexes to accelerate data transmission between two groups of devices is shown. In brief overview, a first data stream is transmitted between appliance 200c and appliance 200a, each appliance storing portions of the data stream in their respective compression histories. Appliance 200a then shares a compression index, containing entries corresponding to the transmitted first data stream, with appliance 200d. Appliance 200d, in the course of transmitting a second data stream to appliance 200b, may identify one or more matches corresponding to the index received from appliance 200c. Appliance 200d may then take steps to leverage the existing compression histories on appliance 200c and 200a to accelerate the transmission. In the embodiment shown, the appliance 200d requests the corresponding portions of the compression history from appliance 200c, and sends an indication of the match to appliance 200b by compressing the second data stream using references to the compression history shared by appliances 200a and 200c. Appliance 200b, upon receiving the compressed stream, may then request the corresponding portions of the compression history from appliance 200a to decompress the data stream.

Still referring to FIG. 10A, now in greater detail, a number of appliances 200a, 200b, 200c, 200d communicate over a number of networks 104a, 104b, 104c. In some embodiments, the appliances may be WAN optimization devices, and network 104b may comprise a WAN. In other embodiments, the appliances may be serving as transparent proxies for communications between a number of clients 102a, 102b and a server 106. The server may be on a LAN 104a with the appliance 200c. The two appliances 200a, 200b may be on a LAN with the one or more clients 102a, 102b. In one embodiment, the appliances 200c, 200d and server 106 may be located in a central office, and the appliances 200a, 200b and clients 102a 102b may be located in one or more branch offices. Although FIG. 10A depicts appliances, the systems and methods described with respect to FIG. 10A may apply equally to clients, client agents, servers, and server agents.

In the embodiment shown, appliance 200c sends data from server 106 to the appliance 200a. In some cases, this may be a file or other data requested from the server 106 by the client 102a. In these cases, the appliances 200c, 200a may be serving as transparent proxies for the communication. As the data is transmitted, the appliances 200a, 200c may be storing data from the transmission in their respective compression histories, and storing information relating to the data in a compression index.

The appliance 200c may then transmit some or all of its compression index to the appliance 200d. Appliance 200d may also transmit some or all of its compression index to appliance 200c. In some embodiments, the appliances 200c, 200d may be part of an appliance cluster containing two or more devices, all of which transmit portions of their compression indexes to each other. The appliances may be clustered in any way, and may discover each other using any technique. In this way, any appliance in the cluster may be able to determine if a data stream the appliance is transmitting contains a number of matches to a data stream previously transmitted by any of the other appliances in the cluster. Devices in a cluster may exchange compression indexes using any method. In some embodiments, devices may periodically transmit updates of their compression history indexes to other devices in the cluster. In other embodiments, devices may transmit portions of their compression history to other devices in cluster upon startup, or upon detecting a new device in the cluster. In some embodiments, devices may transmit only a portion of a compression history index to another device in a cluster. In other embodiments, devices may only transmit entries of a compression index corresponding to frequently or recently used portions of a compression history.

After receiving the compression index from appliance 200c, appliance 200d may integrate the received compression index with one or more compression indexes maintained by appliance 200*d*. In some embodiments, the appliance 200*d* may mark the index entries received from appliance 200*c* to indicate that the index entries correspond to appliance 200*c*.

Sharing compression history indexes among a cluster of devices may be useful in situations where a cluster of appliances is providing acceleration to a server, and in those situations where the same appliance does not always provide acceleration for the same server in the set. In some ways, the system in FIG. 10A and the method shown in FIG. 10B may be a variation of the systems and methods shown in FIGS. 9A-9D.

Appliance 200*d* may then receive a data stream from a server 106 destined for client 102*b* via appliance 200*b*. Appliance 200*d* may determine that one or more portions of this data stream match portions of the compression index received from appliance 200*c*. After identifying the matched portions, appliance 200*d* may send a request for the matching portions to appliance 200*c*. Appliance 200*c* may respond by transmitting the requested portions, along with information identifying the appliance 200*a* which may also have the requested portions of data.

After receiving the matching portions from appliance 200*c*, appliance 200*d* may determine whether the portions actually match the data stream. This may be necessary in cases where the compression index only comprises fingerprints of data, and thus byte-by-byte comparison of the received portions with the data stream may be necessary to confirm a match. Once a match is confirmed, appliance 200*d* may send an indication of the match to appliance 200*b* and replace one or more portions of the data stream with references to the matched portions of compression history. Appliance 200*b* may then request the matching portions of data from appliance 200*a*.

Appliance 200*b*, having similarly received corresponding portions of the compression history from appliance 200*a*, may then decompress the data stream and transmit the data stream to the client 102*b*.

Figure 10B:
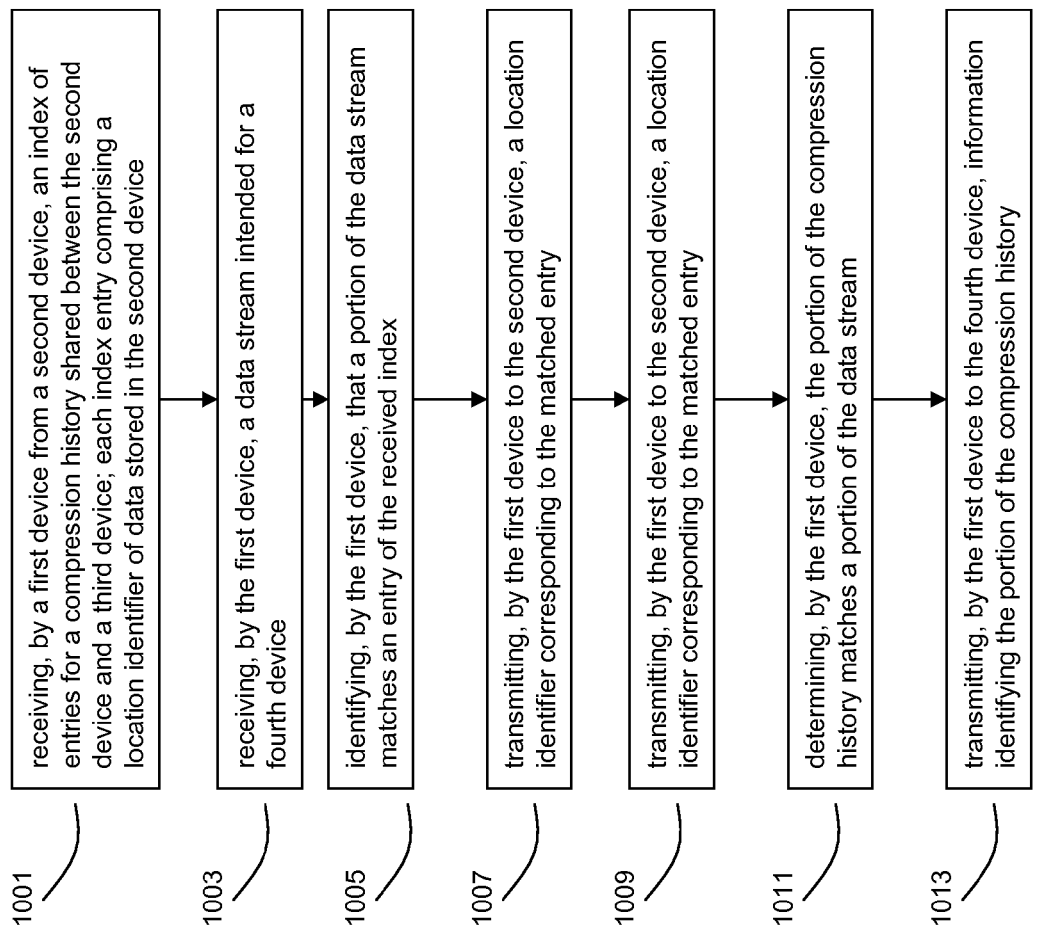
FIG. 10B is a flow diagram of a method for sharing compression indexes among a plurality of devices to improve compression of data transmitted via a plurality of connections.

Referring now to FIG. 10B, a flow diagram of a method for sharing compression indexes among a plurality of devices to improve compression of data transmitted via a plurality of connections is shown. In brief overview, the method comprises: receiving, by a first device from a second device, an index of entries for a compression history shared between the second device and a third device; each index entry comprising a location identifier of data stored in the second device (step 1001). The first device receives a data stream intended for a fourth device (step 1003); and identifies that a portion of the data stream matches an entry of the received index (step 1005). The first device transmits, to the second device, a location identifier corresponding to the matched entry (step 1007). The first device receives, from the second device, a portion of the compression history corresponding to the location identifier (step 1009); and determines the portion of the compression history matches a portion of the data stream (step 1011). The first device may then transmit, to the fourth device, information identifying the portion of the compression history (step 1013). The first, second, third, and fourth devices may be any of a client, server, client agent, server agent, appliance, WAN optimization device, and/or transparent proxy. In one embodiment, this method may reflect steps performed by the appliances in FIG. 10A wherein the first device is the appliance 200*d*, the second device is the appliance 200*c*, the third device is the appliance 200*a*, and the fourth device is the appliance 200*b*.

Still referring to FIG. 10B, now in greater detail, the method comprises receiving, by a first device from a second device, an index of entries for a compression history shared between the second device and a third device; each index entry comprising a location identifier of data stored in the second device (step 1001) The received index may comprise any type of index for the first compression history. In one embodiment, the index may comprise a compression index 410. The received index may comprise the entirety of the index for the first compression history, or the received index may comprise only a portion of the index for the first compression history. In some embodiments, the index may comprise a specifically selected portion of the index for the first compression history. In other embodiments, the index may comprise entries from a plurality of compression histories. In some embodiments, the first device may receive the index of entries after detecting that the second device is in a cluster with the first device. In other embodiments, the first device may periodically receive a number of index entries from the second device. The first device may also receive any other information from the second device, including a range of valid location identifiers and/or one or more disk identifiers of disks operated by the second device.

In some embodiments, the received index entries may be integrated into an existing compression index on the first device. For example, the received index may have been created using a same fingerprint method used by the third device, and the entry numbers may correspond to entry numbers in a compression index of the third device. In one embodiment, the third device may mark or otherwise note the entries that have been received from the first device. In another embodiment, the location identifiers within the received index entries may point to locations known to be on the first device.

In some embodiments, each device in a group of devices may periodically transmit updated compression indexes to the other devices in the group. In this way, a cluster of devices may be created in which all essentially or partially share the same compression index. This may allow any individual device to leverage previous transmissions of data by any of the other devices to accelerate future communications. For example, a group of devices may provide WAN optimization services for a central office to a number of branch offices. Each device in the central office may periodically transmit some or all of its compression index to the other central office devices. In this way, each device at the central office may be able to leverage previous transmissions to a branch office to compress future transmissions to the branch office, even if the previous transmission was from a different central office device, and to a different branch office device or client.

The first device, may then receive a data stream intended for a fourth device (step 1003). The first device may receive the data stream from any source, including a client 102, server 106 or client agent 120. In one embodiment, the data stream may comprise a response from a server 106 to a client request. For example, the first device may be serving as a transparent proxy to a TCP connection between a client and a server, and the data stream may comprise a response to an HTTP request by the client. Or, for example, the data stream may comprise an ICA stream from an application server to a client agent.

The first device may identify that a portion of the data stream matches an entry of the received index (step 1005). In some embodiments, the first device may identify that a portion of the data stream matches an entry of the received index before any data is transmitted to the fourth device. In other embodiments, the third device may identify that a portion of the data stream matches an entry of the received index after some data has already been transmitted to the fourth device. The first device may identify the matching using any technique, including any of the fingerprinting and indexing techniques described herein. In one embodiment, the first device may identify that one or more shingles of the data stream have fingerprints corresponding to an entry in the received index.

In some embodiments, the first device may identify that a portion of the second data stream matches within a predetermined threshold a portion of the received index. The predetermined threshold may comprise any amount, percentage, or distribution of data. In one embodiment, the predetermined threshold may comprise a minimum number of bytes. For example, the third device may identify that at least 64 bytes of the second data stream matches entries in the received index. A minimum number of bytes may be any number of bytes, including 4, 8, 16, 32, 64, 128, 256, 512, 1024, 2048, and 3072 bytes. In some embodiments, the predetermined threshold may require that a minimum number of matching bytes be sequential. In other embodiments, the predetermined threshold may require that a minimum number of matching bytes be found at a given distribution throughout the second data stream. For example, a predetermined threshold might require that at least 50 matching byte sequences be found in at least three different locations in the second data stream. Or a predetermined threshold might require that at least three different matching sequences of at least 64 bytes be found. In some embodiments, the predetermined threshold may require that the matching index entries have location identifiers corresponding to sequential portions of the first compression history. For example, the predetermined threshold may require that a sequence of at least 128 bytes matches index entries identifying a consecutive sequence of 128 bytes in the first compression history. In some embodiments, the third device may use a technique such as the ones described with respect to FIGS. 5B and 6B to efficiently determine the existence of any long sequential matches. In still other embodiments, the predetermined threshold may require that a certain percentage of the second data stream matches received index entries. For example, the predetermined threshold may require that 85% of a first number of bytes of the second data stream match received index entries.

The predetermined threshold may be set either automatically by the first device or manually configured. In some embodiments, the predetermined threshold may be calibrated to balance the overhead of contacting the first device and subsequently transferring portions of a compression history against the potential increased in transmission speed as the result of a successful transfer of compression history data. For example, the predetermined threshold may be lowered in response to slower performance of the network 104*b*. Or the predetermined threshold may be raised as the performance of the network 104*b* becomes faster. In another example, the predetermined threshold may be lower if the bandwidth of the connection between the first and third devices is substantially higher than the bandwidth of the connection between the third and fourth devices.

After identifying a match, the first device may transmit, to the second device, a location identifier corresponding to the matched entry (step 1009). In one embodiment, the first device may transmit one or more chunk identifiers to the second device. In another embodiment, the first device may transmit a plurality of location and/or chunk identifiers to the second device. These portions may then be transmitted from the second device to the first device using any means and any protocol. In some embodiments, the first device may then signal to the first device that it has successfully received the requested one or more portions of the compression history.

In one embodiment, the first device may transmit a request for the second device to send the identified portion of the first compression history to the first device. The request may be transmitted via any protocol or protocols. In some embodiments, the request may request a plurality of portions of the compression history. In some embodiments, the first device may transmit a separate request for each of a number of identifiers received in the data stream. In another embodiment, the first device may include more than one identifier in a single request. In some embodiments, the first device may request one or more portions of the compression history subsequent to the identified portions. For example, if the first device receives a data stream comprising a portion of data matching an index entry received from the second device, the first device may transmit to the second device a request for an identified chunk as well as one or more subsequent chunks. This may be based on a likelihood that subsequent matches will occur and include the subsequent chunks. Or, for example, if 212 bytes of a data stream match an index entry identifying a chunk held by the second device, the first device may transmit to the second device a request for the identified bytes as well as a number of subsequent bytes from the chunk. The number of subsequent bytes requested may be determined in any manner, including without limitation based on a number or length of previous matches.

The first device may receive, from the second device, a portion of the compression history corresponding to the location identifier in any manner (step 1011). The portion may be received via any protocol or protocols. In some embodiments, the first device may receive a plurality of portions of the compression history. In some embodiments, the first device may receive entire chunks of the compression history. For example, in response to a request for 514 bytes of a chunk, the first appliance may receive the entire chunk containing the requested bytes. In other embodiments, the first device may receive a portion of a chunk. The first device may also receive any additional information with the requested portion of the compression history, including without limitation any information contained in a chunk header or compression index corresponding to the requested portion. In some embodiments, the first device may receive information identifying other devices which also may have the chunk. In these embodiments, the first device may then determine whether one of the other devices having the chunk is located in a cluster or otherwise local to the fourth device.

The first device may then determine the portion of the compression history matches a portion of the data stream (step 1011). This step may be used in embodiments where the an index match does not guarantee that data in the compression history will also match. For example, if the index is implemented using a non-unique fingerprinting method, two distinct shingles may have the same fingerprint. A comparison to the referenced data portion in the compression history may be needed to verify that a match exists. In other embodiments, this step may be omitted.

The first device may then transmit to the fourth device, information identifying the portion of the compression history (step 1013). In one embodiment, this step may comprise transmitting the data stream to the fourth device compressed according to the matching portions of the first compression history. The first device may perform this compression according to the matching portions of the first compression history in any manner. In one embodiment, the first device may replace portions of the data stream with location identifiers identifying the matching portions of the first compression history. In this embodiment, the first device may also compress the data stream using any other techniques, including without limitation additionally compressing the data stream according to a second compression history shared between the first device and third device. In one embodiment, this step may comprise transmitting one or more chunk identifiers to the fourth device. In another embodiment, this step may comprise transmitting one or more location identifiers to the fourth device. In one embodiment, the first device may also transmit information identifying the third device.

In one embodiment, the first device may also include location identifiers of one or more portions of the compression history that are subsequent to the identified matching portions. The first device may include these portions based on a speculation that the subsequent portions will also match subsequent portions of the second data stream. In some embodiments, the number of subsequent portions the first device identifies may be determined by the quality or quantity of found matches.

After the fourth device receives the data stream compressed according to the first compression history, the fourth device may decompress the data stream in any manner. In some embodiments, the fourth device may decompress the data stream using any of the techniques described with respect to steps 921-931 in FIG. 9D. In one embodiments, the fourth device may transmit, to the third device, a request for the identified portions of the first compression history. These portions may then be transmitted from the third device to the second device using any means and any protocol. In some embodiments, the fourth device may then signal to the first device that it has received one or more portions of the compression history. In other embodiments, the fourth device may transmit an indication to the first device that the identified portions of the compression history cannot be obtained, which may occur if the second device is inoperable or busy. In these cases, the first device may then retransmit the data stream to the third device without compressing it according to the first compression history.

I. Systems and Methods for Ad-Hoc Cache Hierarchies.

Figure 11A:
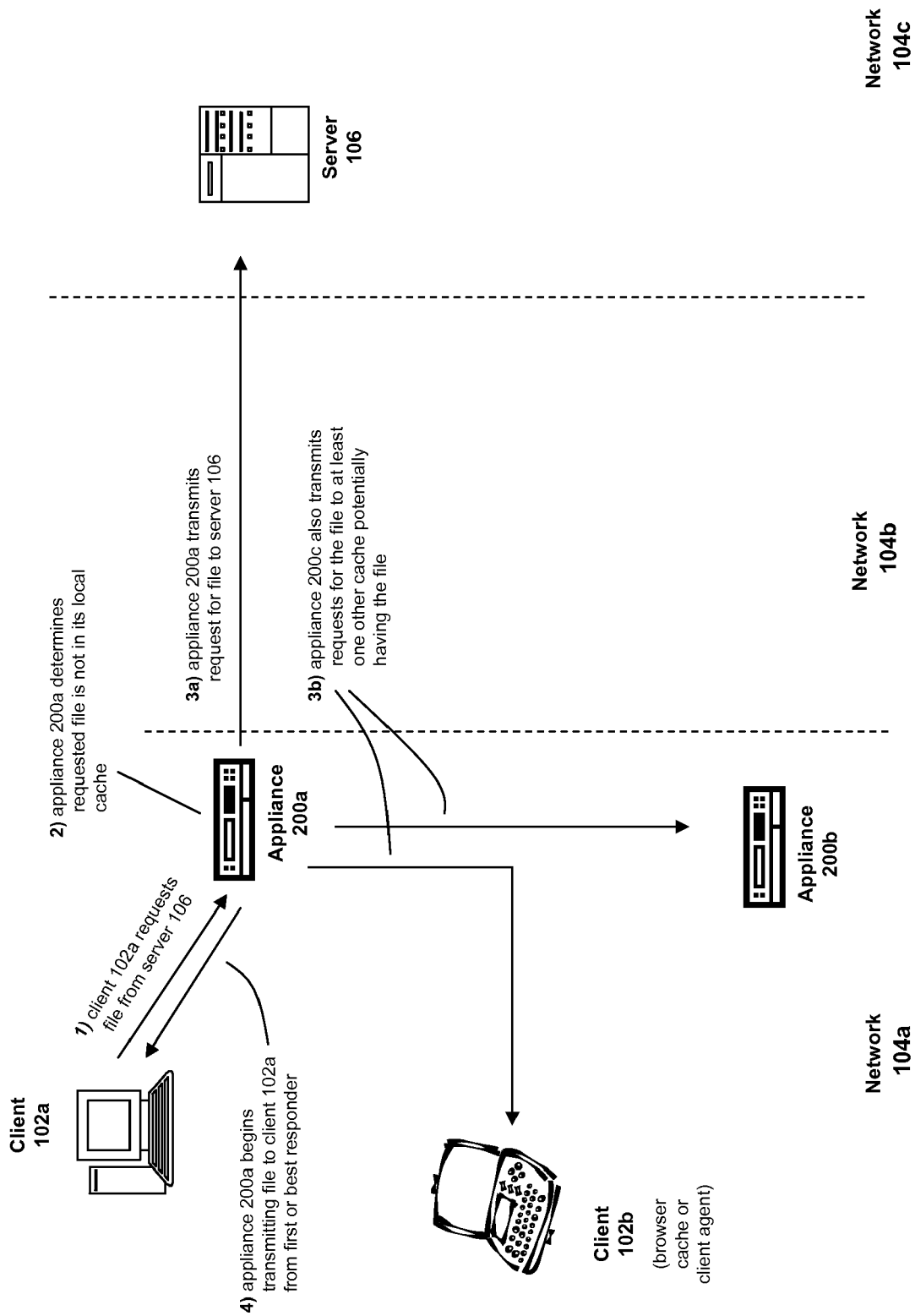
FIG. 11A is a block diagram illustrating one embodiment of providing an ad-hoc hierarchy of caches to serve objects.

Now referring to FIG. 11A, a block diagram illustrating one embodiment of providing an ad-hoc hierarchy of caches to serve objects is shown. In brief overview, an appliance 200a intercepts a request for an object from a client to a server. The appliance 200a, after finding that the object is not in a local cache, transmits a request to the server for the object. Appliance 200a also transmits a number of duplicate requests to devices which may have a cached copy of the object. These devices may include a client agent 120, an appliance 200b, or any other device. Appliance 200a may then receive the object from any of the sources to which requests were sent. The appliance 200a may then send the object to the client from the first responder.

Still referring to FIG. 11A, now in greater detail, appliances 200a 200b, and client 102a and 102b reside on a network 104a. In some embodiments, the appliances 200a 200b may be WAN optimization devices, and network 104b may comprise a WAN. In other embodiments, any of the appliances may comprise a proxy server, proxy cache, SSL/VPN appliance, firewall, and/or transparent proxy. In some embodiments, the appliances may be serving as transparent proxies for communications between a number of clients 102a, 102b and a server 106. In some embodiments, the network 104a may comprise a LAN. The two appliances 200a, 200b may be on a LAN with the one or more clients 102a, 102b. In one embodiment the appliances 200a, 200b and clients 102a, 102b may be located in one or more branch offices, and the server 106 may be located in a central office. In another embodiment, there may be one or more appliances on network 104c intercepting traffic for the server 106. Although FIG. 11A depicts an appliances 200a, the systems and methods described with respect to FIG. 11A may apply equally with a client agent 120 executing on the client 102a performing the functions of appliance 200a.

In the embodiment shown, the appliances 200a, 200b and the client 102b may each contain a cache of objects previously transmitted through the appliance. A cache may comprise any type and form of storage, including without limitation storage on memory or disks. A data object may comprise any discrete sequence of data. Examples of data objects include, without limitation, files, images, executables, web pages, audio files, and video files. In one embodiment, data objects may be stored in a cache on an appliance along with an index of a name of each of the data objects. For example, an appliance may maintain a cache of files or portions of files transmitted through the appliance via CIFS, and may keep an index of the file names such that, in response to receiving a request for a given named object, the appliance can retrieve the object of that name from the cache. In another embodiment, data objects may be stored with any other identifiers, including without limitation location identifiers, chunk identifiers, and fingerprints.

In some embodiments, a cache may be integrated with a compression history. For example, an appliance may keep an index of named objects that have been transmitted via the appliance, where the index contains pointers to a portion or portions of a compression history containing the named object. In one embodiment, an appliance may keep an index which matches names of objects to chunk identifiers and offsets identifying the locations of the named objects. In other embodiments, a cache may be maintained separately from one or more compression histories.

The system shown may be used to create an ad-hoc cache hierarchy. Since the requests sent to the devices which may have cached the object may be sent in parallel to the request to the server, the system may not result in additional latency penalties if any of the devices do not have the object cached. The system may be used in cases where the appliance 200a is not certain whether an object exists in the cache of another device, or is not certain another device is available.

Referring now to FIG. 11B, a flow diagram illustrating one embodiment of a method for providing an ad-hoc hierarchy of caches to serve objects is shown. In brief overview, the method comprises receiving, by an appliance from a client, a first request for an object from a server (step 1101). The first device identifies that the object is not located in a first cache of the appliance (step 1103) and forward the first request for the object to the server (step 1105). The appliance transmits, prior to receiving a response to the forwarded request, a second request for the object to a second device (step 1107). The appliance receives, from at least one of the server or the second device, the object (step 1109); and then transmits the object to the client (step 1111). In some embodiments, the first appliances may be any of a client, server, client agent, server agent, appliance, WAN optimization device, and/or transparent proxy. In one embodiment, this method may reflect steps performed by the appliance 200a in FIG. 11A.

Still referring to FIG. 11B, now in greater detail, the method comprises receiving, by an appliance, a first request from a client to a server for an object (step 1101). In some embodiments, the first appliance may intercept the first request transparently to one or more of the client, the server, a client agent, server agent, or an intermediate appliance. The first request may comprise a request transmitted via any protocol, and may be received in any manner. Examples of requests for an object include without limitation HTTP requests for files, FTP requests for files, CIFS requests for some or all of a file, NFS requests for some or all of a file, and ICA requests for one or more application objects. In one embodiment, the appliance may intercept, at the transport layer, a request for an application layer object. In another embodiment, the appliance may intercept, at the network layer, a request for an application layer object. In some embodiments, the request may be transmitted via a TCP connection the appliance is serving as an intermediary for.

In some embodiments, the appliance receiving the request may be local to the client making the request. In other embodiments, the appliance receiving the request may be connected to the client via a WAN. In still another embodiment, the appliance receiving the request may be connected to the client via one or more intermediary devices. In this embodiment, the intermediary devices may comprise any of a WAN optimization device, a VPN device, and/or a transparent proxy device.

After intercepting the request, the appliance may identify that the object is not located in a cache of the appliance in any manner (step 1103). This identification may be done by any means, including without limitation: performing a cache lookup based on an object name, a fingerprinting method, and determining that a cached copy of the object has expired or is otherwise unusable. In some embodiments, this step may be omitted. For example, this step may be omitted where the first appliance does not maintain a cache.

The appliance may then forward the request to the server (step 1105). The first appliance may transmit the forwarded request to the server via any protocol or protocols, including protocols other than the protocols used to receive the first request. In some embodiments, the forwarded request may comprise the first request. In other embodiments, the first appliance may modify, reformat, or otherwise alter the first request. For example, the first appliance may encrypt some or all of the first request. In some embodiments, the appliance may transmit the request to a second appliance serving as a proxy for the server. In other embodiments, the forwarded request may pass through any number of intermediary devices before reaching the server 106.

After receiving the second request, the appliance may transmit, prior to receiving a response to the forwarded request, a second request for the object to a second device (step 1107). The second device may comprise any of a client 102, server 106, appliance 200, or client agent 120. In some embodiments, the second device may comprise a browser cache. In some embodiments, the appliance may determine the object may be stored in a second device by searching an index of objects previously transmitted. In another embodiment, the appliance may determine the object may be stored in a second device by consulting a compression history or compression history index. In some embodiments, the appliance may determine whether the object has been transmitted to the second device within a predetermined time period.

The second device may reside in any location relative to the appliance. In some embodiments, the second device may be on a LAN with the appliance. In one embodiment, the second device may comprise a second appliance in a cluster with the appliance. In another embodiment, the second device may be connected to the appliance via a lower latency connection than the server is to the appliance.

In one embodiment, the appliance may transmit the second request prior to receiving any response to the request from the server. In another embodiment, the application may transmit the second request prior to receiving an acknowledgement or other confirmation from the server that the request was received. In still another embodiment, the appliance may transmit the second request prior to receiving any response to the request from an intermediary device between the appliance and the server.

The appliance may transmit any number of additional requests for the object prior to receiving a response to the forwarded request. In one embodiment the appliance may transmit a third request for the object to a third device. In one embodiment, the appliance may transmit a request for the object to each of a number of appliances in a cluster. In another embodiment, the appliance may send a request for the object to a number of client agents 120 on a LAN with the appliance. For example, an appliance at a branch office, upon receiving a request for an object, may forward the request to a server at a central office and also send a request for the object to any other appliances also at the branch office, in addition to one or more clients located on the branch office.

In some embodiments, the appliance may transmit a request for a portion of the object to a first device, and a request for a second portion of the object to a second device. In other embodiments, the appliance may divide the requested object into any number of portions and send out one or more requests for each portion.

The devices receiving the additional requests may service them in any manner. In some embodiments, the devices may locate the object and begin transmitting the object to the appliance in any manner. In other embodiments, the devices may ignore the requests. In other embodiments, the devices may determine that the object is not stored in a cache on the device. In these embodiments, the devices may or may not transmit an indication to the first device that the object was not found. In still other embodiments, the devices may forward the requests to one or more additional devices.

The appliance may then receive, from at least one of the server or the second device, the object (step 1109). The object may be received in any manner, and via any connection or protocol. In some embodiments, the appliance may begin receiving the object from a plurality of sources. In these embodiments, the appliance may select a source to use for receiving the object. In some embodiments, the appliance may select the source that responded first. In other embodiments, the appliance may select the source having the highest available bandwidth. In still other embodiments, the appliance may select the source based on proximity to the appliance. In some embodiments, the appliance may cancel the request or may reset or close the connections to other sources transmitting the object.

In some embodiments, the appliance may receive a first portion of the object from a first device, and a second portion of the object from a second device. In these embodiments, the appliance may reassemble the portions of the object received from multiple sources into the object in any manner.

The appliance may then transmit the object to the client in any manner. In some embodiments, the appliance may forward the object received from the server 106. In other embodiments, the appliance may transmit the object received from one or more other devices.

While the invention has been particularly shown and described with reference to specific preferred embodiments, it should be understood by those skilled in the art that various changes in form and detail may be made therein without departing from the spirit and scope of the invention as defined by the appended claims.

We claim:

1. A method for improving compression history matches by removing application layer protocol headers from compression history data, the method comprising:

(a) receiving, by a first device, an application data stream, the application data stream comprising at least one application layer protocol header between a first sequence of application data and a second sequence of application data;
(b) identifying, by a compression engine configured on the first device, the first sequence and the second sequence from the application data stream; and
(c) determining, by the compression engine, that a combined sequence comprising the first sequence and second sequence matches a portion of a compression history.

2. The method of claim 1, wherein the first device is a transparent proxy for at least one transport layer connection.

3. The method of claim 1, wherein step (a) comprises receiving, by the first device via a transport layer connection, the application data stream comprising at least one application layer protocol header between the first sequence of application data and the second sequence of application data.

4. The method of claim 1, wherein step (a) comprises receiving, by the first device, an application data stream comprising at least one HTTP header between a first sequence of HTTP data and a second sequence of HTTP data.

5. The method of claim 1, wherein step (a) comprises receiving, by the first device, an application data stream comprising at least one CIFS header between a first sequence of CIFS data and a second sequence of CIFS data.

6. The method of claim 1, wherein step (a) comprises receiving, by the first device, an application data stream comprising at least one NFS header between a first sequence of NFS data and a second sequence of NFS data.

7. The method of claim 1, wherein step (a) comprises receiving, by the first device, an application data stream comprising at least one SMTP header between a first sequence of SMTP data and a second sequence of SMTP data.

8. The method of claim 1, wherein step (a) comprises receiving, by the first device, the application data stream comprising at least one application layer protocol header between the first sequence of application data and the second sequence of application data, wherein the first sequence and second sequence comprise contiguous sequences of a file being transferred.

9. The method of claim 1, wherein step (b) comprises identifying, by the compression engine, that the first sequence and the second sequence from the application data stream comprise contiguous sequences of a file being transferred.

10. The method of claim 1, wherein step (b) comprises identifying, by the compression engine in the application data stream, a plurality of sequences of application data, the plurality of sequences of application data separated by at least one application layer protocol header.

11. The method of claim 10, wherein step (c) comprises determining, by the compression engine, that a combined sequence comprising the plurality of sequences matches a portion of a compression history.

12. The method of claim 1, wherein step (c) comprises determining, by the compression engine using a data fingerprinting technique, that the combined data sequence comprising the first sequence and second sequence matches the portion of the compression history.

13. The method of claim 1, wherein step (c) comprises determining, by the compression engine, that the combined data sequence comprising the first sequence and second sequence matches a portion of a compression history shared by the first device and a second device.

14. The method of claim 1, further comprising the step of
(d) transmitting, by the first device to a second device, information identifying the matched portion of the compression history.

15. The method of claim 14, wherein step (d) comprises transmitting, by the first device to the second device, information identifying a compression history chunk comprising the matched portion.

16. The method of claim 14, wherein step (d) comprises transmitting, by the first device to the second device, information identifying the matched portion of the compression history, and the at least one application layer protocol header.

17. The method of claim 14, wherein step (d) comprises transmitting, by the first device to the second device, information identifying the matched portion of the compression history, the at least one application layer protocol header, and information identifying a location of the at least one application layer protocol header within the combined sequence.

18. The method of claim 1, wherein step (a) comprises receiving, by the first device, the application data stream, the application data stream comprising the first sequence of application data and the second sequence of application data corresponding to a first application object, and the application data stream comprising at least one application layer protocol header between the first sequence and the second sequence.

19. The method of claim 1, wherein step (a) comprises receiving, by the first device, the application data stream, the application data stream comprising (i) the first sequence of application data and the second sequence of application data both corresponding to a first application object, (ii) at least one application layer protocol header between the first sequence and the second sequence, and (iii) a third sequence of application data corresponding to a second application object between the first sequence and the second sequence.

20. The method of claim 1, wherein step (a) comprises receiving, by a first device, an ICA stream, the ICA stream comprising (i) a first sequence of application data and a second sequence of application data both corresponding to a first application object, (ii) at least one ICA header between the first sequence and the second sequence, and (iii) a third sequence of application data corresponding to a second application object between the first sequence and the second sequence.

21. A method for improving compression history matches by removing protocol-specific headers from transferred data, the method comprising:
(a) transmitting, between a first device and a second device, an application data stream, the application data stream comprising at least one application layer protocol header between a first sequence of application data and a second sequence of application data;
(b) identifying, by a compression engine configured on the first device, the first sequence and the second sequence from the application data stream; and
(c) storing, by the compression engine, a combined sequence comprising the first sequence and the second sequence to a compression history.

22. The method of claim 21, wherein step (a) comprises transmitting, between the first device and the second device, an application data stream comprising at least one HTTP header between a first sequence of HTTP data and a second sequence of HTTP data.

23. The method of claim 21, wherein step (a) comprises transmitting, between the first device and the second device, an application data stream comprising at least one CIFS header between a first sequence of CIFS data and a second sequence of CIFS data.

24. The method of claim 21, wherein step (a) comprises transmitting, between the first device and the second device, an application data stream, comprising at least one NFS header between a first sequence of NFS data and a second sequence of NFS data.

25. The method of claim 21, wherein step (a) comprises transmitting, between the first device and the second device, the application data stream comprising at least one application layer protocol header between the first sequence of application data and the second sequence of application data, wherein the first sequence and second sequence comprise contiguous sequences of a file being transferred.

26. The method of claim 21, wherein step (b) comprises identifying, by the compression engine, that the first sequence and the second sequence from the application data stream comprise contiguous sequences of a file being transferred.

27. The method of claim 21, further comprising the steps of:
   (d) receiving, by the first device, a second application data stream, the application data stream comprising a second at least one application layer protocol header between a third sequence of application data and a fourth sequence of application data;
   (e) identifying, by the compression engine, the third sequence and the fourth sequence from the second application data stream;
   (f) determining, by the compression engine, that a second combined sequence comprising the third sequence and the fourth sequence matches the stored combined sequence in the compression history; and
   (g) transmitting, by the compression engine to the second device, information identifying the stored combined sequence in the compression history matching the second combined sequence.

28. A device for improving compression history matches by removing application layer protocol headers from compression history data, the device comprising:
   a packet processor which receives an application data stream, the application data stream comprising at least one application layer protocol header between a first sequence of application data and a second sequence of application data; and
   a compression engine which identifies the first sequence and the second sequence from the application data stream; and determines that a combined sequence comprising the first sequence and second sequence matches a portion of a compression history.

29. The device of claim 28, wherein the device is a transparent proxy for at least one transport layer connection.

30. The device of claim 28, wherein the packet processor receives, via a transport layer connection, the application data stream comprising at least one application layer protocol header between a first sequence of application data and a second data sequence of application data.

31. The device of claim 28, wherein the packet processor receives an application data stream comprising at least one HTTP header between a first sequence of HTTP data and a second sequence of HTTP data.

32. The device of claim 28, wherein the packet processor receives an application data stream comprising at least one CIFS header between a first sequence of CIFS data and a second sequence of CIFS data.

33. The device of claim 28, wherein the packet processor receives an application data stream comprising at least one NFS header between a first sequence of NFS data and a second sequence of NFS data.

34. The device of claim 28, wherein the packet processor receives the application data stream comprising at least one application layer protocol header between the first sequence of application data and the second sequence of application data, wherein the first sequence and second sequence comprise contiguous sequences of a file being transferred.

35. The device of claim 28, wherein the compression engine identifies that the first sequence and the second sequence from the application data stream comprise contiguous sequences of a file being transferred.

36. The device of claim 28, wherein the compression engine identifies, in the application data stream, a plurality of sequences of application data, the plurality of sequences of application data separated by at least one application layer protocol header.

37. The device of claim 36, wherein the compression engine determines that a combined sequence comprising the plurality of sequences matches the portion of the compression history.

38. The device of claim 28, wherein the compression engine determines, using a data fingerprinting technique, that the combined data sequence comprising the first sequence and second sequence matches the portion of the compression history.

39. The device of claim 28, wherein the compression engine determines that the combined data sequence comprising the first sequence and second sequence matches a portion of the compression history shared by the device and a second device.

40. The device of claim 28, wherein the compression engine transmits, to a second device, information identifying the matched portion of the compression history.

41. The device of claim 28, wherein the compression engine transmits, to a second device, information identifying a compression history chunk comprising the matched portion.

42. The device of claim 28, wherein the compression engine transmits, to a second device, information identifying the matched portion of the compression history, and the at least one application layer protocol header.

43. The device of claim 28, wherein the compression engine transmits, to a second device, information identifying the matched portion of the compression history, the at least one application layer protocol header, and information identifying a location of the at least one application layer protocol header within the combined sequence.

44. The device of claim 28, wherein the packet processor transmits, to a second device, a second application data stream, the second application data stream comprising at least one application layer protocol header between a first sequence of application data and a second sequence of application data, wherein the first sequence and second sequence comprise contiguous sequences of a file being transferred.

45. A system for improving compression history matches by removing application layer protocol headers from compression history data, the system comprising:
   a packet processor of a first device which transmits, to a second device, an application data stream, the application data stream comprising at least one application layer protocol header between a first sequence of application data and a second sequence of application data; and
   a compression engine which identifies the first sequence and the second sequence from the application data stream; and stores a combined sequence comprising the first sequence and the second sequence to a compression history.

46. The system of claim 45, wherein the packet processor transmits, to the second device, an application data stream comprising at least one HTTP header between a first sequence of HTTP data and a second sequence of HTTP data.

47. The system of claim 45, wherein the packet processor transmits, to the second device, an application data stream comprising at least one CIFS header between a first sequence of CIFS data and a second sequence of CIFS data.

48. The system of claim 45, wherein the packet processor transmits, to the second device, an application data stream comprising at least one NFS header between a first sequence of NFS data and a second sequence of NFS data.

49. The system of claim 45, wherein the packet processor transmits, to the second device, the application data stream comprising at least one application layer protocol header between the first sequence of application data and the second sequence of application data, wherein the first sequence and second sequence comprise contiguous sequences of a file being transferred.

50. The system of claim 45, wherein the compression engines identifies that the first sequence and the second sequence from the application data stream comprise contiguous sequences of a file being transferred.

51. The system of claim 45, wherein:
the packet processor transmits, to the second device, a second application data stream, the application data stream comprising a second at least one application layer protocol header between a third sequence of application data and a fourth sequence of application data; and the compression engine identifies the third sequence and the fourth sequence from the second application data stream; determines that a second combined sequence comprising the third sequence and fourth sequence matches the stored combined sequence in the compression history; and transmits, to the second device, information identifying the stored combined sequence in the compression history matching the second combined sequence.

* * * * *